United States Patent
Sakakibara et al.

(10) Patent No.: US 10,336,860 B2
(45) Date of Patent: Jul. 2, 2019

(54) POLYMER COMPOUND AND LIGHT EMITTING DEVICE USING THE SAME

(71) Applicant: Sumitomo Chemical Company, Limited, Chuo-ku, Tokyo (JP)

(72) Inventors: Ken Sakakibara, Tsukuba (JP); Mio Shiratori, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 93 days.

(21) Appl. No.: 15/513,761

(22) PCT Filed: Sep. 17, 2015

(86) PCT No.: PCT/JP2015/076390
§ 371 (c)(1),
(2) Date: Mar. 23, 2017

(87) PCT Pub. No.: WO2016/047536
PCT Pub. Date: Mar. 31, 2016

(65) Prior Publication Data
US 2017/0283546 A1  Oct. 5, 2017

(30) Foreign Application Priority Data

Sep. 25, 2014 (JP) .................. 2014-194866

(51) Int. Cl.
*C08G 61/12* (2006.01)
*H01L 51/50* (2006.01)
*H01L 51/00* (2006.01)

(52) U.S. Cl.
CPC .......... *C08G 61/128* (2013.01); *C08G 61/12* (2013.01); *H01L 51/0004* (2013.01); *H01L 51/0039* (2013.01); *H01L 51/0043* (2013.01); *H01L 51/50* (2013.01); *C08G 2261/12* (2013.01); *C08G 2261/148* (2013.01); *C08G 2261/95* (2013.01); *H01L 51/5012* (2013.01); *H01L 51/5016* (2013.01); *H01L 51/5056* (2013.01); *H01L 51/5072* (2013.01); *H01L 51/5088* (2013.01); *H01L 51/5092* (2013.01)

(58) Field of Classification Search
CPC ............. C08G 61/128; H01L 51/0004; H01L 51/0039; H01L 51/0043; H01L 51/5056
USPC ................ 525/392, 412, 416, 540, 910, 925
See application file for complete search history.

(56) References Cited

U.S. PATENT DOCUMENTS

2009/0227765 A1  9/2009  Towns et al.
2011/0127516 A1  6/2011  Nakatani et al.
2011/0198573 A1  8/2011  Lida et al.
2012/0074360 A1  3/2012  Funyuu et al.
2012/0306358 A1  12/2012  Hirano et al.
2014/0231771 A1  8/2014  Yomogita et al.

FOREIGN PATENT DOCUMENTS

| CN | 102686669 A | 9/2012 |
|---|---|---|
| CN | 103717636 A | 4/2014 |
| EP | 2832761 A1 | 2/2015 |
| JP | H11510535 A | 9/1999 |
| JP | 2008106241 A | 5/2008 |
| JP | 2008231419 A | 10/2008 |
| JP | 2010065213 A | 3/2010 |
| JP | 2010121133 A | 6/2010 |
| JP | 201387217 A | 5/2013 |
| WO | 9705184 A1 | 2/1997 |
| WO | 2010013723 A1 | 2/2010 |

(Continued)

OTHER PUBLICATIONS

Davis et al., "Surface Grafting of Vinyl-Functionalized Poly(fluorene)s via Thiol-Ene Click Chemistry," Langmuir, vol. 30, pp. 4427-4433 (2014).

(Continued)

*Primary Examiner* — Fred M Teskin
(74) *Attorney, Agent, or Firm* — Panitch Schwarze Belisario & Nadel LLP

(57) ABSTRACT

A polymer compound having an excellent crosslinking ability is provided. The polymer compound has at least one terminal constitutional unit represented by the formula (1) and a constitutional unit represented by the formula (2):

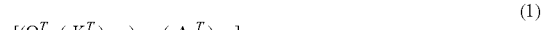

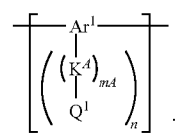

In the constitutional unit represented by formula (1), mT represents an integer of 0 to 5, nT represents an integer of 1 to 4, cT represents an integer of 0 to 1, $Q^T$ represents a crosslinkable group, $K^T$ represents an alkylene group or the like and $Ar^T$ represents an aromatic hydrocarbon group or the like. In the constitutional unit represented by formula (2), mA represents an integer of 0 to 5, n represents an integer of 1 to 4, $Ar^1$ represents an aromatic hydrocarbon group or the like, $K^A$ represents an alkylene group or the like and $Q^1$ represents a crosslinkable group.

10 Claims, No Drawings

(56) References Cited

FOREIGN PATENT DOCUMENTS

| WO | 2010140553 A1 | 12/2010 |
| WO | 2011078391 A1 | 6/2011 |
| WO | 2013057908 A1 | 4/2013 |
| WO | 2013146806 A1 | 10/2013 |

OTHER PUBLICATIONS

Extended European Search Report dated Apr. 18, 2018 in EP Application No. 15843285.6.
Int'l Search Report dated Nov. 24, 2015 in Int'l Application No. PCT/JP2015/076390.
Written Opinion dated Nov. 24, 2015 in Int'l Application No. PCT/JP2015/076390.
Office Action dated Jun. 22, 2018 in CN Application No. 201580050885.9.
Office Action dated Dec. 20, 2018 in EP Application No. 15843285.6.

POLYMER COMPOUND AND LIGHT EMITTING DEVICE USING THE SAME

CROSS-REFERENCE TO RELATED APPLICATION

This application is a Section 371 of International Application No. PCT/JP2015/076390, filed Sep. 17, 2015, which was published in the Japanese language on Mar. 31, 2016 under International Publication No. WO 2016/047536 A1, and the disclosure of which is incorporated herein by reference.

TECHNICAL FIELD

The present invention relates to a polymer compound and a light emitting device using the same.

BACKGROUND ART

An organic electroluminescent device (hereinafter, referred to also as "light emitting device") can be suitably used for the application of a display and are recently attracting attention, because of high light emission efficiency and low driving voltage. This light emitting device has organic layers such as a light emitting layer and a charge transporting layer. Polymer compounds used for production of a light emitting device are investigated because an organic layer can be formed by application methods typified by an inkjet printing method, by use of the polymer compounds.

Patent document 1 describes a polymer compound comprising a constitutional unit derived from an aromatic hydrocarbon having a crosslinkable group in the side chain (the constitutional unit having a crosslinkable group contained in the polymer compound consists only of a constitutional unit derived from an aromatic hydrocarbon having a crosslinkable group in the side chain), as a material used in an organic layer of a light emitting device. Patent document 2 describes a polymer compound containing at the terminal a constitutional unit composed of a crosslinkable group (the constitutional unit having a crosslinkable group contained in the polymer compound consists only of a constitutional unit at the terminal composed of a crosslinkable group), as a material used in an organic layer of a light emitting device. Because these polymer compounds have a crosslinkable groups, it is possible that the polymer compound is subjected to an application method to form a film, then, the crosslinkable group is cross-linked by heating and the like, to form an organic layer which is substantially insoluble in a solvent. It is possible to laminate the other organic layer (for example, a light emitting layer) on this organic layer by an application method.

PRIOR ART DOCUMENT

Patent Document

[Patent document 1] JP-A No. 2008-106241
[Patent document 2] Japanese Patent Application National Publication No. Hei 11-510535

SUMMARY OF THE INVENTION

Problem to be Solved by the Invention

The polymer compounds described in Patent documents 1 and 2 described above, however, had not necessarily sufficient crosslinkability.

Then, the present invention has an object of providing a polymer compound excellent in crosslinkability. Also, the present invention has an object of providing a method for producing the polymer compound. Further, the present invention has an object of providing a composition comprising the polymer compound and a light emitting device produced by using the polymer compound.

Means for Solving the Problem

The present invention provides the following [1] to [14].
[1] A polymer compound comprising:
at least one terminal constitutional unit represented by the following formula (1) and
at least one type of constitutional unit selected from the group consisting of constitutional units represented by the following formula (2) and constitutional units represented by the following formula (2'):

[Chemical Formula 1]

(1)

[wherein,
mT represents an integer of 0 to 5, nT represents an integer of 1 to 4, and cT represents 0 or 1. When there are a plurality of mT, they may be the same or different. nT is 1 when cT is 0.

$Q^T$ represents a crosslinkable group selected from the following Group A of crosslinkable groups. When there are a plurality of $Q^T$, they may be the same or different.

$K^T$ represents an alkylene group, a cycloalkylene group, an arylene group, a divalent heterocyclic group, a group represented by —NR'—, an oxygen atom or a sulfur atom, the foregoing groups each optionally having a substituent, wherein R' represents a hydrogen atom, an alkyl group, a cycloalkyl group, an aryl group or a monovalent heterocyclic group, the foregoing groups each optionally having a substituent. When there are a plurality of $K^T$, they may be the same or different.

$Ar^T$ represents an aromatic hydrocarbon group or a heterocyclic group, the foregoing groups each optionally having a substituent.]

[Chemical Formula 2]

(2)

[wherein,
mA represents an integer of 0 to 5, and n represents 1 or 2. When there are a plurality of mA, they may be the same or different.

$Ar^1$ represents an aromatic hydrocarbon group or a heterocyclic group, the foregoing groups each optionally having a substituent.

$K^A$ represents an alkylene group, a cycloalkylene group, an arylene group, a divalent heterocyclic group, a group represented by —NR"—, an oxygen atom or a sulfur atom, the foregoing groups each optionally having a substituent, wherein R" represents a hydrogen atom, an alkyl group, a cycloalkyl group, an aryl group or a monovalent heterocyclic group, the foregoing groups each optionally having a substituent. When there are a plurality of $K^A$, they may be the same or different.

$Q^1$ represents a crosslinkable group selected from Group A of crosslinkable groups. When there are a plurality of $Q^1$, they may be the same or different.]

[Chemical Formula 3]

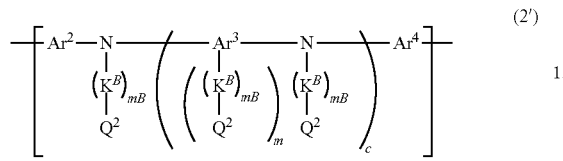

(2')

[wherein, mB represents an integer of 0 to 5, m represents an integer of 1 to 4, and c represents 0 or 1. When there are a plurality of mB, they may be the same or different.

$Ar^3$ represents an aromatic hydrocarbon group, a heterocyclic group, or a group in which at least one type of aromatic hydrocarbon ring and at least one type of heterocyclic ring are bonded directly to each other, the foregoing groups each optionally having a substituent.

$Ar^2$ and $Ar^4$ each independently represent an arylene group or a divalent heterocyclic group, the foregoing groups each optionally having a substituent.

Each of groups $Ar^2$, $Ar^3$ and $Ar^4$ optionally is bonded directly or via an oxygen atom or a sulfur atom to a group and that is attached to the nitrogen atom to which that group is attached but that is different from that group itself, thereby forming a ring.

$K^B$ represents an alkylene group, a cycloalkylene group, an arylene group, a divalent heterocyclic group, a group represented by —NR'"—, an oxygen atom or a sulfur atom, the foregoing groups each optionally having a substituent, wherein R'" represents a hydrogen atom, an alkyl group, a cycloalkyl group, an aryl group or a monovalent heterocyclic group, the foregoing groups each optionally having a substituent. When there are a plurality of $K^B$, they may be the same or different.

$Q^2$ represents a crosslinkable group selected from Group A of crosslinkable groups, a hydrogen atom, an alkyl group, a cycloalkyl group, an aryl group or a monovalent heterocyclic group, the foregoing groups each optionally having a substituent. When there are a plurality of $Q^2$, they may be the same or different. At least one $Q^2$ is a crosslinkable group selected from Group A of crosslinkable groups.]
(Group A of Crosslinkable Groups)

[Chemical Formula 4]

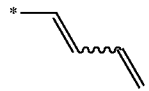  (XL-1)

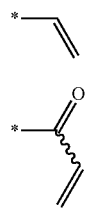  (XL-2)

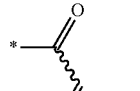  (XL-3)

(XL-4)

(XL-5)

(XL-6)

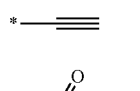

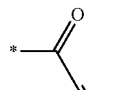

(XL-7)

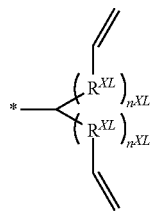

(XL-8)

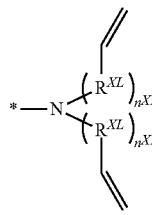

(XL-9)

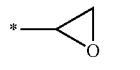

(XL-10)

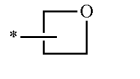

(XL-11)

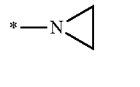

(XL-12)

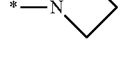

(XL-13)

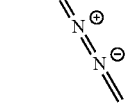

(XL-14)

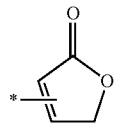

-continued

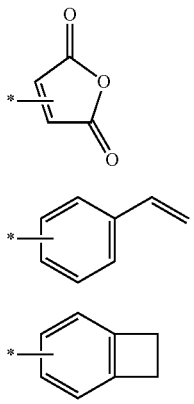

(XL-15)

(XL-16)

(XL-17)

[wherein, $R^{XL}$ represents a methylene group, an oxygen atom or a sulfur atom, and $n^{XL}$ represents an integer of 0 to 5. When there are a plurality of $R^{XL}$, they may be the same or different, and when there are a plurality of $n^{XL}$, they may be the same or different. * represents a binding site. The foregoing crosslinkable groups each optionally have a substituent.]

[2] The polymer compound according to [1], wherein $Q^T$ is a crosslinkable group represented by the formula (XL-1), (XL-7), (XL-16) or (XL-17).

[3] The polymer compound according to [1] or [2], wherein $Q^1$ is a constitutional unit represented by the formula (XL-1), (XL-7), (XL-16) or (XL-17).

[4] The polymer compound according to [1] or [2], wherein $Q^2$ is a constitutional unit represented by the formula (XL-1), (XL-7), (XL-16) or (XL-17).

[5] The polymer compound according to any one of [1] to [4], wherein cT is 0.

[6] The polymer compound according to any one of [1] to [4], wherein
cT is 1, and
$Ar^T$ is a group obtained by removing from a benzene ring optionally having a substituent, a fluorene ring optionally having a substituent, a naphthalene ring optionally having a substituent, a phenanthrene ring optionally having a substituent or a dihydrophenanthrene ring optionally having a substituent (nT+1) hydrogen atoms attached directly to carbon atoms constituting the ring.

[7] The polymer compound according to any one of [1] to [6], further comprising a constitutional unit represented by the following formula (X):

[Chemical Formula 5]

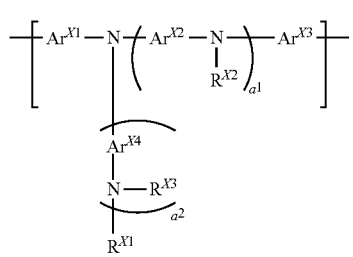

(X)

[wherein,
$a^1$ and $a^2$ each independently represent an integer of 0 or more.

$Ar^{X1}$ and $Ar^{X3}$ each independently represent an arylene group or a divalent heterocyclic group, the foregoing groups each optionally having a substituent.

$Ar^{X2}$ and $Ar^{X4}$ each independently represent an arylene group, a divalent heterocyclic group, or a divalent group in which at least one type of arylene group and at least one type of divalent heterocyclic group are bonded directly to each other, the foregoing groups each optionally having a substituent. When there are a plurality of $Ar^{X2}$ or $Ar^{X4}$, they may be the same or different at each occurrence.

$R^{X1}$, $R^{X2}$ and $R^{X3}$ each independently represent a hydrogen atom, an alkyl group, a cycloalkyl group, an aryl group or a monovalent heterocyclic group, the foregoing groups each optionally having a substituent. When there are a plurality of $R^{X2}$ or $R^{X3}$, they may be the same or different at each occurrence.]

[8] The polymer compound according to any one of [1] to [7], further comprising a constitutional unit represented by the following formula (Y):

[Chemical Formula 6]

$$+Ar^{Y1}+ \qquad (Y)$$

[wherein, $Ar^{Y1}$ represents an arylene group, a divalent heterocyclic group, or a divalent group in which at least one type of arylene group and at least one type of divalent heterocyclic group are bonded directly to each other, the foregoing groups each optionally having a substituent].

[9] The polymer compound according to [8], wherein the constitutional unit represented by the formula (Y) is a constitutional unit represented by the following formula (Y-1) or a constitutional unit represented by the following formula (Y-2):

[Chemical Formula 7]

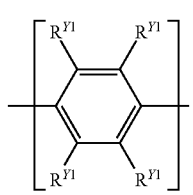

(Y-1)

[wherein, $R^{Y1}$ represents a hydrogen atom, an alkyl group, a cycloalkyl group, an alkoxy group, a cycloalkoxy group, an aryl group or a monovalent heterocyclic group, the foregoing groups each optionally having a substituent. The plurality of $R^{Y1}$ may be the same or different, and adjacent groups $R^{Y1}$ may be combined together to form a ring together with the carbon atoms to which they are attached.]

[Chemical Formula 8]

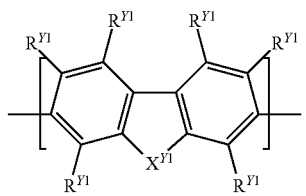

(Y-2)

[wherein,
$R^{Y1}$ is as defined above.

$X^{Y1}$ represents a group represented by —C(R$^{Y2}$)$_2$—, —C(R$^{Y2}$)=C(R$^{Y2}$)— or —C(R$^{Y2}$)$_2$—C(R$^{Y2}$)$_2$—, wherein R$^{Y2}$ represents a hydrogen atom, an alkyl group, a cycloalkyl group, an alkoxy group, a cycloalkoxy group, an aryl group or a monovalent heterocyclic group, the foregoing groups each optionally having a substituent. The plurality of R$^{Y2}$ may be the same or different, and groups R$^{Y2}$ may be combined together to form a ring together with the carbon atoms to which they are attached.]

[10] The polymer compound according to any one of [1] to [9], wherein the terminal constitutional unit represented by the formula (1) is contained in an amount of 0.1 mol % to 20 mol % with respect to the total amount of constitutional units contained in the polymer compound.

[11] A method for producing the polymer compound according to any one of [1] to [10], comprising a step of condensation-polymerizing at least one type of compound selected from the group consisting of a compound represented by the following formula (2M) and a compound represented by the following formula (2'M) and a step of end capping with a compound represented by the following formula (1M),

[Chemical Formula 9]

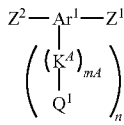
(2M)

[wherein, mA, n, Ar$^1$, K$^A$ and Q$^1$ are as defined above.

Z$^1$ and Z$^2$ each independently represent a group selected from Group A of substituents or a group selected from Group B of substituents.]

[Chemical Formula 10]

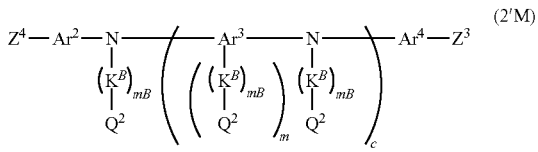
(2'M)

[wherein, mB, m, c, Ar$^2$, Ar$^3$, Ar$^4$, K$^B$ and Q$^2$ are as defined above.

Z$^3$ and Z$^4$ each independently represent a group selected from Group A of substituents or a group selected from Group B of substituents.]

[Chemical Formula 11]

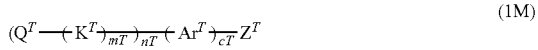
(1M)

[wherein, mT, nT, cT, Q$^T$, K$^T$ and Ar$^T$ are as defined above.

Z$^T$ represents a group selected from Group A of substituents or a group selected from Group B of substituents.]

<Group A of Substituents> a chlorine atom, a bromine atom, an iodine atom, and a group represented by —O—S(=O)$_2$R$^{C1}$ (wherein, R$^{C1}$ represents an alkyl group, a cycloalkyl group or an aryl group, the foregoing groups each optionally having a substituent.)

<Group B of Substituents> a group represented by -B(OR$^{C2}$)$_2$ (wherein, R$^{C2}$ represents a hydrogen atom, an alkyl group, a cycloalkyl group or an aryl group, the foregoing groups each optionally having a substituent. The plurality of R$^{C2}$ may be the same or different, and may be combined together to form a cyclic structure together with the oxygen atoms to which they are attached);

a group represented by -BF$_3$Q' (wherein, Q' represents Li, Na, K, Rb or Cs);

a group represented by —MgY' (wherein, Y' represents a chlorine atom, a bromine atom or an iodine atom);

a group represented by —ZnY" (wherein, Y" represents a chlorine atom, a bromine atom or an iodine atom); and a group represented by —Sn(R$^{C3}$)$_3$ (wherein, R$^{C3}$ represents a hydrogen atom, an alkyl group, a cycloalkyl group or an aryl group, the foregoing groups each optionally having a substituent. The plurality of R$^{C3}$ may be the same or different, and may be combined together to form a cyclic structure together with the tin atom to which they are attached).

[12] The polymer compound according to any one of [1] to [10] produced by a production method comprising a step of condensation-polymerizing at least one type of compound selected from the group consisting of a compound represented by the formula (2M) and a compound represented by the formula (2'M), and and a step of end capping with a compound represented by the formula (1M).

[13] A composition comprising:

the polymer compound according to any one of [1] to [10] and [12], and at least one type of material selected from the group consisting of a hole transporting material, a hole injection material, an electron transporting material, an electron injection material, a light emitting material, an antioxidant and a solvent.

[14] A light emitting device produced by using the polymer compound according to any one of [1] to [10] and [12].

Effect of the Invention

The present invention can provide a polymer compound excellent in crosslinkability. Also, the present invention can provide a method for producing the polymer compound. Further, the present invention can provide a composition comprising the polymer compound and a light emitting device produced by using the polymer compound.

MODES FOR CARRYING OUT THE INVENTION

Suitable embodiments of the present invention will be illustrated in detail below.

Explanation of Common Term

Terms commonly used in the present specification have the following meanings unless otherwise stated.

Me represents a methyl group, Et represents an ethyl group, Bu represents a butyl group, i-Pr represents an isopropyl group, and t-Bu represents a tert-butyl group.

A hydrogen atom may be a light hydrogen atom or a heavy hydrogen atom.

A solid line representing a bond to a central metal in a formula representing a metal complex denotes a coordinate bond or a covalent bond.

"Polymer compound" denotes a polymer having molecular weight distribution and having a polystyrene-equivalent number average molecular weight of $1\times10^3$ to $1\times10^8$.

"Low molecular weight compound" denotes a compound having no molecular weight distribution and having a molecular weight of $1\times10^4$ or less.

"Constitutional unit" denotes a unit structure found once or more in a polymer compound.

"Terminal constitutional unit" denotes a unit present at the terminal in a polymer compound, and usually denotes a unit present at the terminal of the main chain in a polymer compound. When one main chain is present in a polymer compound, two "terminal constitutional units" are present, and when two or more main chains are present in a polymer compound (in the case of a branched polymer compound), three or more "terminal constitutional units" are present.

"Alkyl group" may be any of linear or branched. The number of carbon atoms of the linear alkyl group is, not including the number of carbon atoms of a substituent, usually 1 to 50, preferably 3 to 30, more preferably 4 to 20. The number of carbon atoms of the branched alkyl groups is, not including the number of carbon atoms of a substituent, usually 3 to 50, preferably 3 to 30, more preferably 4 to 20.

The alkyl group optionally has a substituent, and examples thereof include a methyl group, an ethyl group, a propyl group, an isopropyl group, a butyl group, an isobutyl group, a tert-butyl group, a pentyl group, an isoamyl group, a 2-ethylbutyl group, a hexyl group, a heptyl group, a octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom in these groups with a cycloalkyl group, an alkoxy group, a cycloalkoxy group, an aryl group, a fluorine atom or the like, and the alkyl group having a substituent includes a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-n-hexylphenyl) propyl group and a 6-ethyloxyhexyl group.

The number of carbon atoms of "cycloalkyl group" is, not including the number of carbon atoms of a substituent, usually 3 to 50, preferably 3 to 30, more preferably 4 to 20.

The cycloalkyl group optionally has a substituent, and examples thereof include a cyclohexyl group, a cyclohexylmethyl group and a cyclohexylethyl group.

"Aryl group" denotes an atomic group remaining after removing from an aromatic hydrocarbon one hydrogen atom linked directly to a carbon atom constituting the ring. The number of carbon atoms of the aryl group is, not including the number of carbon atoms of a substituent, usually 6 to 60, preferably 6 to 20, more preferably 6 to 10.

The aryl group optionally has a substituent, and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, a 4-phenylphenyl group, and groups obtained by substituting a hydrogen atom in these groups with an alkyl group, a cycloalkyl group, an alkoxy group, a cycloalkoxy group, an aryl group, a fluorine atom or the like.

"Alkoxy group" may be any of linear or branched. The number of carbon atoms of the linear alkoxy group is, not including the number of carbon atoms of a substituent, usually 1 to 40, preferably 4 to 10. The number of carbon atoms of the branched alkoxy group is, not including the number of carbon atoms of a substituent, usually 3 to 40, preferably 4 to 10.

The alkoxy group optionally has a substituent, and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, a octyloxy group, a 2-ethylhexyloxy group, a nonyloxy group, a decyloxy group, a 3,7-dimethyloctyloxy group and a lauryloxy group, and groups obtained by substituting a hydrogen atom in these groups with a cycloalkyl group, an alkoxy group, a cycloalkoxy group, an aryl group, a fluorine atom or the like.

The number of carbon atoms of "Cycloalkoxy group" is, not including the number of carbon atoms of a substituent, usually 3 to 40, preferably 4 to 10.

The cycloalkoxy group optionally has a substituent, and examples thereof include a cyclohexyloxy group.

The number of carbon atoms of "Aryloxy group" is, not including the number of carbon atoms of a substituent, usually 6 to 60, preferably 7 to 48.

The aryloxy group optionally has a substituent, and examples thereof include a phenoxy group, a 1-naphthyloxy group, a 2-naphthyloxy group, a 1-anthracenyloxy group, a 9-anthracenyloxy group, a 1-pyrenyloxy group, and groups obtained by substituting a hydrogen atom in these groups with an alkyl group, a cycloalkyl group, an alkoxy group, a cycloalkoxy group, a fluorine atom or the like.

"p-Valent heterocyclic group" (p represents an integer of 1 or more) denotes an atomic group remaining after removing from a heterocyclic compound p hydrogen atoms among hydrogen atoms directly linked to a carbon atom or a hetero atom constituting the ring. Of p-valent heterocyclic groups, "p-valent aromatic heterocyclic groups" as an atomic group remaining after removing from an aromatic heterocyclic compound p hydrogen atoms among hydrogen atoms directly linked to a carbon atom or a hetero atom constituting the ring are preferable.

"Aromatic heterocyclic compound" denotes a compound in which the heterocyclic ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole and dibenzophosphole, and a compound in which an aromatic ring is condensed to the heterocyclic ring even if the heterocyclic ring itself shows no aromaticity such as phenoxazine, phenothiazine, dibenzoborole, dibenzosilole and benzopyran.

The number of carbon atoms of the monovalent heterocyclic group is, not including the number of carbon atoms of a substituent, usually 2 to 60, preferably 4 to 20.

The monovalent heterocyclic group optionally has a substituent, and examples thereof include a thienyl group, a pyrrolyl group, a furyl group, a pyridyl group, a piperidinyl group, a quinolinyl group, an isoquinolinyl group, a pyrimidinyl group, a triazinyl group, and groups obtained by substituting a hydrogen atom in these groups with an alkyl group, a cycloalkyl group, an alkoxy group, a cycloalkoxy group or the like.

"Halogen atom" denotes a fluorine atom, a chlorine atom, a bromine atom or an iodine atom.

"Amino group" optionally has a substituent, and a substituted amino group is preferable. The substituent which an amino group has is preferably an alkyl group, cycloalkyl group, an aryl group or a monovalent heterocyclic group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl)amino group and a bis(3,5-di-tert-butylphenyl)amino group.

"Alkenyl group" may be any of linear or branched. The number of carbon atoms of the linear alkenyl group, not including the number of carbon atoms of the substituent, is usually 2 to 30, preferably 3 to 20. The number of carbon atoms of the branched alkenyl group, not including the number of carbon atoms of the substituent, is usually 3 to 30, preferably 4 to 20.

The number of carbon atoms of "Cycloalkenyl group", not including the number of carbon atoms of the substituent, is usually 3 to 30, preferably 4 to 20.

The alkenyl group and cycloalkenyl group each optionally have a substituent, and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, the foregoing groups having a substituent.

"Alkynyl group" may be any of linear or branched. The number of carbon atoms of the alkynyl group, not including the number of carbon atoms of the substituent, is usually 2 to 20, preferably 3 to 20. The number of carbon atoms of the branched alkynyl group, not including the number of carbon atoms of the substituent, is usually 4 to 30, preferably 4 to 20.

The number of carbon atoms of "Cycloalkynyl group", not including the number of carbon atoms of the substituent, is usually 4 to 30, preferably 4 to 20.

The alkynyl group and cycloalkynyl group each optionally have a substituent, and examples thereof include an ethynyl group, a 1-propynyl group, a 2-propynyl group, a 2-butynyl group, a 3-butynyl group, a 3-pentynyl group, a 4-pentynyl group, a 1-hexynyl group, a 5-hexynyl group, the foregoing groups having a substituent.

"Arylene group" denotes an atomic group remaining after removing from an aromatic hydrocarbon two hydrogen atoms linked directly to carbon atoms constituting the ring. The number of carbon atoms of the arylene group is, not including the number of carbon atoms of a substituent, usually 6 to 60, preferably 6 to 30, more preferably 6 to 18.

The arylene group optionally has a substituent, and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group, a chrysenediyl group, the foregoing groups having a substituent, preferably, groups represented by the formulae (A-1) to (A-20). The arylene group includes groups obtained by linking a plurality of these groups.

[Chemical Formula 12]

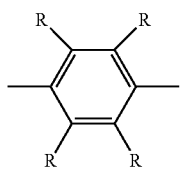
(A-1)

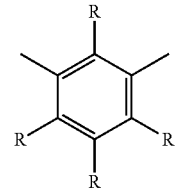
(A-2)

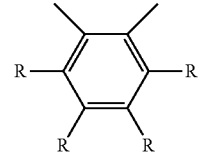
(A-3)

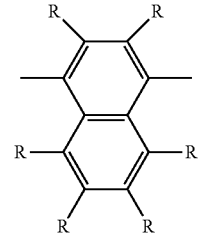
(A-4)

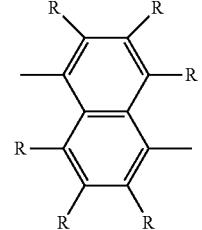
(A-5)

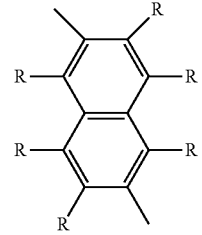
(A-6)

[Chemical Formula 13]

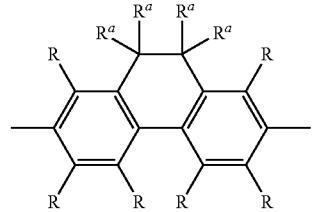
(A-7)

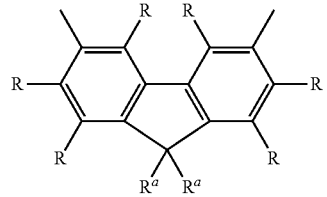
(A-8)

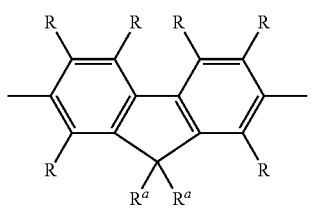
(A-9)
[Chemical Formula 14]
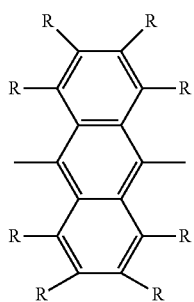
(A-10)
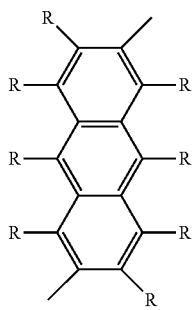
(A-11)
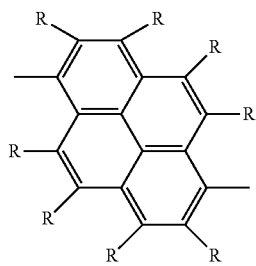
(A-12)
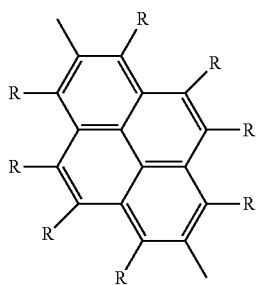
(A-13)
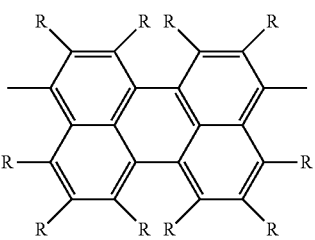
(A-14)
[Chemical Formula 15]
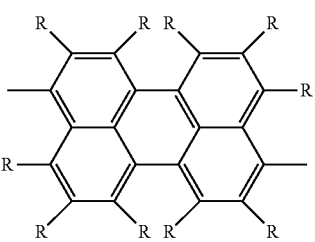
(A-15)
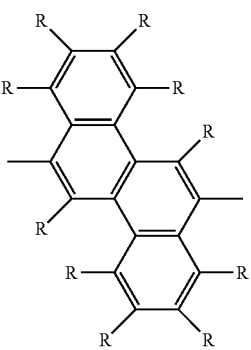
(A-16)
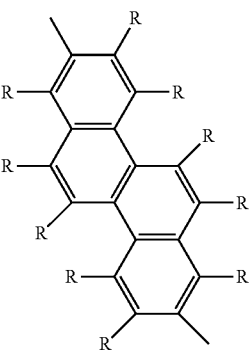
(A-17)
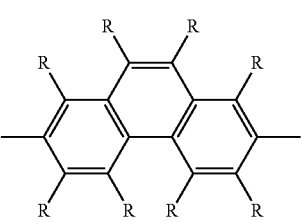
(A-18)
(A-19)

(A-20)

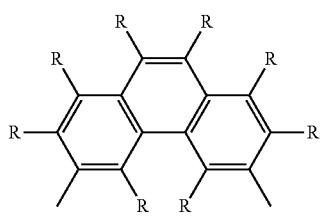

[wherein, R and $R^a$ each independently represent a hydrogen atom, an alkyl group, a cycloalkyl group, an aryl group or a monovalent heterocyclic group. The plurality of R and $R^a$ each may be the same or different, and adjacent groups $R^a$ may be combined together to form a ring together with the atoms to which they are attached.]

The number of carbon atoms of the divalent heterocyclic group is, not including the number of carbon atoms of a substituent, usually 2 to 60, preferably 3 to 30, more preferably 4 to 15.

The divalent heterocyclic group optionally has a substituent, and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms linking directly to a carbon atom or a hetero atom constituting the ring, preferably groups represented by the formulae (AA-1) to (AA-34). The divalent heterocyclic group includes groups obtained by linking a plurality of these groups.

[Chemical Formula 16]

(AA-1)

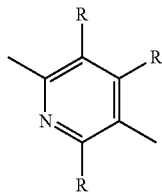

(AA-2)

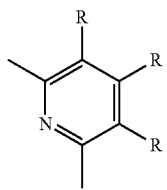

(AA-3)

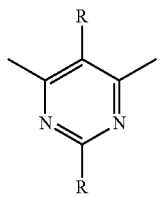

(AA-4)

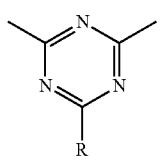

(AA-5)

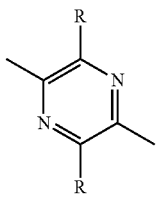

(AA-6)

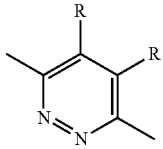

(AA-7)

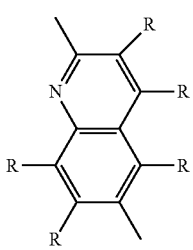

[Chemical Formula 17]

(AA-8)

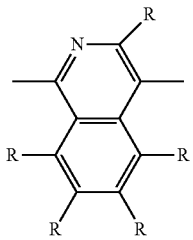

(AA-9)

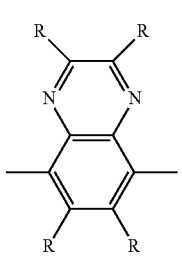

(AA-10)

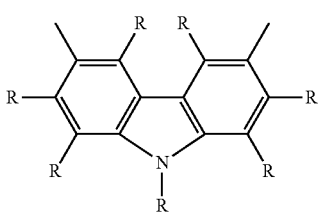

(AA-11)

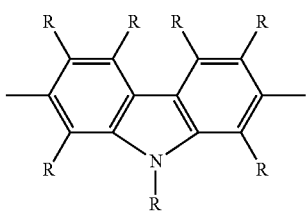

[Chemical Formula 18]
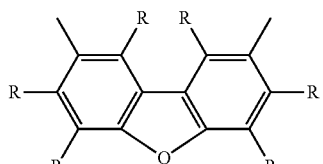
(AA-12)
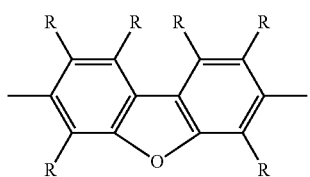
(AA-13)
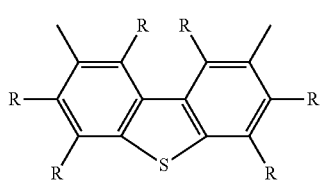
(AA-14)
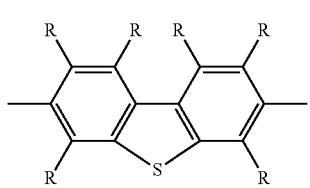
(AA-15)
[Chemical Formula 19]
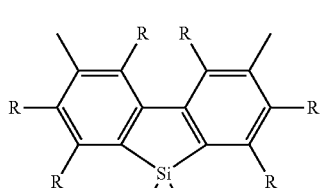
(AA-16)
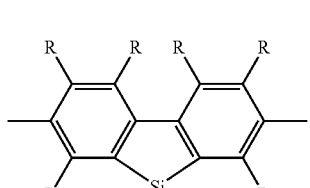
(AA-17)
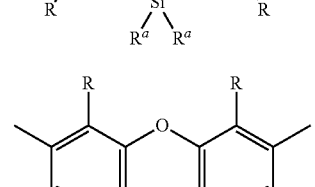
(AA-18)
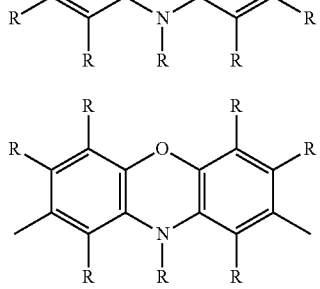
(AA-19)
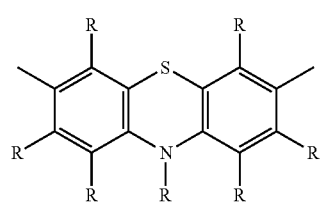
(AA-20)
[Chemical Formula 20]
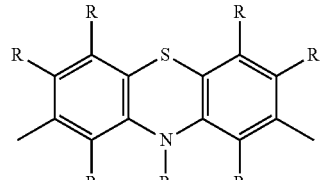
(AA-21)
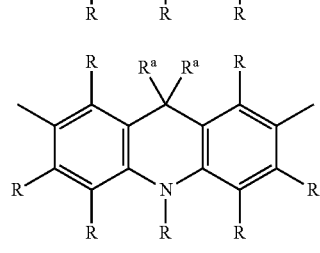
(AA-22)
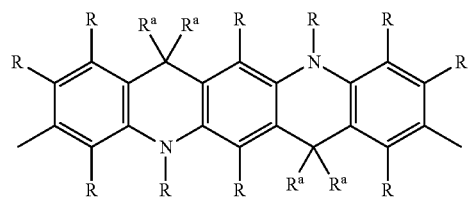
(AA-23)
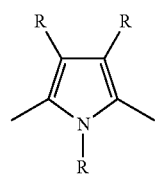
(AA-24)
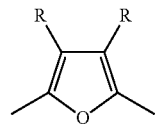
(AA-25)
[Chemical Formula 21]
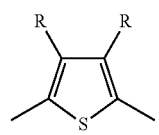
(AA-26)
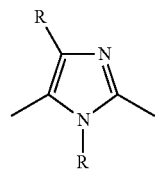
(AA-27)

-continued

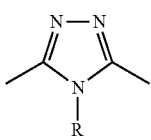
(AA-28)

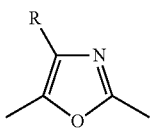
(AA-29)

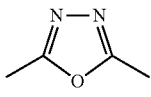
(AA-30)

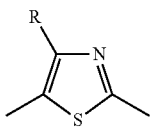
(AA-31)

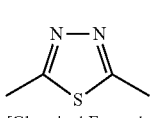
(AA-32)

[Chemical Formula 22]

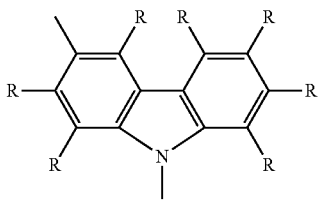
(AA-33)

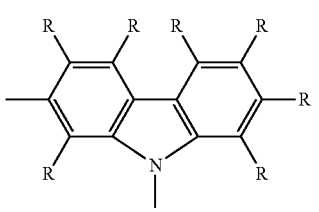
(AA-34)

[wherein, R and $R^a$ are as defined above.]

"Crosslinkable group" is a group capable of forming a new bond by being subjected to heating treatment, ultraviolet irradiation treatment, a radical reaction and the like, and crosslinkable groups are preferably groups represented by the formulae (XL-1) to (XL-17) of Group A of crosslinkable groups.

"Substituent" represents a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group or a cycloalkynyl group. The substituent may be a crosslinkable group.

<Polymer Compound>

The polymer compound of the present invention is a polymer compound comprising
at least one terminal constitutional unit represented by the formula (1), and
at least one type of constitutional unit selected from the group consisting of constitutional units represented by the formula (2) and constitutional units represented by the formula (2').

The terminal constitutional unit represented by the formula (1) contained in the polymer compound of the present invention is usually a constitutional unit formed by "a step of end capping with a compound represented by the formula (1M)" in the following method of producing the polymer compound of the present invention.

The at least one type of constitutional unit selected from the group consisting of constitutional units represented by the formula (2) and constitutional units represented by the formula (2') contained in the polymer compound of the present invention is usually a constitutional unit formed by "a step of condensation-polymerizing at least one type of compound selected from the group consisting of a compound represented by the formula (2M) and a compound represented by the formula (2'N)" in the following method of producing the polymer compound of the present invention.

[Terminal Constitutional Unit Represented by the Formula (1)]

mT is preferably an integer of 0 to 3, more preferably 0 or 1, further preferably 0, because synthesis of the polymer compound of the present invention is easy.

When there are a plurality of mT, they may be the same or different, and it is preferable that they are the same integer, because synthesis of the polymer compound of the present invention is easy.

nT is preferably an integer of 1 to 3, more preferably 1 or 2, further preferably 1, because synthesis of the polymer compound of the present invention is easy.

$Q^T$ is preferably a crosslinkable group represented by the formula (XL-1), (XL-7), (XL-16) or (XL-17), more preferably a crosslinkable group represented by the formula (XL-1) or (XL-17), among crosslinkable groups selected from the following Group A of crosslinkable groups, because the crosslinkability of the polymer compound of the present invention is more excellent.

The crosslinkable group represented by $Q^T$ (that is, a crosslinkable group selected from Group A of crosslinkable groups) optionally has a substituent. The substituent which the crosslinkable group represented by $Q^T$ optionally has is preferably an alkyl group, a cycloalkyl group or an aryl group, more preferably an alkyl group, because synthesis of the polymer compound of the present invention is easy.

When the crosslinkable group represented by the formula (XL-17) as $Q^T$ has a substituent, the crosslinkable group represented by the formula (XL-17) is preferably a crosslinkable group represented by the formula (XL-17'), because the crosslinkability of the polymer compound of the present invention is excellent.

[Chemical Formula 23]

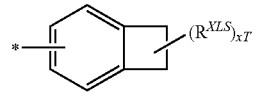
(XL-17')

[wherein,
xT represents an integer of 1 to 4.
$R^{XLS}$ represents an alkyl group, a cycloalkyl group, an alkoxy group, a cycloalkoxy group, an aryl group or a monovalent heterocyclic group, the foregoing groups each optionally having a substituent. When there are a plurality of $R^{XLS}$, they may be the same or different, and may be combined together to form a ring together with carbon atoms to which they are attached.

* represents a binding site.]

xT is preferably an integer of 1 to 3, more preferably 1 or 2, further preferably 1, because synthesis of the polymer compound of the present invention is easy.

$R^{XLS}$ is preferably an alkyl group, a cycloalkyl group, an alkoxy group, a cycloalkoxy group or an aryl group, more preferably an alkyl group, a cycloalkyl group or an aryl group, further preferably an alkyl group or an aryl group, particularly preferably an alkyl group, because synthesis of the polymer compound of the present invention is easy.

The crosslinkable group represented by the formula (XL-17') includes crosslinkable groups represented by the formula (XLS-1) to the formula (XLS-7), and is preferably a crosslinkable group represented by the formula (XLS-1), the formula (XLS-3) or the formula (XLS-4), more preferably a crosslinkable group represented by the formula (XLS-1) or the formula (XLS-3), further preferably a crosslinkable group represented by the formula (XLS-3), because the crosslinkability of the polymer compound of the present invention is more excellent.

[Chemical Formula 24]

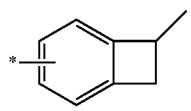
(XLS-1)

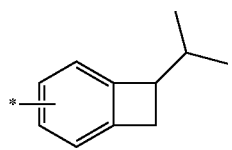
(XLS-2)

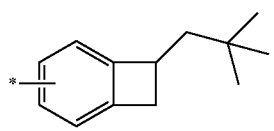
(XLS-3)

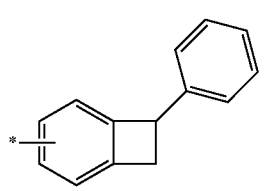
(XLS-4)

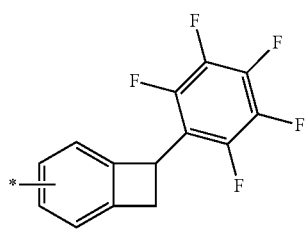
(XLS-5)

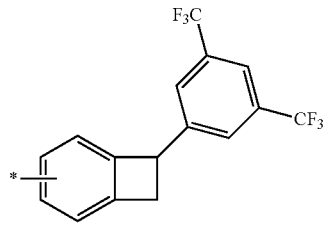
(XLS-6)

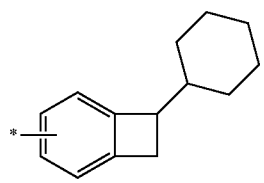
(XLS-7)

[wherein, * represents a binding site.]

When there are a plurality of $Q^T$, they may be the same or different, and it is preferable that they are the same crosslinkable group, because synthesis of the polymer compound of the present invention is easy.

$K^T$ is preferably an alkylene group, a cycloalkylene group, an arylene group or a divalent heterocyclic group, more preferably an alkylene group or an arylene group, further preferably an alkylene group, because the crosslinkability of the polymer compound of the present invention is more excellent, the foregoing groups each optionally having a substituent.

The number of carbon atoms of the alkylene group represented by $K^T$ is usually 1 to 10, preferably 1 to 8, more preferably 1 to 6, not including the number of carbon atoms of a substituent. The number of carbon atoms of the cycloalkylene group represented by $K^T$ is usually 3 to 10, not including the number of carbon atoms of a substituent.

The alkylene group and the cycloalkylene group each optionally having a substituent, and include, for example, a methylene group, an ethylene group, a propylene group, butylene group, a hexylene group, a cyclohexylene group and an octylene group.

The arylene group represented by $K^T$ optionally has a substituent, and includes, for example, o-phenylene, m-phenylene and p-phenylene.

The substituent which the group represented by $K^T$ optionally has is preferably an alkyl group, a cycloalkyl group or an aryl group.

When there are a plurality of $K^T$, they may be the same or different, and it is preferable that they are the same group or atom, because synthesis of the polymer compound of the present invention is easy.

When there are a plurality of $K^T$, two or more K' may be a group represented by —NR'—, and it is preferable that groups represented by —NR'— are not adjacent.

When there are a plurality of $K^T$, two or more $K^T$ may be an oxygen atom or a sulfur atom, and it is preferable that these atoms are not adjacent.

$Ar^T$ is preferably an aromatic hydrocarbon group optionally having a substituent, because synthesis of the polymer compound of the present invention is easy.

The number of carbon atoms of the aromatic hydrocarbon group represented by $Ar^T$ is usually 6 to 60, preferably 6 to 30, more preferably 6 to 18, not including the number of carbon atoms of a substituent.

The number of carbon atoms of the heterocyclic group represented by $Ar^T$ is usually 3 to 60, preferably 3 to 30, more preferably 3 to 18, not including the number of carbon atoms of a substituent.

$Ar^T$ is preferably a group obtained by removing from a benzene ring optionally having a substituent, a fluorene ring optionally having a substituent, a naphthalene ring optionally having a substituent, a phenanthrene ring optionally having a substituent or a dihydrophenanthrene ring optionally having a substituent, more preferably a group obtained by removing from a benzene ring optionally having a substituent or a fluorene ring optionally having a substituent (nT+1) hydrogen atoms attached directly to carbon atoms constituting the ring, because the crosslinkability of the polymer compound of the present invention is more excellent.

The aromatic hydrocarbon group and the heterocyclic group represented by $Ar^T$ each optionally have a substituent, and the substituent includes an alkyl group, a cycloalkyl group, an alkoxy group, a cycloalkoxy group, an aryl group, an aryloxy group, a halogen atom, a monovalent heterocyclic group and a cyano group.

The polymer compound of the present invention comprises at least one terminal constitutional unit represented by the formula (1), and preferably contains two terminal constitutional units represented by the formula (1), because synthesis of the polymer compound of the present invention is easy.

The amount of the terminal constitutional unit represented by the formula (1) is preferably 0.1 mol %; to 20 mol % with respect to the total amount of constitutional units contained in the polymer compound, because synthesis of the polymer compound of the present invention is easy.

It is preferable that mT is an integer of 0 to 3 and nT is an integer of 1 to 3, it is further preferable that mT is 0 or 1 and nT is 1 or 2, in the terminal constitutional unit represented by the formula (1).

The terminal constitutional unit represented by the formula (1) includes, for example, terminal constitutional units represented by the formula (1-1) to the formula (1-33), and is preferably an terminal constitutional unit represented by the formula (1-1) to the formula (1-7), the formula (1-10), the formula (1-12), the formula (1-13), the formula (1-16), the formula (1-20), the formula (1-23), the formula (1-24) or the formula (1-31), more preferably an terminal constitutional unit represented by the formula (1-1), the formula (1-4) to the formula (1-7), the formula (1-10), the formula (1-12), the formula (1-13), the formula (1-16), the formula (1-20), the formula (1-23), the formula (1-24) or the formula (1-31), further preferably an terminal constitutional unit represented by the formula (1-4), the formula (1-6), the formula (1-10), the formula (1-12), the formula (1-13), the formula (1-16), the formula (1-20), the formula (1-23) or the formula (1-24), because the crosslinkability of the polymer compound of the present invention is more excellent.

TABLE 1

| formula | mT | nT | cT | $Q^T$ | $K^T$ | $Ar^T$ |
|---|---|---|---|---|---|---|
| (1-1) | 0 | 1 | 0 | (XL-1) | — | — |
| (1-2) | 0 | 1 | 0 | (XL-7) | — | — |
| (1-3) | 0 | 1 | 0 | (XL-16) | — | — |
| (1-4) | 0 | 1 | 0 | (XL-17) | — | — |
| (1-5) | 1 | 1 | 1 | (XL-1) | $-(CH_2)_4-$ |  |
| (1-6) | 1 | 1 | 1 | (XL-17) | $-(CH_2)_4-$ |  |
| (1-7) | 1 | 1 | 1 | (XL-1) | $-(CH_2)_3-$ |  |
| (1-8) | 1 | 1 | 1 | (XL-2) | 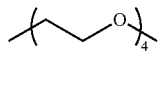 |  |
| (1-9) | 2 | 1 | 1 | (XL-17) | 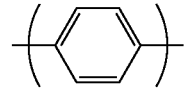 |  |
| (1-10) | 1 | 1 | 1 | (XL-1) | $-(CH_2)_2-$ |  |

TABLE 1-continued

| formula | mT | nT | cT | $Q^T$ | $K^T$ | $Ar^T$ |
|---|---|---|---|---|---|---|
| (1-11) | 1 | 3 | 1 | (XL-3) | -(CH₂CH₂O)₃- | tetrasubstituted benzene |
| (1-12) | 1 | 1 | 1 | (XL-17) | -(CH₂)₂- | 1,4-phenylene |

TABLE 2

| formula | mT | nT | cT | $Q^T$ | $K^T$ | $Ar^T$ |
|---|---|---|---|---|---|---|
| (1-13) | 1 | 2 | 1 | (XL-1) | -(CH₂)₄- | fluorene |
| (1-14) | 1 | 4 | 1 | (XL-5) | -(CH₂)₄- | fluorene |
| (1-15) | 1 | 2 | 1 | (XL-1) | -(C₆H₄)- | naphthalene |
| (1-16) | 1 | 2 | 1 | (XL-1) | -(CH₂)₃- | fluorene |
| (1-17) | 1 | 2 | 1 | (XL-6) | -(CH₂)₃- | phenanthrene |
| (1-18) | 1 | 2 | 1 | (XL-10) | triazine | fluorene |
| (1-19) | 1 | 1 | 1 | (XL-17) | pyrazine | 1,4-phenylene |

TABLE 2-continued
| formula | mT | nT | cT | $Q^T$ | $K^T$ | $Ar^T$ |
|---|---|---|---|---|---|---|
| (1-20) | 1 | 2 | 1 | (XL-1) | —(CH$_2$)$_2$— |  |
| (1-21) | 1 | 2 | 1 | (XL-4) | —(CH$_2$)$_2$— |  |
| (1-22) | 3 | 2 | 1 | (XL-17) | 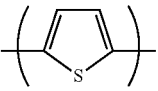 | 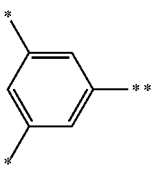 |
| (1-23) | 1 | 2 | 1 | (XL-17) | —(CH$_2$)$_2$— | 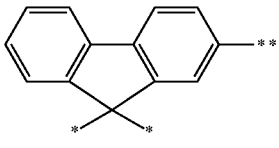 |
TABLE 3
| formula | mT | nT | cT | $Q^T$ | $K^T$ | $Ar^T$ |
|---|---|---|---|---|---|---|
| (1-24) | 0 | 2 | 1 | (XL-17) | — | 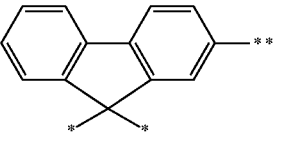 |
| (1-25) | 1 | 2 | 1 | (XL-11) |  | 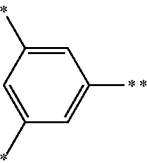 |
| (1-26) | 5 | 2 | 1 | (XL-12) | 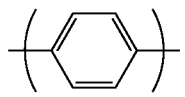 | 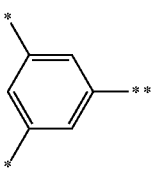 |
| (1-27) | 4 | 1 | 1 | (XL-13) | 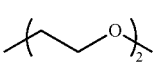 | 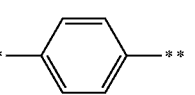 |

TABLE 3-continued

| formula | mT | nT | cT | Q$^T$ | K$^T$ | Ar$^T$ |
|---|---|---|---|---|---|---|
| (1-28) | 1 | 2 | 1 | (XL-14) | 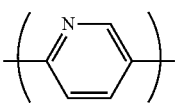 | 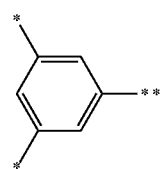 |
| (1-29) | 1 | 2 | 1 | (XL-15) | 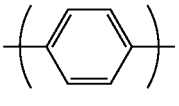 | 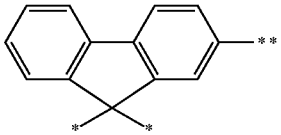 |
| (1-30) | 0 | 2 | 1 | (XL-16) | — | 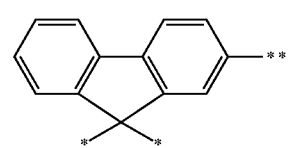 |
| (1-31) | 0 | 2 | 1 | (XL-17) | — | 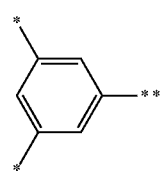 |
| (1-32) | 0 | 1 | 1 | (XL-3) | — |  |
| (1-33) | 0 | 1 | 1 | (XL-1) | — | 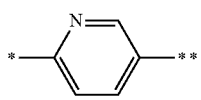 |

[wherein, * represents a binding site of Ar$^T$ and K$^T$, and ** represents a position binding to an adjacent constitutional unit.]

When Q$^T$ is a crosslinkable group represented by the formula (XL-17') in the terminal constitutional unit represented by the formula (1), the terminal constitutional unit represented by the formula (1) includes, for example, terminal constitutional units represented by the formula (1-34) to the formula (1-45), and is preferably an terminal constitutional unit represented by the formula (1-34), the formula (1-36), the formula (1-37) or the formula (1-41) to the formula (1-45), more preferably a crosslinkable group represented by the formula (1-36), the formula (1-42), the formula (1-44) or the formula (1-45), because the crosslinkability of the polymer compound of the present invention is more excellent.

TABLE 4

| formula | mT | nT | cT | Q$^T$ | K$^T$ | Ar$^T$ |
|---|---|---|---|---|---|---|
| (1-34) | 0 | 1 | 0 | (XLS-1) | — | — |
| (1-35) | 0 | 1 | 0 | (XLS-2) | — | — |
| (1-36) | 0 | 1 | 0 | (XLS-3) | — | — |
| (1-37) | 0 | 1 | 0 | (XLS-4) | — | — |
| (1-38) | 0 | 1 | 0 | (XLS-5) | — | — |
| (1-39) | 0 | 1 | 0 | (XLS-6) | — | — |
| (1-40) | 0 | 1 | 0 | (XLS-7) | — | — |
| (1-41) | 1 | 1 | 1 | (XLS-1) | ─(CH$_2$)$_4$─ |  |
| (1-42) | 1 | 1 | 1 | (XLS-3) | ─(CH$_2$)$_4$─ |  |

TABLE 4-continued

| formula | mT | nT | cT | $Q^T$ | $K^T$ | $Ar^T$ |
|---------|----|----|----|-------|-------|--------|
| (1-43) | 0 | 2 | 1 | (XLS-1) | — | (fluorene structure) |
| (1-44) | 0 | 2 | 1 | (XLS-3) | — | (fluorene structure) |
| (1-45) | 1 | 2 | 1 | (XLS-3) | —(CH$_2$)$_4$— | (fluorene structure) |

[wherein, * represents a binding site of $Ar^T$ and $K^T$, and ** represents a position binding to an adjacent constitutional unit.]

When the polymer compound of the present invention contains two or more terminal constitutional units represented by the formula (1), the constitutional unit represented by the formula (1) may be contained only singly or two or more units thereof may be contained in the polymer compound of the present invention, and it is preferable that the constitutional unit represented by the formula (1) may be contained only singly or two or more units thereof may be contained in the polymer compound of the present invention, because synthesis of the polymer compound of the present invention is easy.

[Constitutional Unit Represented by the Formula (2)]

mA is preferably an integer of 0 to 3, more preferably 0 or 1, because synthesis of the polymer compound of the present invention is easy.

$Ar^1$ is preferably an aromatic hydrocarbon group optionally having a substituent, because synthesis of the polymer compound of the present invention is easy.

The number of carbon atoms of the aromatic hydrocarbon group represented by $Ar^1$ is usually 6 to 60, preferably 6 to 30, more preferably 6 to 18, not including the number of carbon atoms of a substituent.

The arylene group portion obtained by removing n substituents of the aromatic hydrocarbon group represented by $Ar^1$ is preferably a group represented by the formula (A-1) to the formula (A-20), more preferably a group represented by the formula (A-1), the formula (A-2), the formula (A-6) to the formula (A-10), the formula (A-19) or the formula (A-20), further preferably a group represented by the formula (A-1), the formula (A-2) or the formula (A-9), the foregoing groups each optionally having a substituent.

The number of carbon atoms of the heterocyclic group represented by $Ar^1$ is usually 6 to 60, preferably 6 to 30, more preferably 6 to 18, not including the number of carbon atoms of a substituent.

The divalent heterocyclic group portion obtained by removing n substituents of the heterocyclic group represented by $Ar^1$ is preferably a group represented by the formula (AA-1) to the formula (AA-34).

$Ar^1$ is preferably a group obtained by removing from a benzene ring optionally having a substituent, a fluorene ring optionally having a substituent, a naphthalene ring optionally having a substituent, a phenanthrene ring optionally having a substituent or a dihydrophenanthrene ring optionally having a substituent (2+n) hydrogen atoms linked directly to carbon atoms constituting the ring, more preferably a group obtained by from a benzene ring optionally having a substituent, a fluorene ring optionally having a substituent or a naphthalene ring optionally having a substituent removing (2+n) hydrogen atoms linked directly to carbon atoms constituting the ring, further preferably a group obtained by removing from a benzene ring optionally having a substituent or a fluorene ring optionally having a substituent (2+n) hydrogen atoms linked directly to carbon atoms constituting the ring, because synthesis of the polymer compound of the present invention is easy.

The aromatic hydrocarbon group and the heterocyclic group represented by $Ar^1$ each optionally have a substituent, and the substituent includes an alkyl group, a cycloalkyl group, an alkoxy group, a cycloalkoxy group, an aryl group, an aryloxy group, a halogen atom, a monovalent heterocyclic group and a cyano group.

$K^A$ is preferably an alkylene group, a cycloalkylene group, an arylene group or a divalent heterocyclic group, more preferably an alkylene group or an arylene group, further preferably an alkylene group, because the crosslinkability of the polymer compound of the present invention is more excellent, the foregoing groups each optionally having a substituent.

The number of carbon atoms of the alkylene group represented by $K^A$ is usually 1 to 10, preferably 1 to 8, more preferably 1 to 6, not including the number of carbon atoms of a substituent. The number of carbon atoms of the cycloalkylene group represented by $K^A$ is usually 3 to 10, not including the number of carbon atoms of a substituent.

The alkylene group and the cycloalkylene group each optionally have a substituent, and include, for example, a methylene group, an ethylene group, a propylene group, a butylene group, a hexylene group, a cyclohexylene group and an octylene group.

The arylene group represented by $K^A$ optionally has a substituent, and includes, for example, o-phenylene, m-phenylene and p-phenylene.

The substituent which the group represented by $K^A$ optionally has is preferably an alkyl group, a cycloalkyl group or an aryl group.

When there are a plurality of $K^A$, they may be the same or different, and it is preferable that they are the same group or atom, because synthesis of the polymer compound of the present invention is easy.

When there are a plurality of $K^A$, two or more $K^T$ may be a group represented by —NR"—, and it is preferable that groups represented by —NR"— are not adjacent.

When there are a plurality of $K^A$, two or more $K^T$ may be an oxygen atom or a sulfur atom, and it is preferable that these atoms are not adjacent.

$Q^1$ is preferably a crosslinkable group represented by the formula (XL-1), (XL-7), (XL-16) or (XL-17), more preferably a crosslinkable group represented by the formula (XL-1) or (XL-17), among crosslinkable groups selected from Group A of crosslinkable groups, because the crosslinkability of the polymer compound of the present invention is more excellent.

The crosslinkable group represented by $Q^1$ (that is, crosslinkable group selected from Group A of crosslinkable groups) optionally has a substituent. The substituent which the crosslinkable group represented by $Q^1$ optionally has is preferably an alkyl group, a cycloalkyl group or an aryl group, more preferably an alkyl group, because synthesis of the polymer compound of the present invention is easy.

When the crosslinkable group represented by the formula (XL-17) as $Q^1$ has a substituent, the crosslinkable group represented by the formula (XL-17) is preferably a crosslinkable group represented by the formula (XL-17'), because the crosslinkability of the polymer compound of the present invention is excellent.

The examples and preferable range when $Q^1$ is a crosslinkable group represented by the formula (XL-17') are the same as the examples and preferable range when $Q^T$ is a crosslinkable group represented by the formula (XL-17').

When there are a plurality of $Q^1$, they may be the same or different, and it is preferable that they are the same crosslinkable group, because synthesis of the polymer compound of the present invention is easy.

When mA is an integer of 1 to 5 in a constitutional unit represented by the formula (2), it is preferable that $K^A$ is an alkylene group and $Q^1$ is a crosslinkable group represented by the formula (XL-1) or the formula (XL-17).

The constitutional unit represented by the formula (2) is preferably 2 to 90 mol %, more preferably 2 to 70 mol %, further preferably 3 to 50 mol %, with respect to the total amount of constitutional units contained in the polymer compound, because the polymer compound of the present invention is excellent in stability.

The constitutional unit represented by the formula (2) includes, for example, constitutional units represented by the formula (2-1) to the formula (2-29), the constitutional units represented by the formula (2-1) to the formula (2-29) each optionally having a substituent. Preferable are constitutional units represented by the formula (2-1) to the formula (2-8), the formula (2-13), the formula (2-17) to the formula (2-21) or the formula (2-25) to the formula (2-29), more preferable are constitutional units represented by the formula (2-1), the formula (2-5), the formula (2-6), the formula (2-13), the formula (2-17), the formula (2-18), the formula (2-21), the formula (2-25), the formula (2-27) or the formula (2-28), further preferable are constitutional units represented by the formula (2-1), the formula (2-6), the formula (2-13), the formula (2-18), the formula (2-27) or the formula (2-28), because the crosslinkability of the polymer compound of the present invention is more excellent.

[Chemical Formula 25]

(2-1)

(2-2)

(2-3)

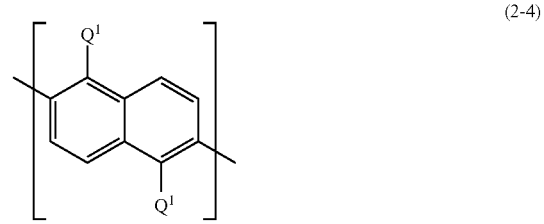

(2-4)

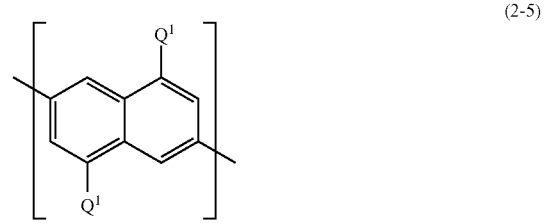

(2-5)

[Chemical Formula 26]

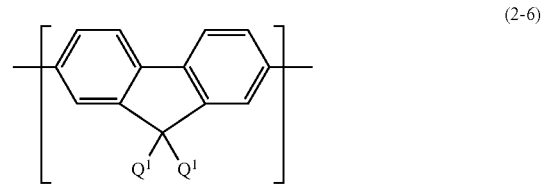

(2-6)

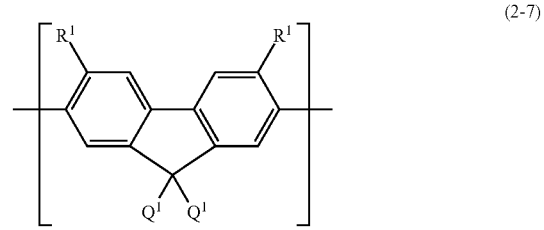

(2-7)

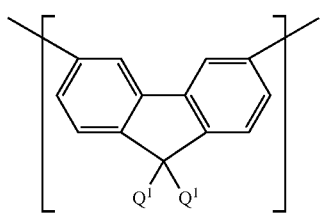 (2-8)
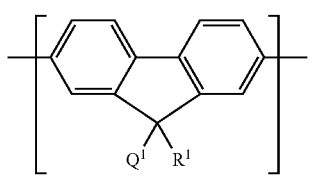 (2-9)
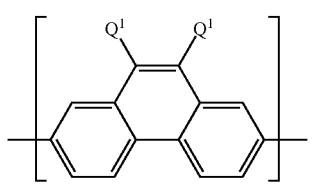 (2-10)
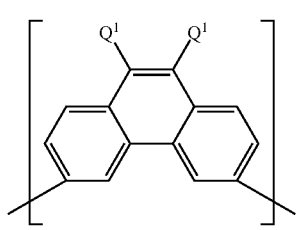 (2-11)
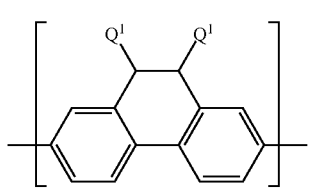 (2-12)
[wherein, $Q^1$ represents are as defined above. $R^1$ represents an alkyl group, and the alkyl group optionally has a substituent. When there are a plurality of $R^1$, they may be the same or different.]
[Chemical Formula 27]
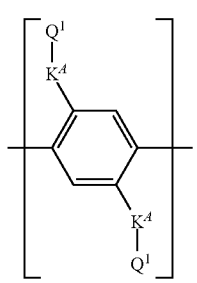 (2-13)
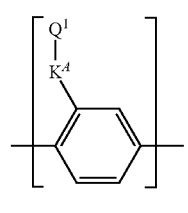 (2-14)
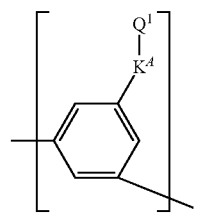 (2-15)
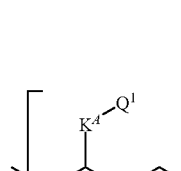 (2-16)
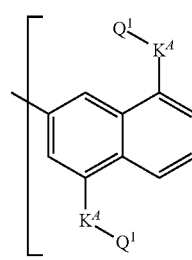 (2-17)
[Chemical Formula 28]
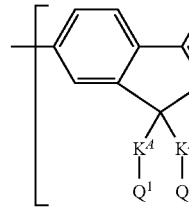 (2-18)
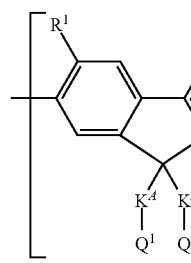 (2-19)

(2-20)
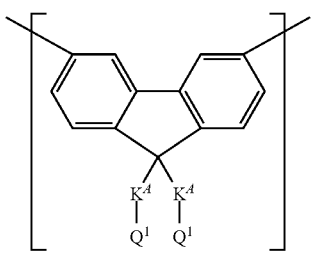

(2-21)
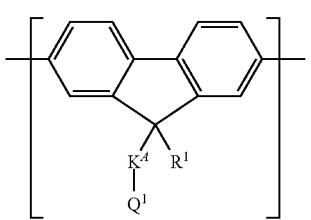

(2-22)
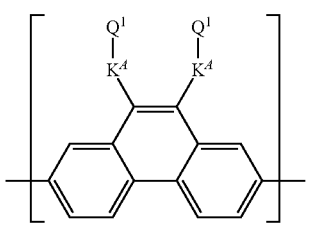

(2-23)
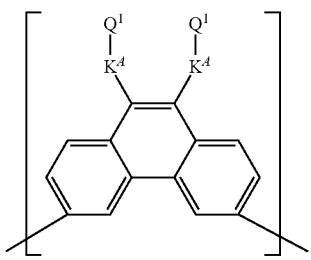

[Chemical Formula 29]

(2-25)
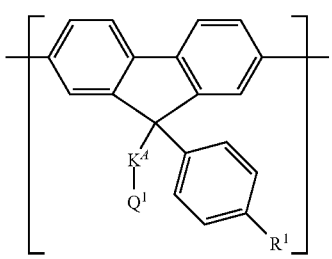

(2-26)
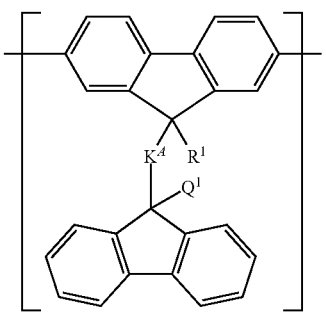

(2-27)
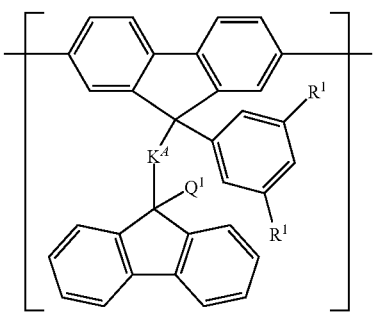

(2-28)
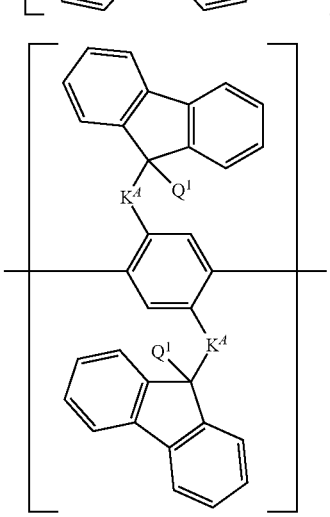

(2-29)
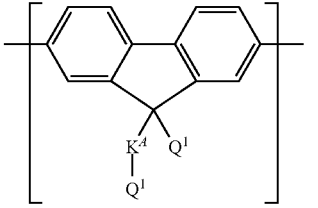

[wherein, $Q^1$, $K^A$ and $R^1$ are as defined above. When there are a plurality of $Q^1$, $K^A$ or $R^1$, they may be the same or different at each occurrence.]

Specific examples of the constitutional unit represented by the formula (2) include, for example, constitutional units represented by the formula (2-101) to the formula (2-137). Of them, preferable are constitutional units represented by the formula (2-101), the formula (2-104), the formula (2-111), the formula (2-112), the formula (2-120) to the formula (2-129) or the formula (2-132) to the formula (2-137), more preferable are constitutional units represented by the formula (2-101), the formula (2-104), the formula (2-111), the formula (2-121), the formula (2-123) to the formula (2-127) or the formula (2-132) to the formula (2-136), further preferable are constitutional units represented by the formula (2-101), the formula (2-111), the formula (2-121), the formula (2-123), the formula (2-126), the formula (2-127) or the formula (2-132) to the formula (2-136), because the crosslinkability of the polymer compound of the present invention is more excellent.
[Chemical Formula 30]
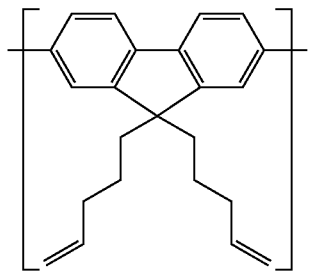 (2-101)
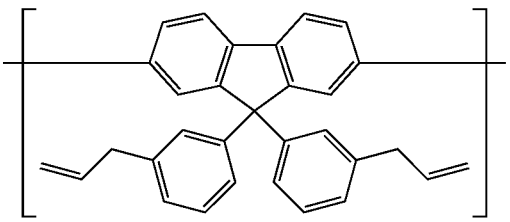 (2-102)
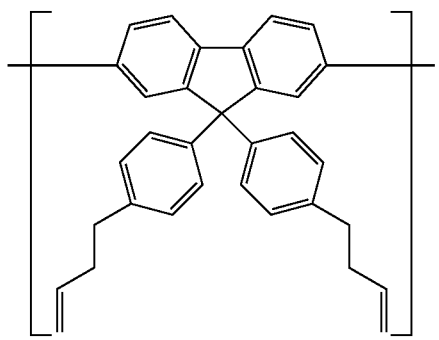 (2-103)
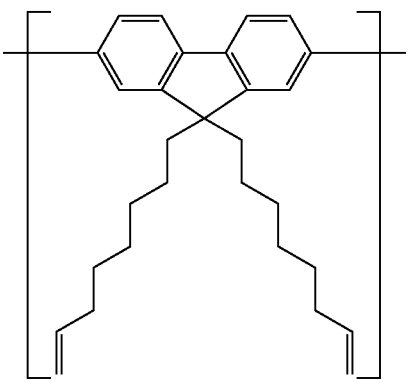 (2-104)
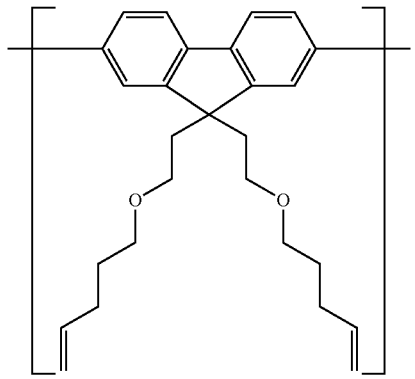 (2-105)
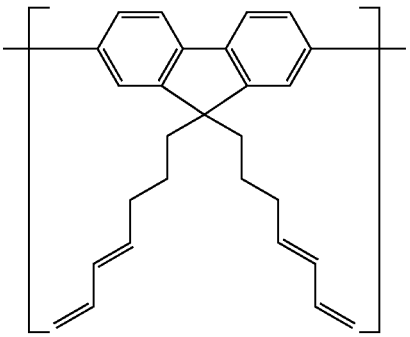 (2-106)
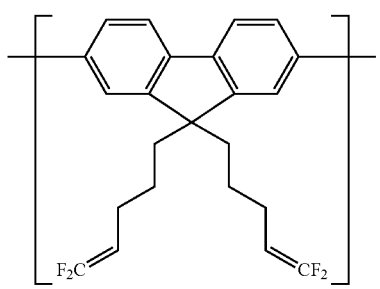 (2-107)
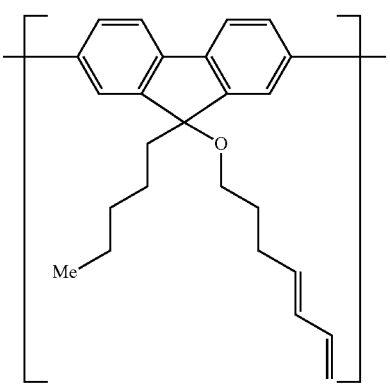 (2-108)

(2-109) 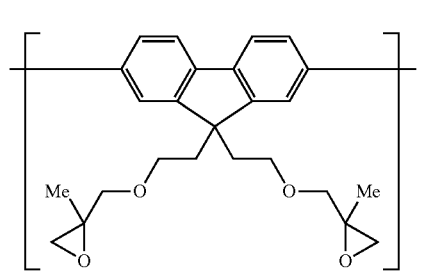
(2-110) 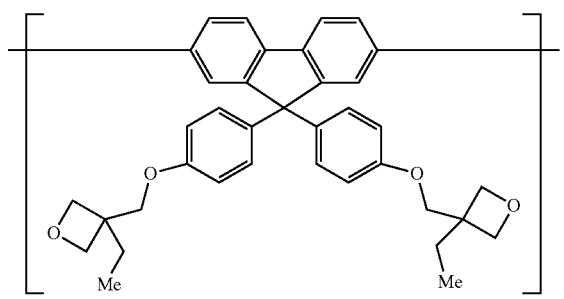
(2-111) 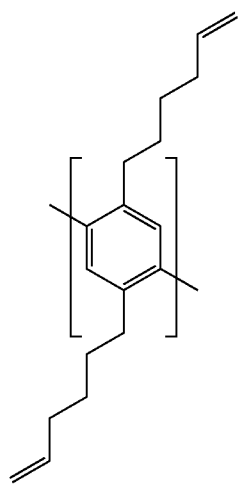
(2-112) 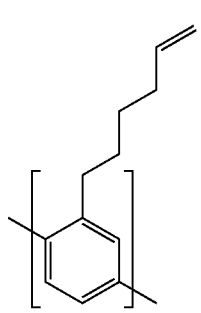
[Chemical Formula 31]
(2-113) 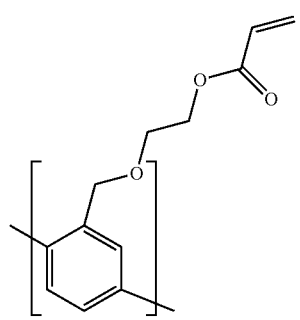
(2-114) 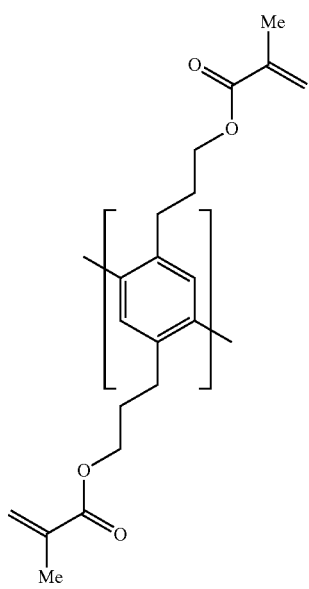

-continued
(2-115)
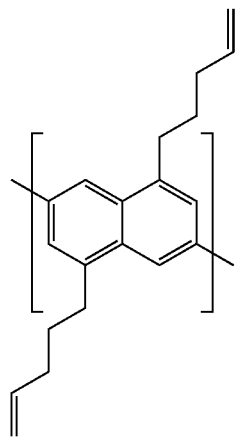
(2-116)
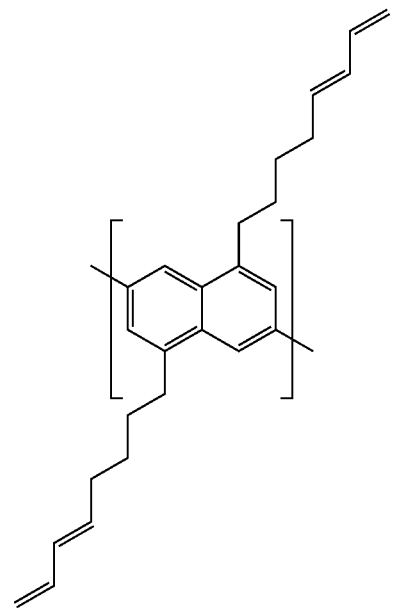
(2-117)
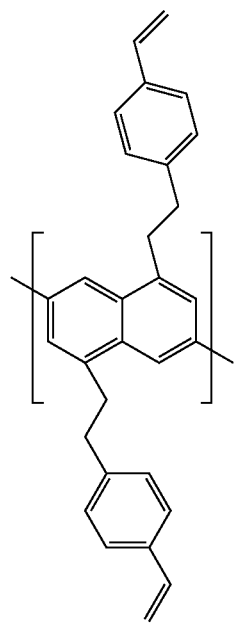
(2-118)
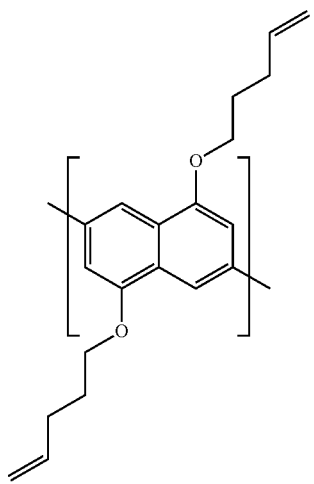
(2-119)
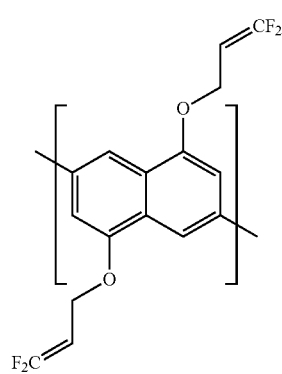
(2-120)
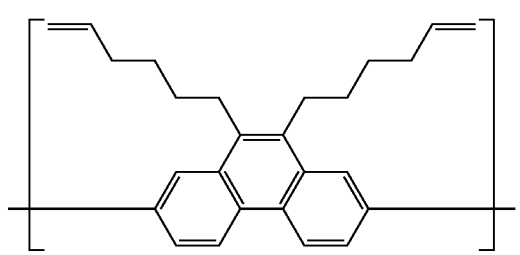

[Chemical Formula 32]
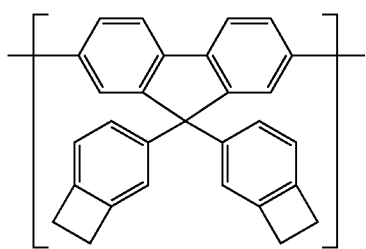
(2-121)
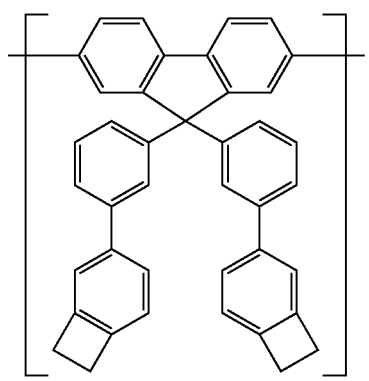
(2-122)
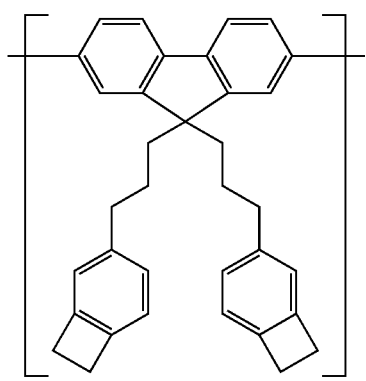
(2-123)
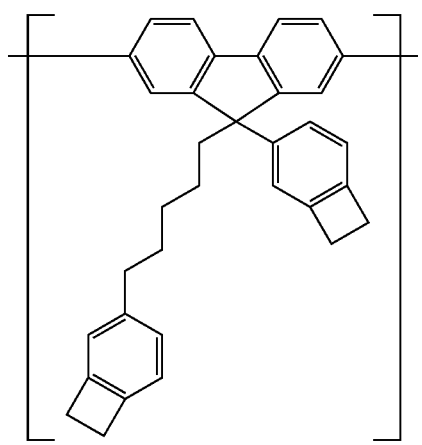
(2-124)
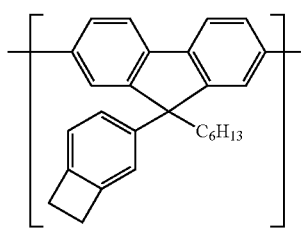
(2-125)
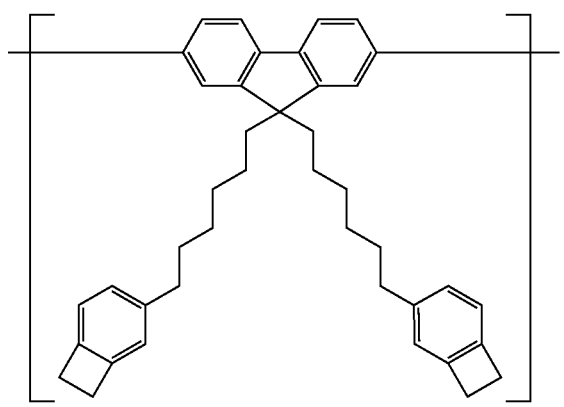
(2-126)

-continued
(2-127) 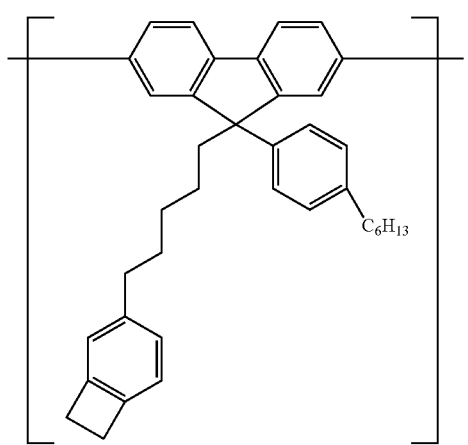
(2-128) 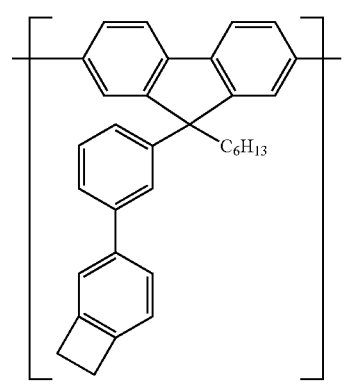
[Chemical Formula 33]
(2-129) 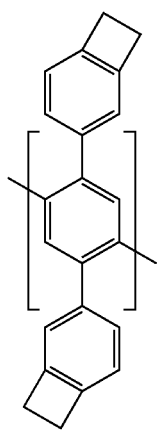
(2-130) 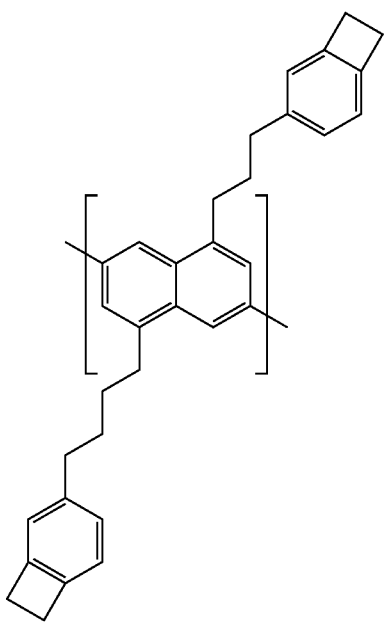
(2-131) 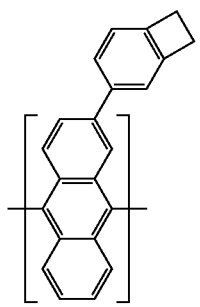
(2-132) 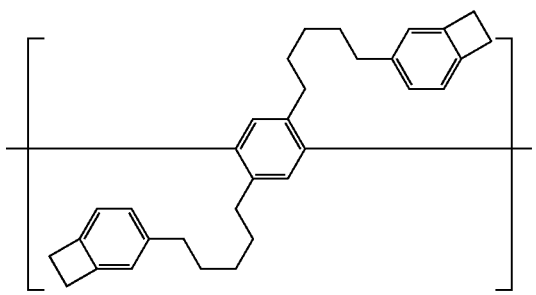

[Chemical Formula 34]
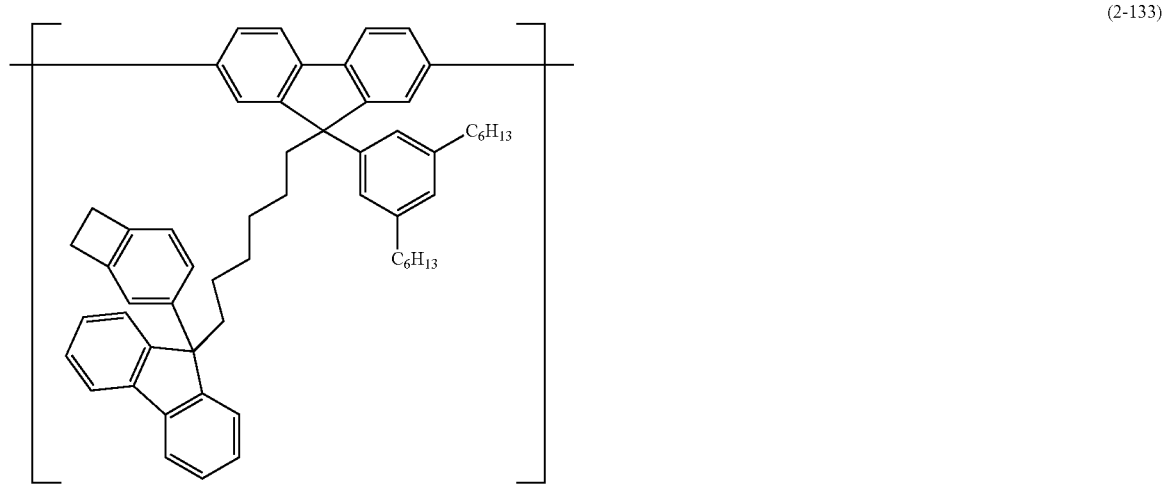
(2-133)
(2-134)
[Chemical Formula 35]
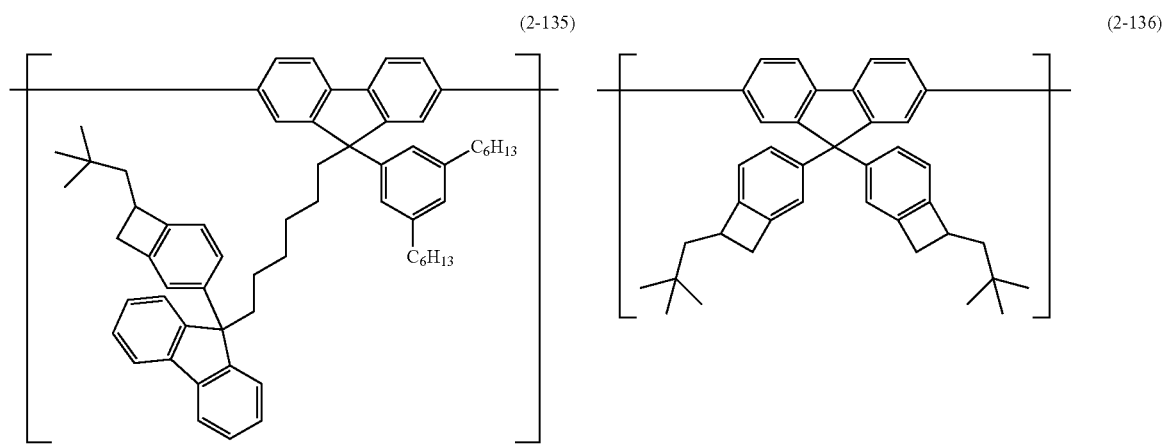
(2-135)
(2-136)

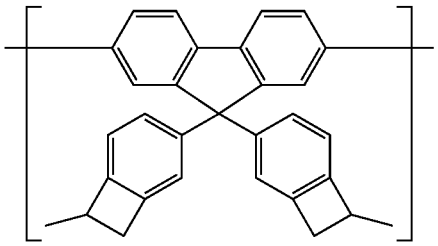

(2-137)

The constitutional unit represented by the formula (2) may be contained only singly or two or more units thereof may be contained in the polymer compound of the present invention.

[Constitutional Unit Represented by the Formula (2')]

mB is preferably 0 or 1, more preferably 0, because synthesis of the polymer compound of the present invention is easy.

m is preferably 2, because synthesis of the polymer compound of the present invention is easy.

c is preferably 0, because synthesis of the polymer compound of the present invention is easy.

$Ar^3$ is preferably an aromatic hydrocarbon group, because a light emitting device using the polymer compound of the present invention is excellent in light emission efficiency.

The definition and examples of the arylene group portion obtained by removing m substituents of the aromatic hydrocarbon group represented by $Ar^3$ are the same as the definition and examples of the arylene group represented by $Ar^{x2}$ in the following formula (X).

The definition and examples of the divalent group obtained by removing m substituents of a group in which at least one type of aromatic hydrocarbon ring and at least one type of heterocyclic ring represented by $Ar^3$ are bonded directly are the same as the definition and examples of the divalent group represented by $Ar^{x2}$ in which at least one type of arylene group and at least one type of divalent heterocyclic group are bonded directly in the following formula (X).

$Ar^2$ and $Ar^4$ represent preferably an arylene group, because production of the polymer compound of the present invention is easier.

The definition and examples of the arylene group represented by $Ar^2$ and $Ar^4$ are the same as the definition and examples of the arylene group represented by $Ar^{X1}$ and $Ar^{X3}$ in the following formula (X).

The definition and examples of the divalent heterocyclic group represented by $Ar^2$ and $Ar^4$ are the same as the definition and examples of the divalent heterocyclic group represented by $Ar^{X1}$ and $Ar^{X3}$ in the following formula (X).

The group represented by $Ar^2$, $Ar^3$ and $Ar^4$ each optionally has a substituent, and the substituent includes an alkyl group, a cycloalkyl group, an alkoxy group, a cycloalkoxy group, an aryl group, an aryloxy group, a halogen atom, a monovalent heterocyclic group and a cyano group.

The definitions and examples of the alkylene group, the cycloalkylene group, the arylene group and the divalent heterocyclic group represented by $K^B$ are the same as the definitions and examples of the alkylene group, the cycloalkylene group, the arylene group and the divalent heterocyclic group represented by $K^A$, respectively.

$K^B$ is preferably a phenylene group or a methylene group, because the crosslinkability of the polymer compound of the present invention becomes higher.

$Q^2$ is preferably a crosslinkable group selected from Group A of crosslinkable groups, a hydrogen atom, an alkyl group, a cycloalkyl group or an aryl group, more preferably a crosslinkable group selected from Group A of crosslinkable groups, a hydrogen atom, an alkyl group or an aryl group, further preferably a crosslinkable group selected from Group A of crosslinkable groups, a hydrogen atom or an alkyl group, because synthesis of the polymer compound of the present invention is easy, the foregoing groups each optionally having a substituent. At least one $Q^2$ is a crosslinkable group selected from Group A of crosslinkable groups.

The crosslinkable group represented by $Q^2$ is preferably a crosslinkable group represented by the formula (XL-1), (XL-7), (XL-16) or (XL-17), more preferably a crosslinkable group represented by the formula (XL-1) or (XL-17), among crosslinkable groups selected from Group A of crosslinkable groups, because the crosslinkability of the polymer compound of the present invention is more excellent.

The crosslinkable group represented by $Q^2$ (that is, a crosslinkable group selected from Group A of crosslinkable groups) optionally has a substituent. The substituent which the crosslinkable group represented by $Q^2$ optionally has is preferably an alkyl group, a cycloalkyl group or an aryl group, more preferably an alkyl group, because synthesis of the polymer compound of the present invention is easy.

When the crosslinkable group represented by the formula (XL-17) as $Q^2$ has a substituent, the crosslinkable group represented by the formula (XL-17) is preferably a crosslinkable group represented by the formula (XL-17'), because the crosslinkability of the polymer compound of the present invention is excellent.

The examples and preferable range when $Q^2$ is a crosslinkable group represented by the formula (XL-17') are the same as the examples and preferable range when $Q^T$ is a crosslinkable group represented by the formula (XL-17').

The constitutional unit represented by the formula (2') is preferably 2 to 90 mol %, more preferably 2 to 70 mol %, further preferably 3 to 50 mol % with respect to the total amount of constitutional units contained in the polymer compound, because the polymer compound of the present invention is excellent in stability.

The constitutional unit represented by the formula (2') includes, for example, constitutional units represented by the formula (2'-1) to the formula (2'-9), the constitutional units represented by the formula (2'-1) to the formula (2'-9) each optionally having a substituent. Preferable is a constitutional unit represented by the formula (2'-3) or the formula (2'-9), because the crosslinkability of the polymer compound of the present invention is more excellent.

[Chemical Formula 36]
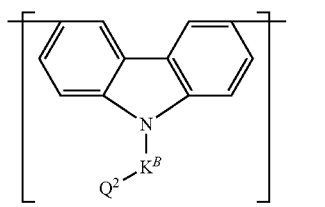
(2'-1)
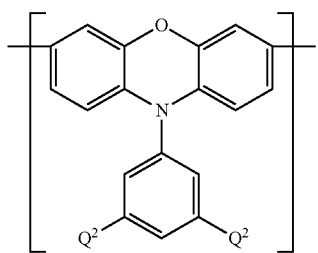
(2'-2)
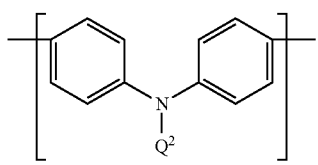
(2'-3)
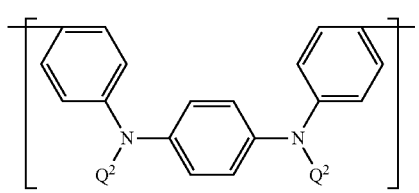
(2'-4)
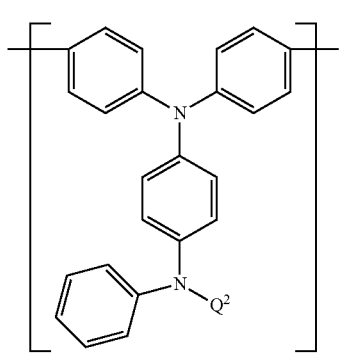
(2'-5)
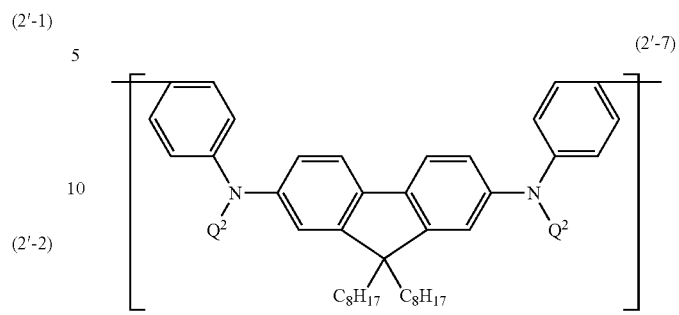
(2'-6)
(2'-7)
(2'-8)
(2'-9)
[wherein, $Q^2$ and $K^B$ are as defined above. When there are a plurality of $Q^2$, they may be the same or different.]
Specific examples of the constitutional unit represented by the formula (2') include, for example, constitutional units represented by the formula (2'-101) to the formula (2'-109).
[Chemical Formula 37]
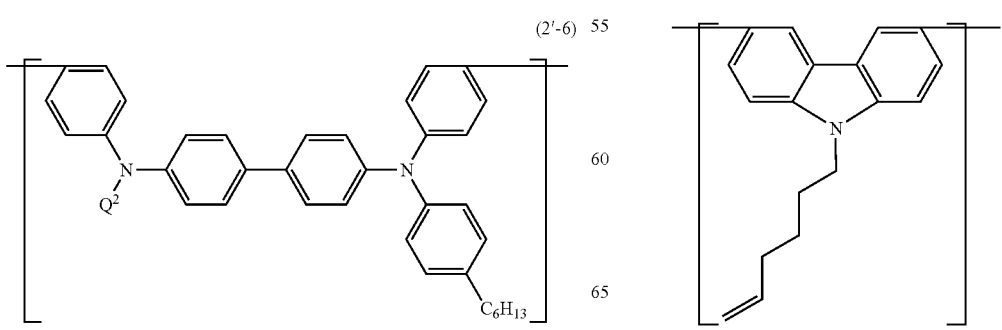
(2'-101)

-continued (2'-102)
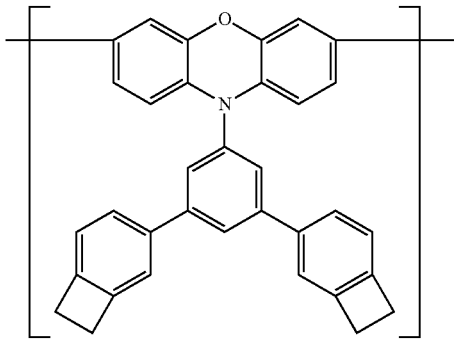

(2'-103)
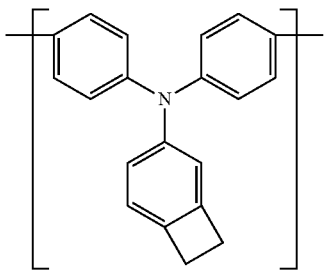

(2'-104)
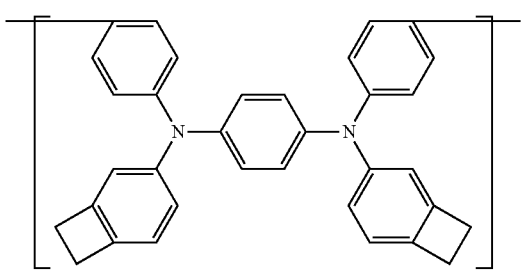

(2'-105)
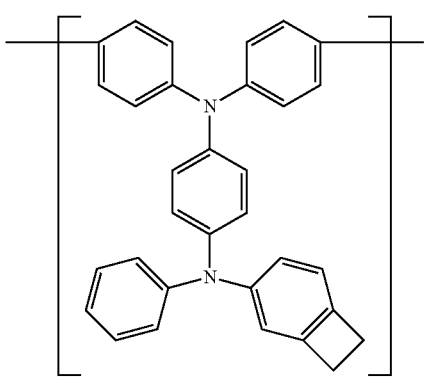

(2'-106)
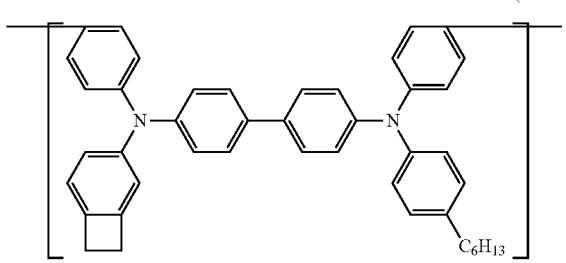

-continued (2'-107)
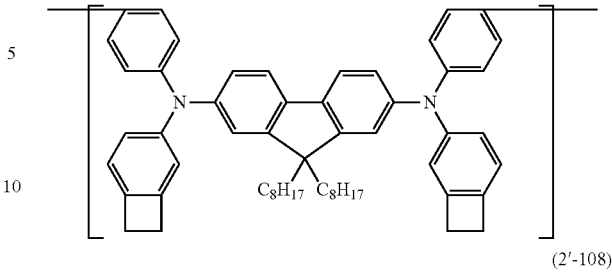

(2'-108)

(2'-109)

The constitutional unit represented by the formula (2') may be contained only singly or two or more units thereof may be contained in the polymer compound of the present invention.

[Other Constitutional Unit]

It is preferable that the polymer compound of the present invention further comprises a constitutional unit represented by the formula (X), because hole transportability is excellent.

$a^{X1}$ is preferably an integer of 2 or less, more preferably 1, because the luminance life of a light emitting device produced by using the polymer compound of the present invention is excellent.

$a^{X2}$ is preferably an integer of 2 or less, more preferably 0, because the luminance life of a light emitting device produced by using the polymer compound of the present invention is excellent.

$R^{X1}$, $R^{X2}$ and $R^{X3}$ are preferably an alkyl group, a cycloalkyl group, an aryl group or a monovalent heterocyclic group, more preferably an aryl group, the foregoing groups each optionally having a substituent.

The arylene group represented by $Ar^{X1}$ and $Ar^{X3}$ is more preferably a group represented by the formula (A-1) or the formula (A-9), further preferably a group represented by the formula (A-1), the foregoing groups each optionally having a substituent.

The divalent heterocyclic group represented by $Ar^{X1}$ and $Ar^{X3}$ is more preferably a group represented by the formula (AA-1), the formula (AA-2) or the formula (AA-7) to (AA-26), the foregoing groups each optionally having a substituent.

$Ar^{X1}$ and $Ar^{X3}$ are preferably an arylene group optionally having a substituent.

The arylene group represented by $Ar^{X2}$ and $Ar^{X4}$ is more preferably a group represented by the formula (A-1), the formula (A-6), the formula (A-7), the formulae (A-9) to (A-11) or the formula (A-19), the foregoing groups each optionally having a substituent.

The more preferable range of the divalent heterocyclic group represented by $Ar^{X2}$ and $Ar^{X4}$ is the same as the more preferable range of the divalent heterocyclic group represented by $Ar^{X1}$ and $Ar^{X3}$.

The more preferable range and the further preferable range of the arylene group and the divalent heterocyclic group in the divalent group in which at least one type of arylene group and at least one type of divalent heterocyclic group are bonded directly to each other represented by $Ar^{X2}$ and $Ar^{X4}$ are the same as the more preferable range and the further preferable range of the arylene group and the divalent heterocyclic group represented by $Ar^{X1}$ and $Ar^{X3}$, respectively.

The divalent group in which at least one type of arylene group and at least one type of divalent heterocyclic group are bonded directly to each other represented by $Ar^{X2}$ and $Ar^{X4}$ includes, for example, groups represented by the following formulae, the foregoing groups each optionally having a substituent.

[Chemical Formula 38]

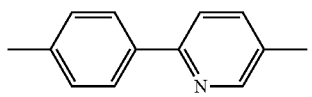

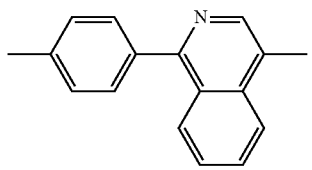

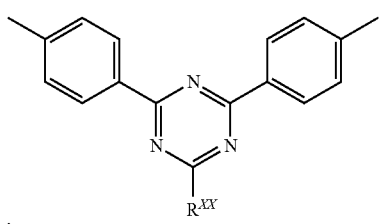

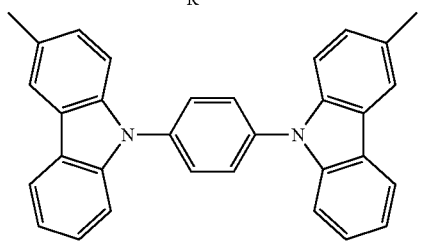

[wherein, $R^{XX}$ represents a hydrogen atom, an alkyl group, a cycloalkyl group, an aryl group or a monovalent heterocyclic group, the foregoing groups each optionally having a substituent.]

$R^{XX}$ is preferably an alkyl group, a cycloalkyl group or an aryl group, the foregoing groups each optionally having a substituent.

$Ar^{X2}$ and $Ar^{X4}$ are preferably an arylene group optionally having a substituent.

The substituent which the group represented by $Ar^{X1}$ to $Ar^{X4}$ and $R^{X1}$ to $R^{X3}$ optionally has is preferably an alkyl group, a cycloalkyl group or an aryl group, the foregoing groups each optionally further having a substituent.

The constitutional unit represented by the formula (X) is preferably a constitutional unit represented by the formula (X-1) to (X-7), more preferably a constitutional unit represented by the formula (X-3) to (X-7), further preferably a constitutional unit represented by the formula (X-3) to (X-6).

[Chemical Formula 39]

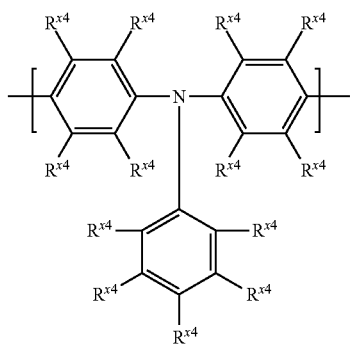

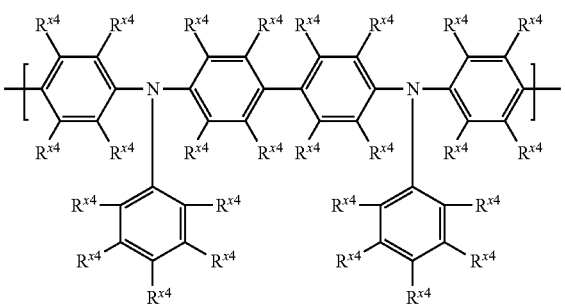

[Chemical Formula 40]

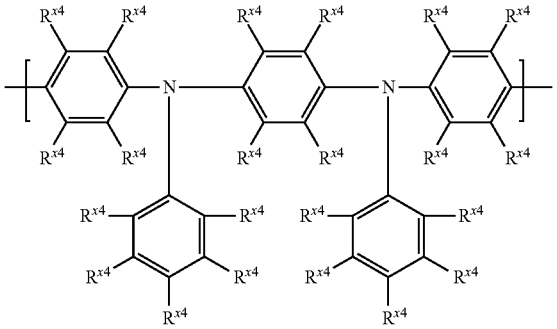

-continued

[Chemical Formula 41]

(X-4)
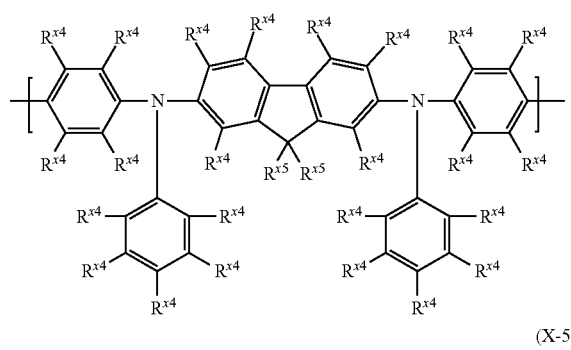

(X-5)
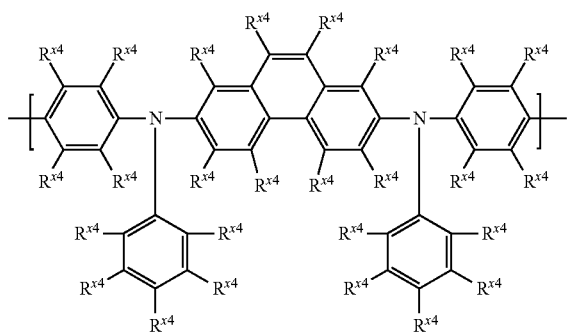

[Chemical Formula 42]

(X-6)
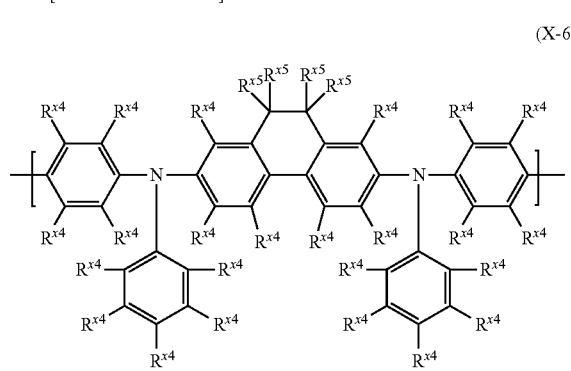

(X-7)
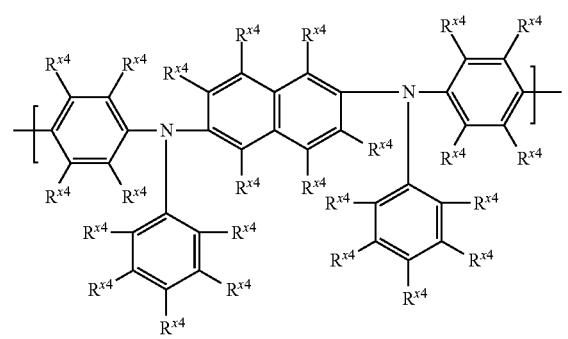

[wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent heterocyclic group or a cyano group, the foregoing groups each optionally having a substituent. The plurality of $R^{X4}$ may be the same or different. The plurality of $R^{X5}$ may be the same or different, and adjacent groups $R^{X5}$ may be combined together to form a ring together with the carbon atoms to which they are attached.]

The constitutional unit represented by the formula (X) is preferably 0.1 to 90 mol %, more preferably 1 to 70 mol %, further preferably 5 to 50 mol % with respect to the total amount of constitutional units contained in the polymer compound, because hole transportability is excellent.

The constitutional unit represented by the formula (X) includes, for example, constitutional units represented by the formulae (X1-1) to (X1-19), preferably constitutional units represented by the formulae (X1-6) to (X1-14).

[Chemical Formula 43]

(X1-1)
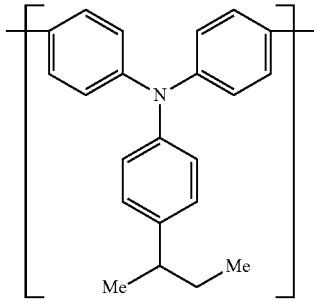

(X1-2)
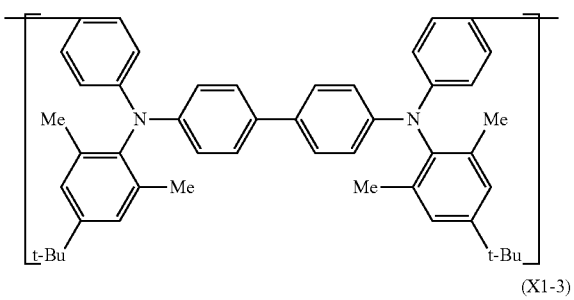

(X1-3)
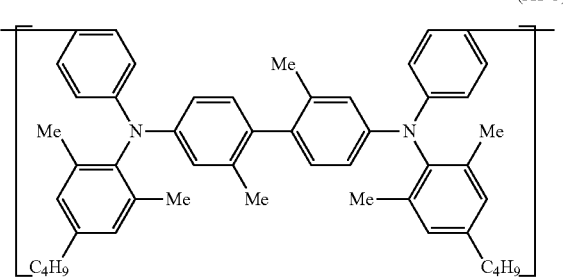

[Chemical Formula 44]

(X1-4)
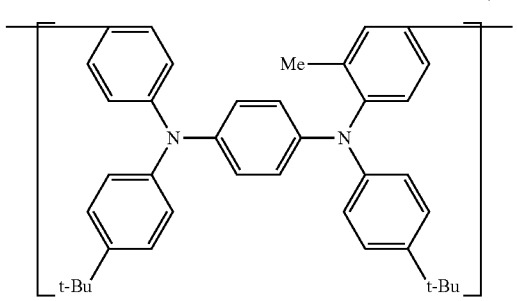

(X1-5)
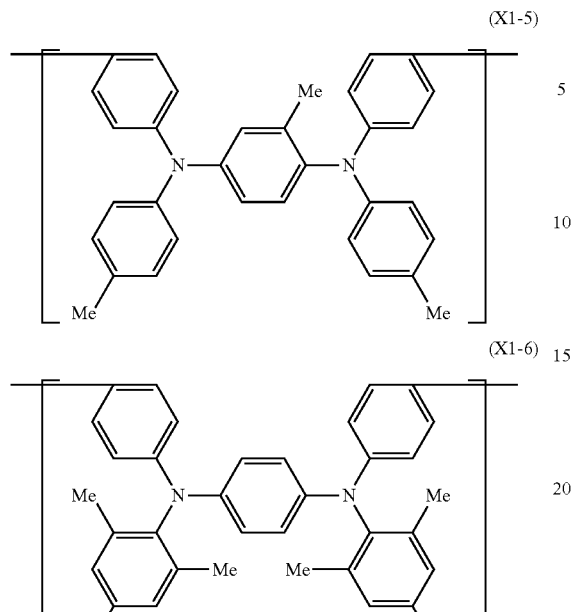
(X1-6)
[Chemical Formula 45]
(X1-7)
(X1-8)
[Chemical Formula 46]
(X1-9)
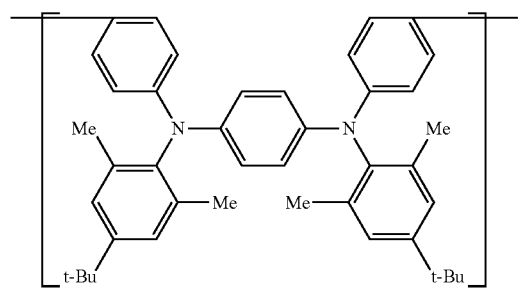
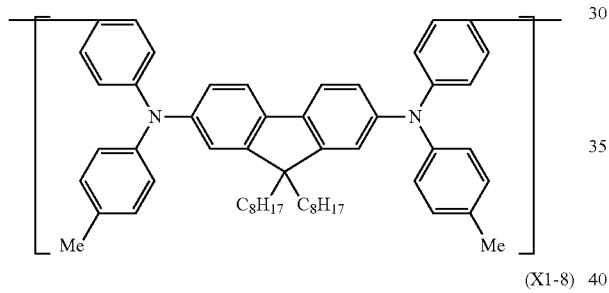
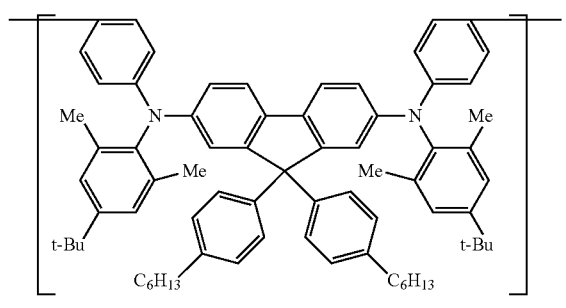
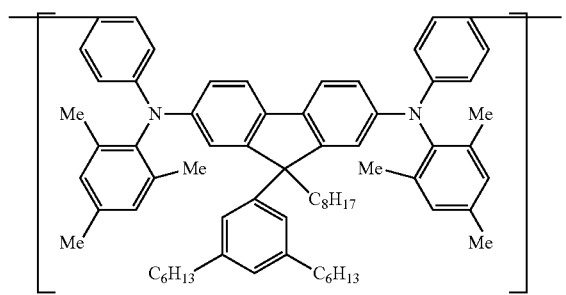
(X1-10)
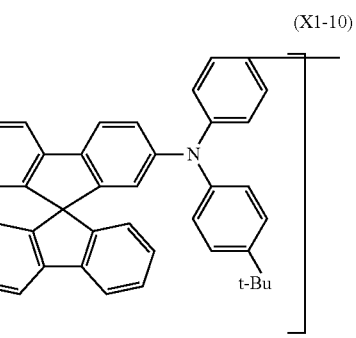
[Chemical Formula 47]
(X1-11)
(X1-12)
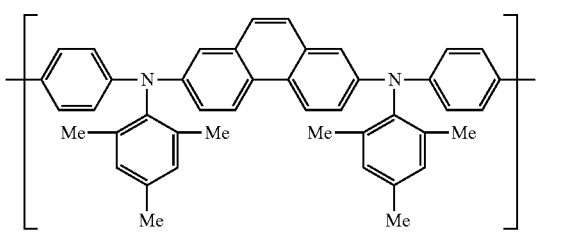
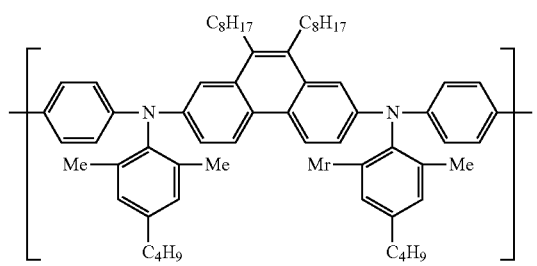
[Chemical Formula 48]
(X1-13)
(X1-14)
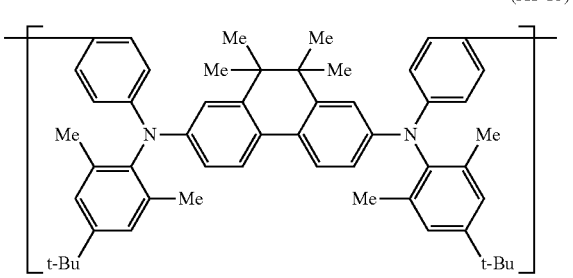
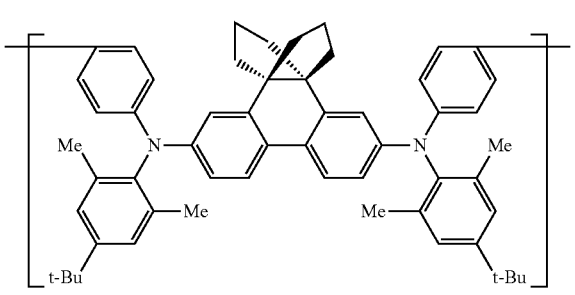

[Chemical Formula 49]

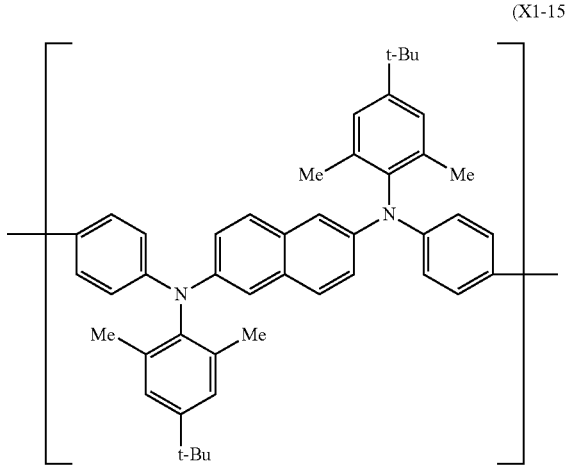
(X1-15)

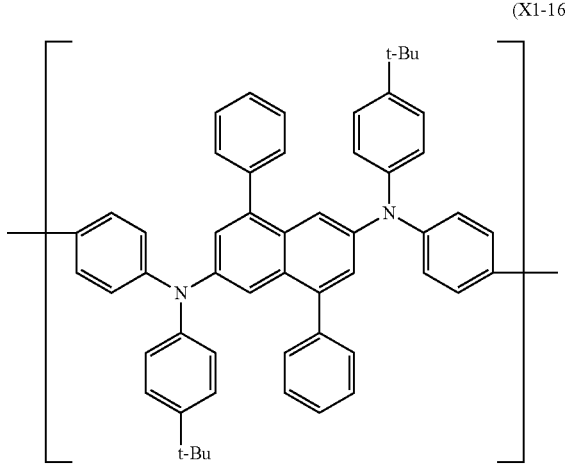
(X1-16)

[Chemical Formula 50]

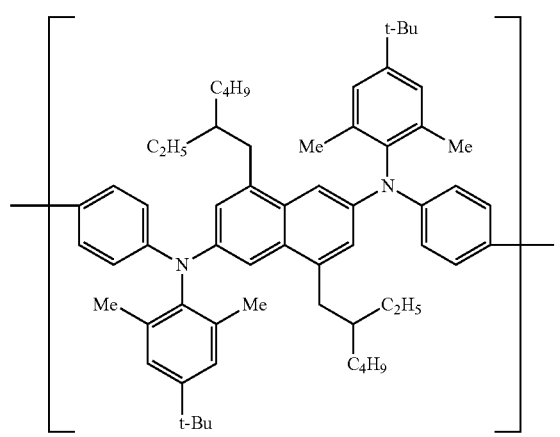
(X1-17)

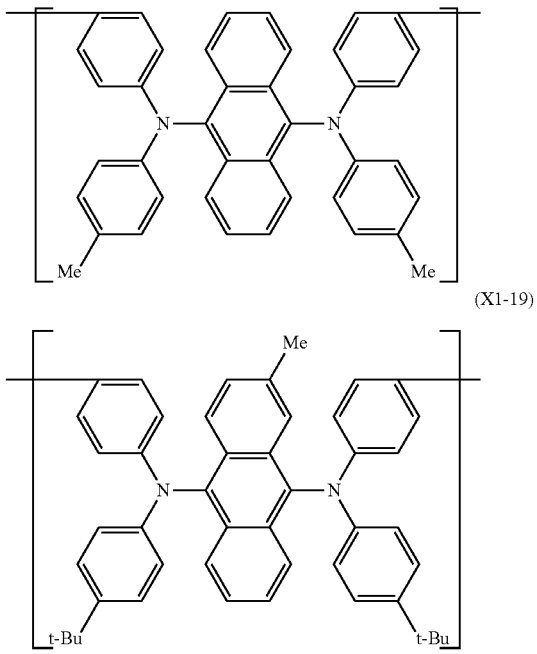
(X1-18)
(X1-19)

The constitutional unit represented by the formula (X) may be contained only singly or two or more units thereof may be contained in the polymer compound of the present invention.

It is preferable that the polymer compound of the present invention further comprises a constitutional unit represented by the formula (Y), because the luminance life of a light emitting device produced by using the polymer compound of the present invention is excellent.

It is preferable that the polymer compound of the present invention further comprises a constitutional unit represented by the formula (X) and a constitutional unit represented by the formula (Y), because the light emission efficiency of a light emitting device produced by using the polymer compound of the present invention is excellent.

The arylene group represented by $Ar^{Y1}$ is more preferably a group represented by the formula (A-1), the formula (A-6), the formula (A-7), the formula (A-9) to (A-11), the formula (A-13) or the formula (A-19), further preferably a group represented by the formula (A-1), the formula (A-7), the formula (A-9) or the formula (A-19), the foregoing groups each optionally having a substituent.

The divalent heterocyclic group represented by $Ar^{Y1}$ is more preferably a group represented by the formula (AA-4), the formula (AA-10), the formula (AA-13), the formula (AA-15), the formula (AA-18) or the formula (AA-20), further preferably a group represented by the formula (AA-4), the formula (AA-10), the formula (AA-18) or the formula (AA-20), the foregoing groups each optionally having a substituent.

The more preferable range and the further preferable range of the arylene group and the divalent heterocyclic group in the divalent group in which at least one type of arylene group and at least one type of divalent heterocyclic group are bonded directly to each other represented by $Ar^{Y1}$ are the same as the more preferable range and the further preferable range of the arylene group and the divalent heterocyclic group represented by Ar$^{Y1}$, respectively.

The divalent group in which at least one type of arylene group and at least one type of divalent heterocyclic group are bonded directly to each other represented by Ar$^{Y1}$ includes the same groups as the divalent group in which at least one type of arylene group and at least one type of divalent heterocyclic group are bonded directly to each other represented by Ar$^{X2}$ and Ar$^{X4}$ in the formula (X).

The substituent which the group represented by Ar$^{Y1}$ optionally has is preferably an alkyl group, a cycloalkyl group or an aryl group, the foregoing groups each optionally further having a substituent.

The constitutional unit represented by the formula (Y) includes, for example, constitutional units represented by the formulae (Y-1) to (Y-7), and from the standpoint of the luminance life of a light emitting device produced by using the polymer compound of the present invention preferable is a constitutional unit represented by the formula (Y-1) or (Y-2), from the standpoint of electron transportability preferable is a constitutional unit represented by the formula (Y-3) or (Y-4), and from the standpoint of hole transportability preferable are constitutional units represented by the formulae (Y-5) to (Y-7).

[Chemical Formula 51]

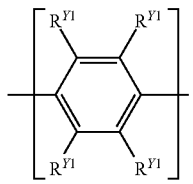

(Y-1)

[wherein, R$^{Y1}$ represents a hydrogen atom, an alkyl group, a cycloalkyl group, an alkoxyl group, a cycloalkoxy group, an aryl group or a monovalent heterocyclic group, the foregoing groups each optionally having a substituent. The plurality of R$^{Y1}$ may be the same or different, and adjacent groups R$^{Y1}$ may be combined together to form a ring together with the carbon atoms to which they are attached.]

R$^{Y1}$ is preferably a hydrogen atom, an alkyl group, a cycloalkyl group or an aryl group, the foregoing groups each optionally having a substituent.

The constitutional unit represented by the formula (Y-1) is preferably a constitutional unit represented by the formula (Y-1').

[Chemical Formula 52]

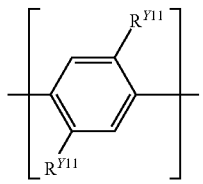

(Y-1')

[wherein, R$^{Y11}$ represents an alkyl group, a cycloalkyl group, an alkoxy group, a cycloalkoxy group, an aryl group or a monovalent heterocyclic group, the foregoing groups each optionally having a substituent. The plurality of R$^{Y11}$ may be the same or different.]

R$^{Y11}$ is preferably an alkyl group, a cycloalkyl group or an aryl group, more preferably an alkyl group or a cycloalkyl group, the foregoing groups each optionally having a substituent.

[Chemical Formula 53]

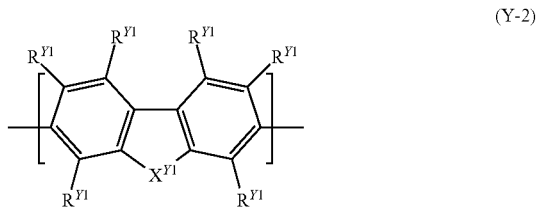

(Y-2)

[wherein, R$^{Y1}$ represents the same meaning as described above. X$^{Y1}$ represents a group represented by —C(R$^{Y2}$)$_2$—, —C(R$^{Y2}$)=C(R$^{Y2}$)— or —C(R$^{Y2}$)$_2$—C(R$^{Y2}$)$_2$—. R$^{Y2}$ represents a hydrogen atom, an alkyl group, a cycloalkyl group, an alkoxyl group, a cycloalkoxy group, an aryl group or a monovalent heterocyclic group, the foregoing groups each optionally having a substituent. The plurality of R$^{Y2}$ may be the same or different, and R$^{Y2}$s may be combined together to form a ring together with the carbon atoms to which they are attached.]

R$^{Y2}$ is preferably an alkyl group, a cycloalkyl group, an aryl group or a monovalent heterocyclic group, more preferably an alkyl group a cycloalkyl group or an aryl group, the foregoing groups each optionally having a substituent.

Regarding the combination of two R$^{Y2}$s in the group represented by —C(R$^{Y2}$)$_2$— in X$^{Y1}$—, it is preferable that the both are an alkyl group or a cycloalkyl group, the both are an aryl group, the both are a monovalent heterocyclic group, or one is an alkyl group or a cycloalkyl group and the other is an aryl group or a monovalent heterocyclic group, it is more preferable that one is an alkyl group or cycloalkyl group and the other is an aryl group, the foregoing groups each optionally having a substituent. The two groups may be combined together to form a ring together with the atoms to which they are attached, and when the groups R$^{Y2}$ form a ring, the group represented by —C(R$^{Y2}$)$_2$— is preferably a group represented by the formula (Y-A1) to (Y-A5), more preferably a group represented by the formula (Y-A4), the foregoing groups each optionally having a substituent.

[Chemical Formula 54]

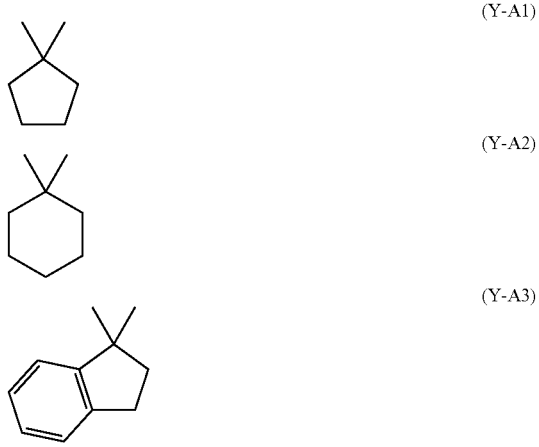

(Y-A1)

(Y-A2)

(Y-A3)

-continued

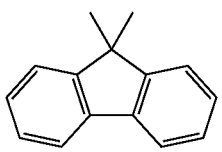
(Y-A4)

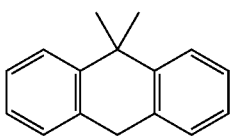
(Y-A5)

Regarding the combination of two $R^{Y2}$s in the group represented by —C($R^{Y2}$)=C($R^{Y2}$)— in $X^{Y1}$, it is preferable that the both are an alkyl group or cycloalkyl group, or one is an alkyl group or a cycloalkyl group and the other is an aryl group, the foregoing groups each optionally having a substituent.

Four $R^{Y2}$s in the group represented by —C($R^{Y2}$)$_2$—C($R^{Y2}$)$_2$— in $X^{Y1}$ are preferably an alkyl group or a cycloalkyl group optionally having a substituent. The plurality of $R^{Y2}$ may be combined together to form a ring together with the atoms to which they are attached, and when the groups $R^{Y2}$ form a ring, the group represented by —C($R^{Y2}$)$_2$—C($R^{Y2}$)$_2$— is preferably a group represented by the formula (Y-B1) to (Y-B5), more preferably a group represented by the formula (Y-B3), the foregoing groups each optionally having a substituent.

[Chemical Formula 55]

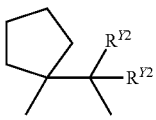
(Y-B1)

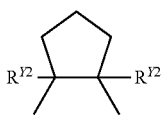
(Y-B2)

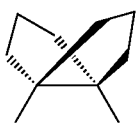
(Y-B3)

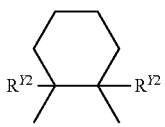
(Y-B4)

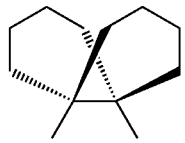
(Y-B5)

[wherein, $R^{Y2}$ are as defined above.]

It is preferable that the constitutional unit represented by the formula (Y-2) a constitutional unit represented by the formula (Y-2').

[Chemical Formula 56]

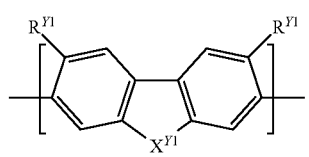
(Y-2')

[wherein, $R^{Y1}$ and $X^{Y1}$ are as defined above.]

[Chemical Formula 57]

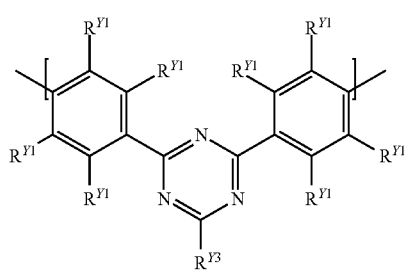
(Y-3)

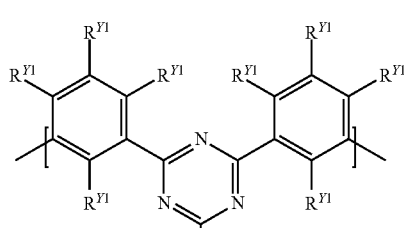
(Y-4)

[wherein, $R^{Y1}$ represents the same meaning as described above. $R^{Y3}$ represents a hydrogen atom, an alkyl group, a cycloalkyl group, an alkoxy group, a cycloalkoxy group, an aryl group or a monovalent heterocyclic group, the foregoing groups each optionally having a substituent.]

$R^{Y3}$ is preferably an alkyl group, a cycloalkyl group, an alkoxy group, a cycloalkoxy group, an aryl group or a monovalent heterocyclic group, more preferably an aryl group, the foregoing groups each optionally having a substituent.

[Chemical Formula 58]

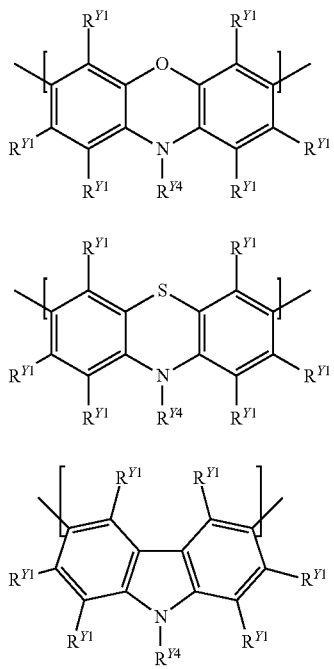

(Y-5)
(Y-6)
(Y-7)

[wherein, $R^{Y1}$ represents the same meaning as described above. $R^{Y4}$ represents a hydrogen atom, an alkyl group, a cycloalkyl group, an alkoxy group, a cycloalkoxy group, an aryl group or a monovalent heterocyclic group, the foregoing groups each optionally having a substituent.]

$R^{Y4}$ is preferably an alkyl group, a cycloalkyl group, an alkoxy group, a cycloalkoxy group, an aryl group or a monovalent heterocyclic group, more preferably an aryl group, the foregoing groups each optionally having a substituent.

The constitutional unit represented by the formula (Y) includes, for example, constitutional units represented by the formulae (Y-11) to (Y-55).

[Chemical Formula 59]

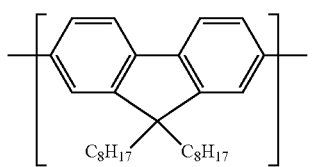

(Y-11)

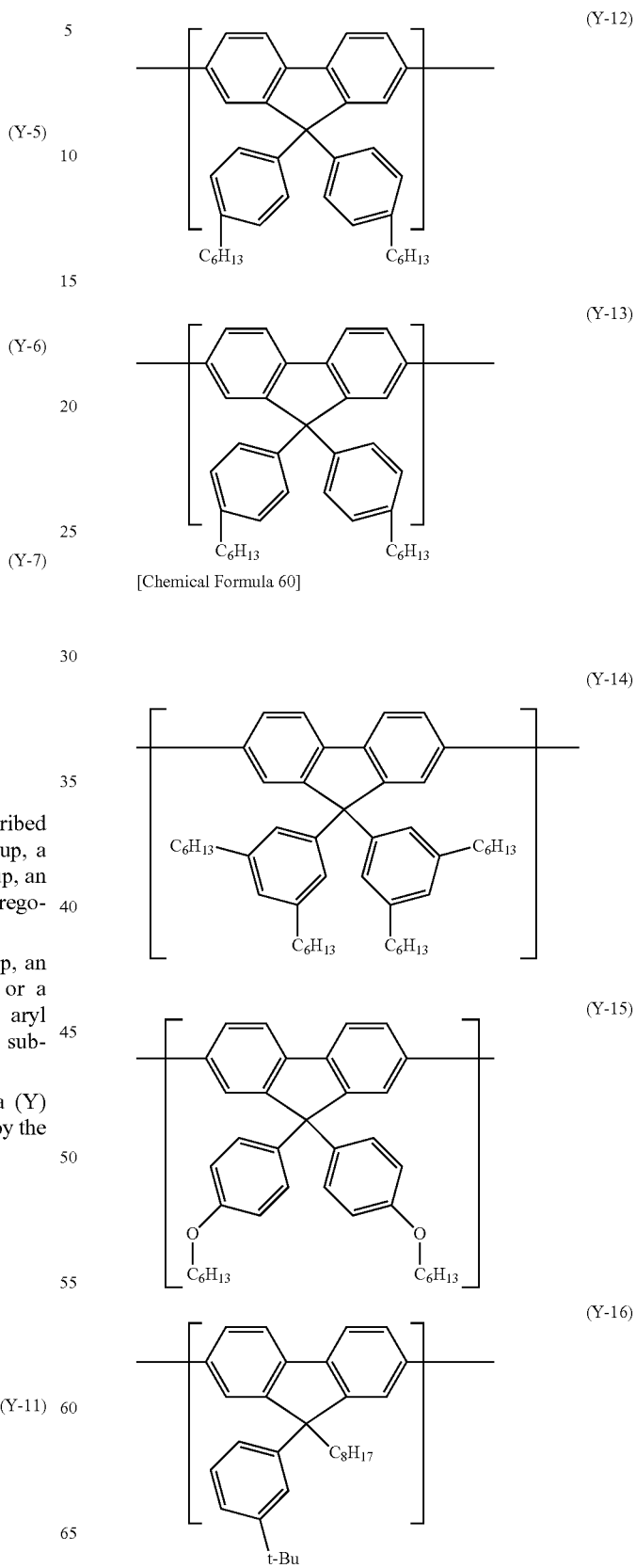

(Y-12)
(Y-13)

[Chemical Formula 60]

(Y-14)
(Y-15)
(Y-16)

[Chemical Formula 61]
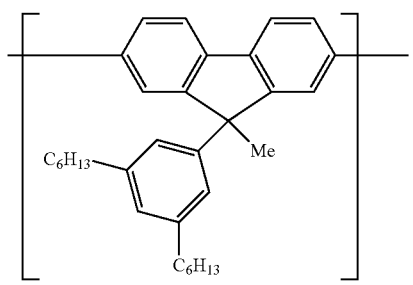 (Y-17)
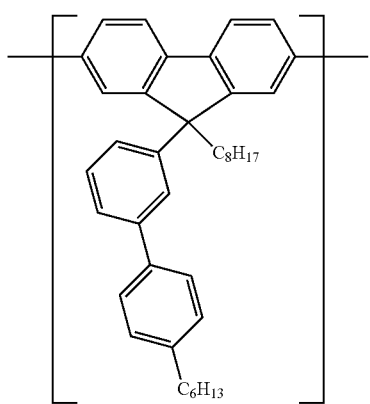 (Y-18)
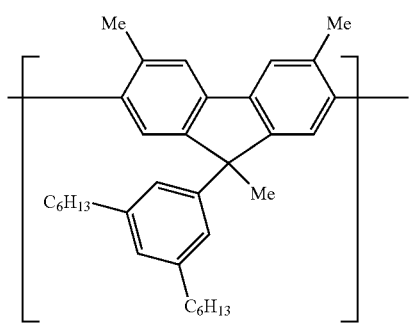 (Y-19)
[Chemical Formula 62]
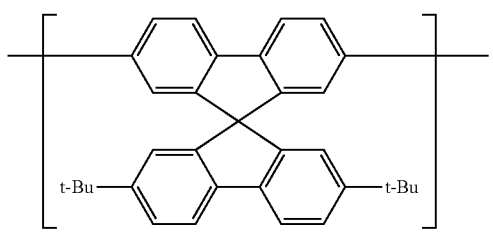 (Y-20)
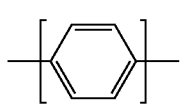 (Y-21)
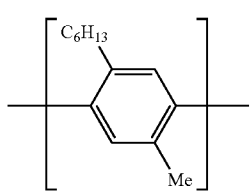 (Y-22)
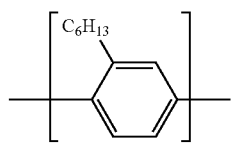 (Y-23)
[Chemical Formula 63]
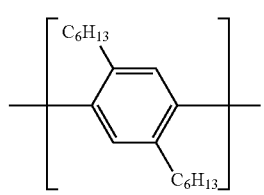 (Y-24)
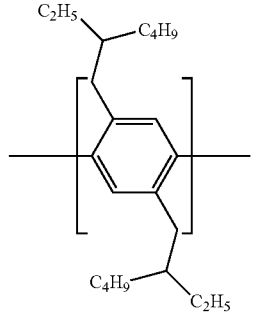 (Y-25)
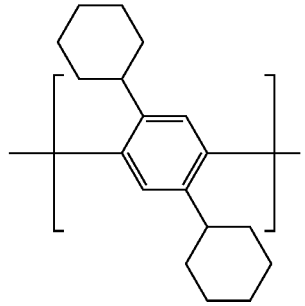 (Y-26)
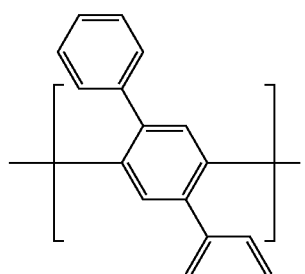 (Y-27)
[Chemical Formula 64]
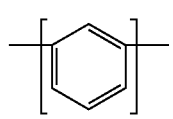 (Y-28)

[Chemical Formula 65]
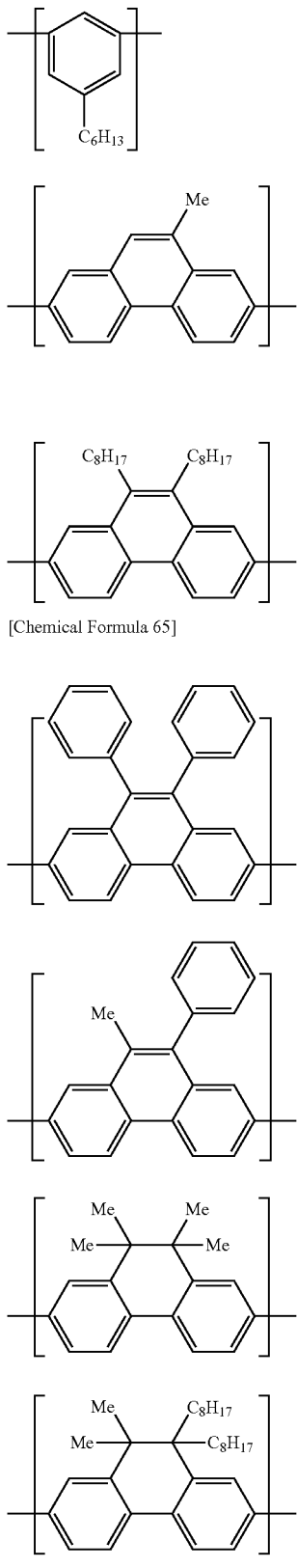
[Chemical Formula 66]
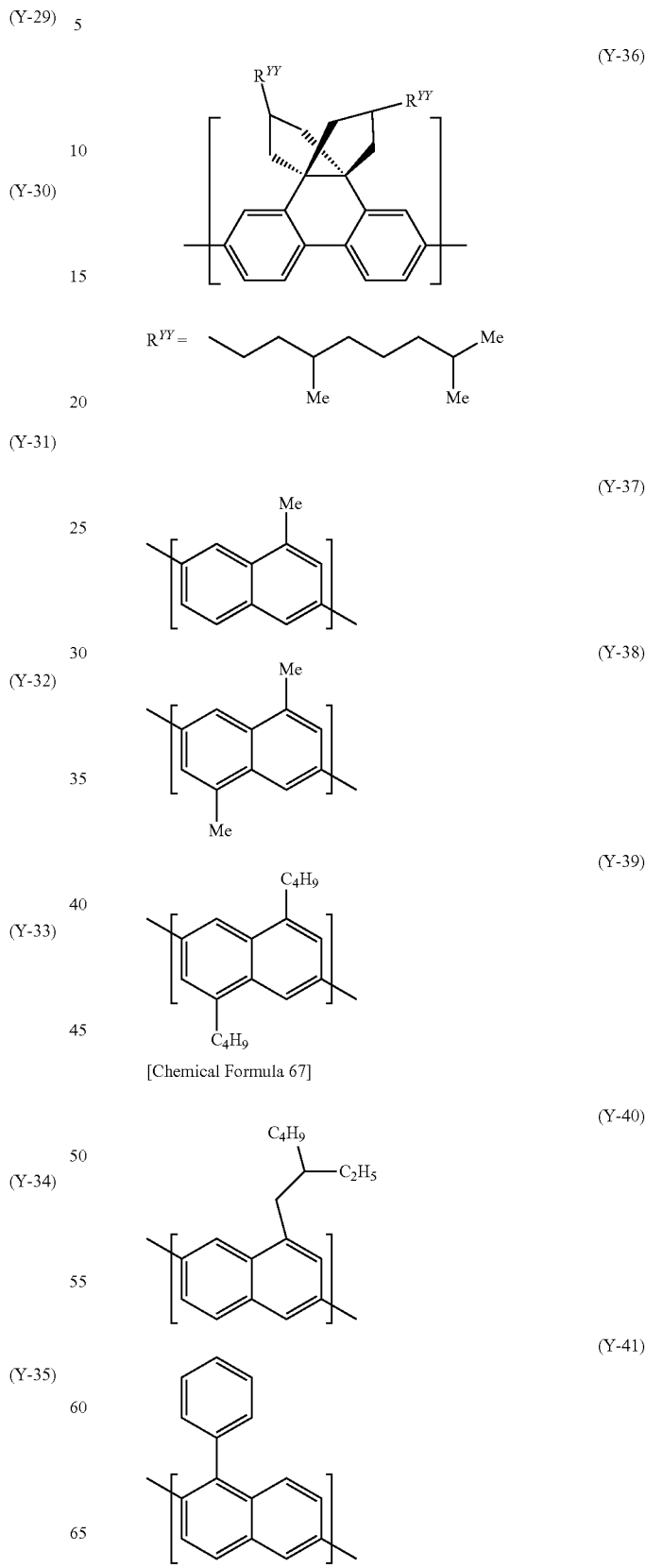
[Chemical Formula 67]

-continued
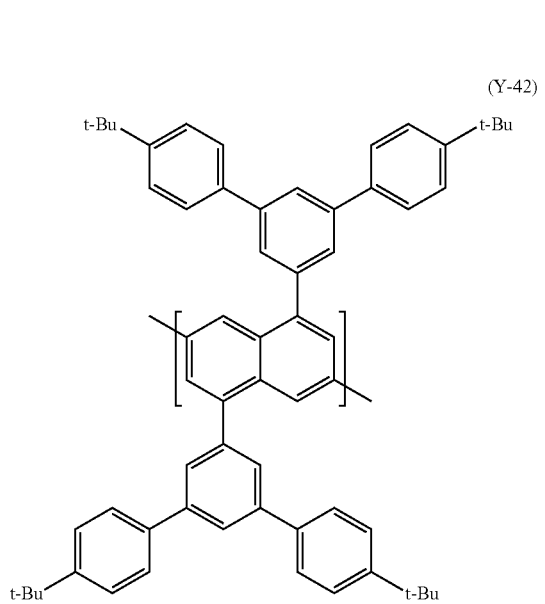
(Y-42)
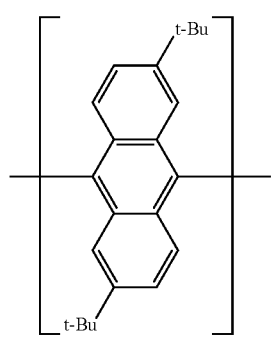
(Y-43)
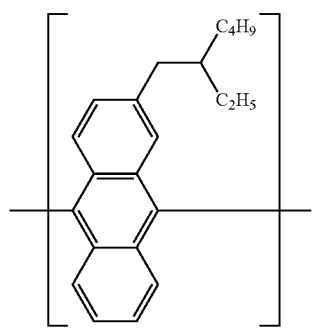
(Y-44)
[Chemical Fromula 68]
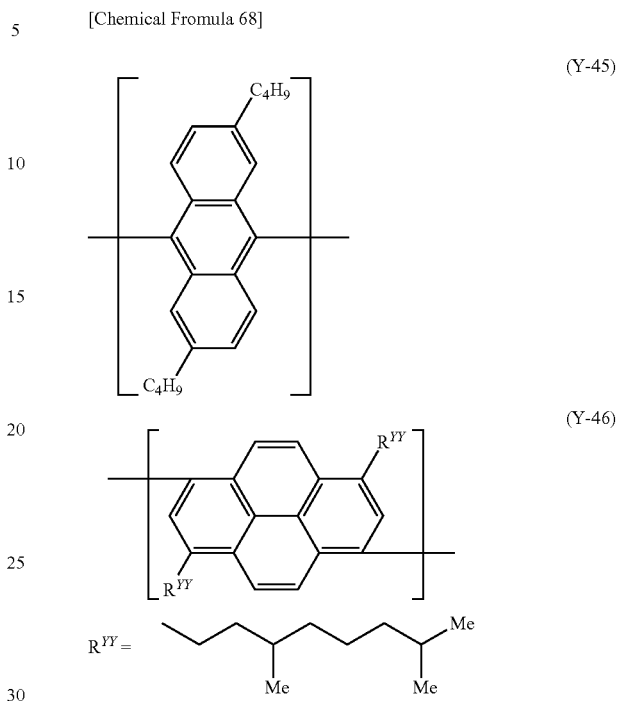
(Y-45)
(Y-46)
[Chemical Formula 69]
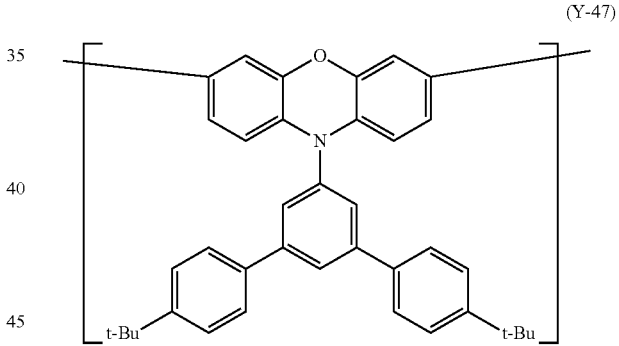
(Y-47)
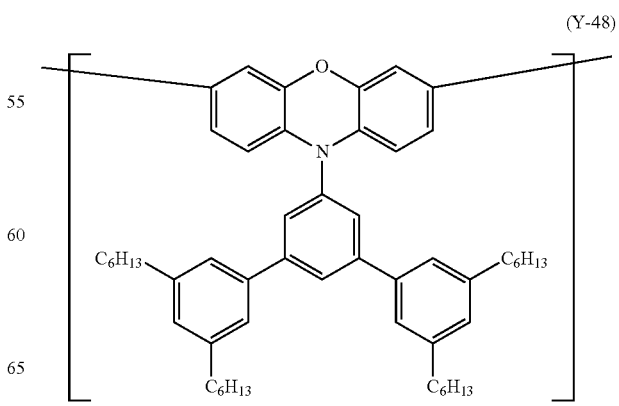
(Y-48)

(Y-49)
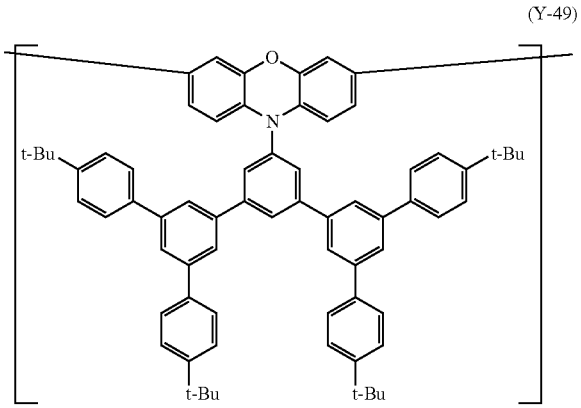

[Chemical Formula 70]

(Y-50)
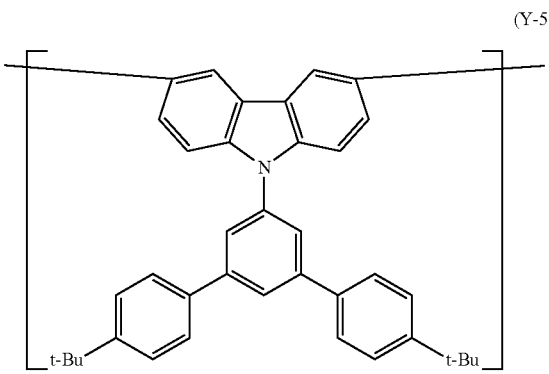

(Y-51)
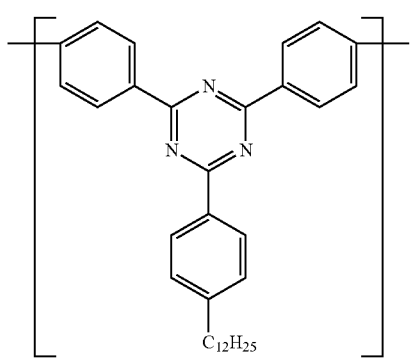

(Y-52)
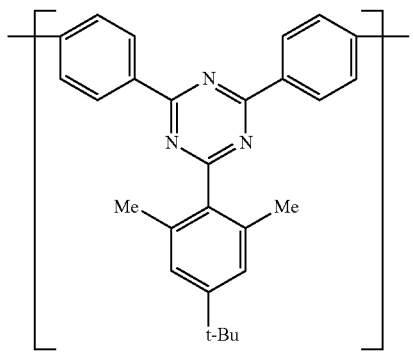

[Chemical Formula 71]

(Y-53)
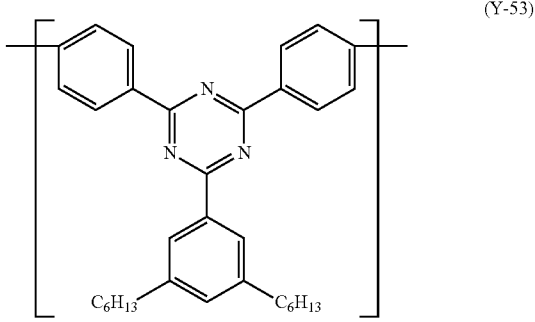

(Y-54)
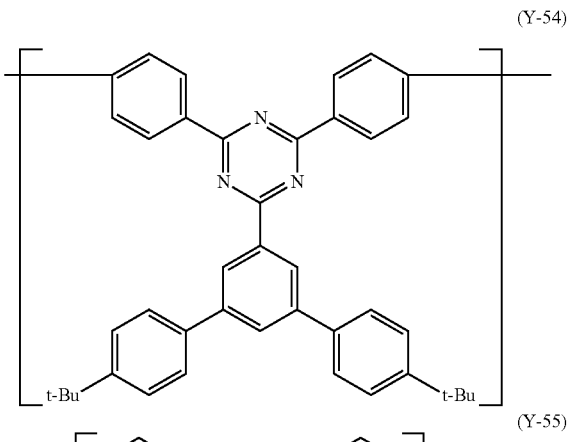

(Y-55)
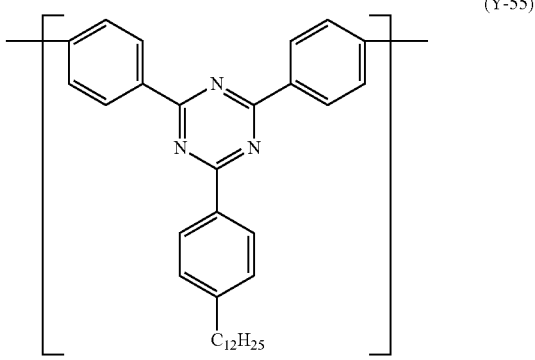

The constitutional unit represented by the formula (Y) in which $Ar^{Y1}$ is an arylene group is preferably 0.5 to 80 mol %, more preferably 30 to 60 mol % with respect to the total amount of constitutional units contained in the polymer compound, because the luminance life of a light emitting device produced by using the polymer compound of the present invention is excellent.

The constitutional unit represented by the formula (Y) in which $Ar^{Y1}$ is a divalent heterocyclic group or a divalent group in which at least one type of arylene group and at least one type of divalent heterocyclic group are bonded directly to each other is preferably 0.5 to 30 mol %, more preferably 3 to 40 mol % with respect to the total amount of constitutional units contained in the polymer compound, because the charge transportability of a light emitting device produced by using the polymer compound of the present invention is excellent.

The constitutional unit represented by the formula (Y) may be contained only singly or two or more units thereof may be contained in the polymer compound.

The polymer compound of the present invention includes, for example, polymer compounds P-1 to P-9 shown in Table 5. "other constitutional unit" denotes a constitutional unit other than constitutional units represented by the formula (2), the formula (2'), the formula (X) and the formula (Y). The polymer compound P-1 to P-9 comprises at least one terminal constitutional unit represented by the formula (1).

TABLE 5

| Polymer compound | Molar ration of constitutional unit other than terminal constitutional unit | | | | |
|---|---|---|---|---|---|
| | formula (2) q | formula (2') r | formula (X) s | formula (Y) t | others u |
| P-1 | 0.1 to 99.9 | 0 | 0.1 to 99.9 | 0 | 0 to 30 |
| P-2 | 0 | 0.1 to 99.9 | 0.1 to 99.9 | 0 | 0 to 30 |
| P-3 | 0.1 to 99.8 | 0.1 to 99.8 | 0.1 to 99.8 | 0 | 0 to 30 |
| P-4 | 0.1 to 99.9 | 0 | 0 | 0.1 to 99.9 | 0 to 30 |
| P-5 | 0 | 0.1 to 99.9 | 0 | 0.1 to 99.9 | 0 to 30 |
| P-6 | 0.1 to 99.8 | 0.1 to 99.8 | 0 | 0.1 to 99.8 | 0 to 30 |
| P-7 | 0.1 to 99.8 | 0 | 0.1 to 99.8 | 0.1 to 99.8 | 0 to 30 |
| P-8 | 0 | 0.1 to 99.8 | 0.1 to 99.8 | 0.1 to 99.8 | 0 to 30 |
| P-9 | 0.1 to 99.7 | 0.1 to 99.7 | 0.1 to 99.7 | 0.1 to 99.7 | 0 to 30 |

[in the table, q, r, s, t, and u represent the mole fraction of each constitutional unit. q+r+s+t+u=100 and, 70≤q+r+s+t≤100.]

The examples and preferable ranges of constitutional units represented by the formula (2), formula (2'), the formula (X) and the formula (Y) in polymer compounds P-1 to P-9 are as described above.

The polymer compound of the present invention may be any of a block copolymer, a random copolymer, an alternative copolymer and a graft copolymer, and may also be other embodiment, and a copolymer produced by copolymerizing a several raw material monomers preferable.

<Production Method of Polymer Compound>

Next, the production method of the polymer compound of the present invention will be illustrated.

The polymer compound of the present invention can be produced by a method comprising a step of condensation-polymerizing at least one type of compound selected from the group consisting of a compound represented by the formula (2M) and a compound represented by the formula (2'M), and a step of end capping with a compound represented by the formula (1M).

In the step of condensation-polymerizing, at least one type of compound selected from the group consisting of a compound represented by the formula (2M) and a compound represented by the formula (2'M), and the other compound (for example, a compound represented by the formula (M-1) and/or a compound represented by the formula (M-2)) may be condensation-polymerized. In the present specification, compounds used for production of the polymer compound of the present invention are collectively called "raw material monomer" in some cases.

In the production method of the polymer compound of the present invention, the step of condensation-polymerizing at least one type of compound selected from the group consisting of a compound represented by the formula (2M) and a compound represented by the formula (2'M) may be conducted before carrying out the step of end capping with a compound represented by the formula (1M), or the step of condensation-polymerizing at least one type of compound selected from the group consisting of a compound represented by the formula (2M) and a compound represented by the formula (2'M) and the step of end capping with a compound represented by the formula (1M) may be conducted simultaneously, and it is preferable that the step of condensation-polymerizing at least one type of compound selected from the group consisting of a compound represented by the formula (2M) and a compound represented by the formula (2'M) is conducted, then, the step of end capping with a compound represented by the formula (1M) is conducted.

[Chemical Formula 72]

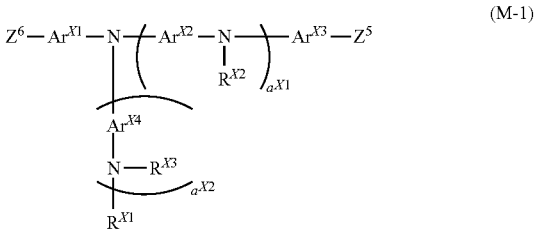

(M-1)

[Chemical Formula 73]

$$Z^8—Ar^{Y1}—Z^7 \quad (M-2)$$

[wherein, $a^{X1}$, $a^{X2}$, $Ar^{X1}$ to $Ar^{X4}$, $R^{X1}$ to $R^{X3}$ and $Ar^{Y1}$ are as defined above.

$Z^5$ to $Z^8$ each independently represent a group selected from Group A of substituents or a group selected from Group B of substituents.]

When, for example, $Z^7$ and $Z^8$ represent a group selected from Group A of substituents, a group selected from Group B of substituents is selected for $Z^1$, $Z^2$, $Z^4$, $Z^5$ and $Z^6$.

When, for example, $Z^5$ and $Z^6$ represent a group selected from Group A of substituents, a group selected from Group B of substituents is selected for $Z^1$, $Z^2$, $Z^3$, $Z^4$, $Z^7$ and $Z^8$.

When, for example, $Z^7$ and $Z^8$ represent a group selected from Group B of substituents, a group selected from Group A of substituents is selected for $Z^1$, $Z^2$, $Z^3$, $Z^4$, $Z^5$ and $Z^6$.

When, for example, $Z^5$ and $Z^6$ represent a group selected from Group B of substituents, a group selected from Group A of substituents is selected for $Z^1$, $Z^2$, $Z^3$, $Z^4$, $Z^7$ and $Z^8$.

When the content of a group selected from Group A of substituents contained in the polymer compound obtained until before the step of end capping with a compound represented by the formula (1M) is larger than the content of a group selected from Group B of substituents, it is preferable that $Z^T$ is a group selected from Group B of substituents.

When the content of a group selected from Group B of substituents contained in the polymer compound obtained until before the step of end capping with a compound represented by the formula (1M) is larger than the content of a group selected from Group A of substituents, it is preferable that $Z^T$ is a group selected from Group A of substituents.

As the group represented by -B(OR$^{C2}$)$_2$ in <Group B of substituents>, groups represented by the following formulae are exemplified.

[Chemical Formula 74]

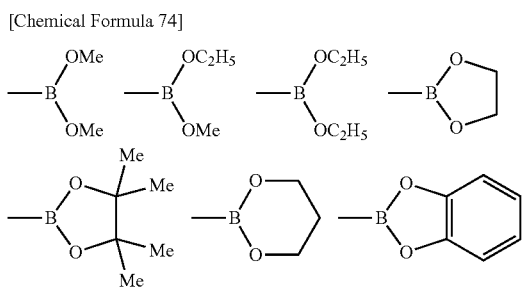

A compound having a group selected from Group A of substituents and a compound having a group selected from Group B of substituents are condensed by a known coupling reaction, to mutually connect carbon atoms linking to a group selected from Group A of substituents and a group selected from Group B of substituents.

Therefore, if a compound having two groups selected from Group A of substituents and a compound having two groups selected from Group B of substituents are subjected to a known coupling reaction, a condensed polymer of these compounds can be obtained by condensation polymerization.

Further, if a compound having two groups selected from Group A of substituent (the polymer compound obtained until before the step of end capping) and a compound having one group selected from Group B of substituent (the compound represented by the formula (1M)) are subjected to a known coupling reaction, a condensed polymer of these compounds can be obtained by condensation (end capping). Still further, if a compound having one group selected from Group A of substituent (the compound represented by the formula (1M)) and a compound having two groups selected from Group B of substituent (the polymer compound obtained until before the step of end capping) are subjected to a known coupling reaction, a condensed polymer of these compounds can be obtained by condensation (end capping).

Condensation polymerization and end capping are usually conducted in the presence of a catalyst, a base and a solvent, and if necessary, may be conducted in the coexistence of a phase transfer catalyst.

The catalyst includes, for example, transition metal complexes such as palladium complexes such as dichlorobis(triphenylphosphine)palladium, dichlorobis(tris-o-methoxyphenylphosphine)palladium, palladium[tetrakis(triphenylphosphine)], [tris(dibenzylideneacetone)]dipalladium and palladium acetate, nickel complexes such as nickel[tetrakis(triphenylphosphine)], [1,3-bis(diphenylphosphino)propane]dichloronickel and [bis(1,4-cyclooctadiene)]nickel; these transition metal complexes further having a ligand such as triphenylphosphine, tri-o-tolylphosphine, tri-tert-butylphosphine, tricyclohexylphosphine, diphenylphosphinopropane, bipyridyl and the like. The catalysts may be used singly or in combination.

The use amount of the catalyst is usually 0.00001 to 3 molar equivalents in terms of the amount of a transition metal with respect to the total number of moles of raw material monomers (the total number of moles of raw material monomers used in condensation polymerization and raw material monomers used in end capping). In the step of end capping, the catalyst may be additionally used.

The base and the phase transfer catalyst include, for example, inorganic bases such as sodium carbonate, potassium carbonate, cesium carbonate, potassium fluoride, cesium fluoride and tripotassium phosphate; organic bases such as tetrabutylammonium fluoride and tetrabutylammonium hydroxide; and phase transfer catalysts such as tetrabutylammonium chloride and tetrabutylammonium bromide. The bases and the phase transfer catalysts each may be used singly or in combination.

The use amounts of the base and the phase transfer catalyst are each usually 0.001 to 100 molar equivalents with respect to the total number of moles of raw material monomers (the total number of moles of raw material monomers used in condensation polymerization and raw material monomers used in end capping). In the step of end capping, the base may be additionally used, and the phase transfer catalyst may be additionally used.

The solvent includes, for example, organic solvents such as toluene, xylene, mesitylene, tetrahydrofuran, 1,4-dioxane, dimethoxyethane, N,N-dimethylacetamide and N,N-dimethylformamide, and water. The solvent may be used singly or two or moresolvents may be used in combination.

The use amount of the solvent is usually 10 to 100000 parts by weight with respect to 100 parts by weigh of the sum of raw material monomers (100 parts by weight of the sum of raw material monomers used in condensation polymerization and raw material monomers used in end capping). In the step of end capping, the solvent may be additionally used.

The reaction temperature of condensation polymerization and end capping is usually −100 to 200° C. The reaction time of condensation polymerization and end capping is usually 1 hour or more.

Post-treatment of the polymerization reaction (treatment after condensation polymerization and end capping) is carried out by known methods, for example, a method of removing water-soluble impurities by liquid separation, a method in which the reaction liquid after the polymerization reaction is added to a lower alcohol such as methanol and the like to cause deposition of a precipitate which is then filtrated before drying, and the like, singly or in combination. When the purity of the polymer compound is low, the polymer compound can be purified by a usual method such as, for example, recrystallization, reprecipitation, continuous extraction with a Soxhlet extractor, column chromatography and the like.

The compound represented by the formula (1M) can be synthesized according to a method described, for example, in "Macromolecular Chemistry and Physics (1999), 200(4), 683-692", "Advanced Synthesis & Catalysis (2014), 356, (4), 765-769", "Journal of the American Chemical Society (2014), 136, (6), 2546-2554", "Organic & Biomolecular Chemistry (2014), 12, (7), 1124-1134." and "Tetrahedron (1965), 21, (2), 245-254".

<Composition>

The composition of the present invention comprises at least one type of material selected from the group consisting of a hole transporting material, a hole injection material, an electron transporting material, an electron injection material, a light emitting material, an antioxidant and a solvent and the polymer compound of the present invention.

The composition comprising the polymer compound of the present invention and a solvent (hereinafter, referred to as "ink" in some cases) is suitable for fabrication of a light emitting device using a printing method such as an inkjet printing method and a nozzle printing method.

The viscosity of the ink may be adjusted depending on the kind of the printing method, and when a solution goes through a discharge apparatus such as in an inkjet printing method, the viscosity is preferably in the range of 1 to 20 mPa·s at 25° C. for preventing curved aviation and clogging in discharging.

As the solvent contained in the ink, those capable of dissolving or uniformly dispersing solid components in the ink are preferable. The solvent includes, for example, chlorine-based solvents such as 1,2-dichloroethane, 1,1,2-trichloroethane, chlorobenzene and o-dichlorobenzene; ether solvents such as tetrahydrofuran, dioxane, anisole and 4-methylanisole; aromatic hydrocarbon solvents such as toluene, xylene, mesitylene, ethylbenzene, n-hexylbenzene and cyclohexylbenzene; aliphatic hydrocarbon solvents such as cyclohexane, methylcyclohexane, n-pentane, n-hexane, n-heptane, n-octane, n-nonane, n-decane, n-dodecane and bicyclohexyl; ketone solvents such as acetone, methylethylketone, cyclohexanone and acetophenone; ester solvents such as ethyl acetate, butyl acetate, ethylcellosolve acetate, methyl benzoate and phenyl acetate; poly-hydric alcohols such as ethylene glycol, glycerin and 1,2-hexanediol and derivatives thereof; alcohol solvents such as isopropanol and cyclohexanol; sulfoxide solvents such as dimethyl sulfoxide; and amide solvents such as N-methyl-2-pyrrolidone and N,N-dimethylformamide. These solvents may be used singly or two or more of them may be used in combination.

In the ink, the compounding amount of the solvent is usually 1000 to 100000 parts by weight, preferably 2000 to 20000 parts by weight with respect to 100 parts by weight of the polymer compound of the present invention.

[Hole Transporting Material]

The hole transporting material is classified into low molecular weight compounds and polymer compounds, and polymer compounds are preferable, polymer compounds having a crosslinkable group are more preferable.

The polymer compound includes, for example, polyvinylcarbazole and derivatives thereof; polyarylene having an aromatic amine structure in the side chain or main chain and derivatives thereof. The polymer compound may also be a compound in which an electron accepting portion is linked. The electron accepting portion includes, for example, fullerene, tetrafluorotetracyanoquinodimethane, tetracyanoethylene and trinitrofluorenone, preferably fullerene.

In the composition of the present invention, the compounding amount of the hole transporting material is usually 1 to 400 parts by weight, preferably 5 to 150 parts by weight with respect to 100 parts by weight of the polymer compound of the present invention.

The hole transporting material may be used singly or two or more hole transporting materials may be used in combination.

[Electron Transporting Material]

The electron transporting material is classified into low molecular weight compounds and polymer compounds. The electron transporting material optionally has a crosslinkable group.

The low molecular weight compound includes, for example, a metal complexes having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene, diphenoquinone and derivatives thereof.

The polymer compound includes, for example, polyphenylene, polyfluorene and derivatives thereof. These polymer compounds may be doped with a metal.

In the composition of the present invention, the compounding amount of the electron transporting material is usually 1 to 400 parts by weight, preferably 5 to 150 parts by weight with respect to 100 parts by weight of the polymer compound of the present invention.

The electron transporting material may be used singly or two or more electron transporting materials may be used in combination.

[Hole Injection Material and Electron Injection Material]

The hole injection material and the electron injection material are each classified into low molecular weight compounds and polymer compounds. The hole injection material and the electron injection material each optionally has a crosslinkable group.

The low molecular weight compound includes, for example, metal phthalocyanines such as copper phthalocyanine; carbon; oxides of metals such as molybdenum and tungsten; metal fluorides such as lithium fluoride, sodium fluoride, cesium fluoride and potassium fluoride.

The polymer compound includes, for example, polyaniline, polythiophene, polypyrrole, polyphenylenevinylene, polythienylenevinylene, polyquinoline and polyquinoxaline, and derivatives thereof; electrically conductive polymers such as a polymer comprising an aromatic amine structure in the main chain or side chain.

In the composition of the present invention, the compounding amounts of the hole injection material and the electron injection material are each usually 1 to 400 parts by weight, preferably 5 to 150 parts by weight with respect to 100 parts by weight of the polymer compound of the present invention.

The hole injection material and the electron injection material may each be used singly or two or more of them may be used in combination.

[Ion Dope]

When the hole injection material or the electron injection material comprises an electrically conductive polymer, the electric conductivity of the electrically conductive polymer is preferably $1 \times 10^{-5}$ S/cm to $1 \times 10^{3}$ S/cm. For adjusting the electric conductivity of the electrically conductive polymer within such a range, the electrically conductive polymer can be doped with a suitable amount of ions.

The kind of the ion to be doped is an anion for a hole injection material and a cation for an electron injection material. The anion includes, for example, a polystyrenesulfonate ion, an alkylbenzenesulfonate ion and a camphorsulfonate ion. The cation includes, for example, a lithium ion, a sodium ion, a potassium ion and a tetrabutylammonium ion.

The ion to be doped may be used singly or two or more ions to be doped may be used.

[Light Emitting Material]

The light emitting material is classified into low molecular weight compounds and polymer compounds. The light emitting material optionally has a crosslinkable group.

The low molecular weight compound includes, for example, naphthalene and derivatives thereof, anthracene and derivatives thereof, perylene and derivatives thereof, and, triplet light emitting complexes having iridium, platinum or europium as the central metal.

The polymer compound includes, for example, polymer compounds comprising a phenylene group, a naphthalenediyl group, a fluorenediyl group, a phenanthrenediyl group, dihydrophenanthrenediyl group, a group represented by the formula (X), a carbazolediyl group, a phenoxazinediyl group, a phenothiazinediyl group, an anthracenediyl group, a pyrenediyl group and the like.

The light emitting material may comprise a low molecular weight compound and a polymer compound, and preferably, comprises a triplet light emitting complex and a polymer compound.

As the triplet light emitting complex, iridium complexes represented by the formulae Ir-1 to Ir-5 are preferable.

[Chemical Formula 75]

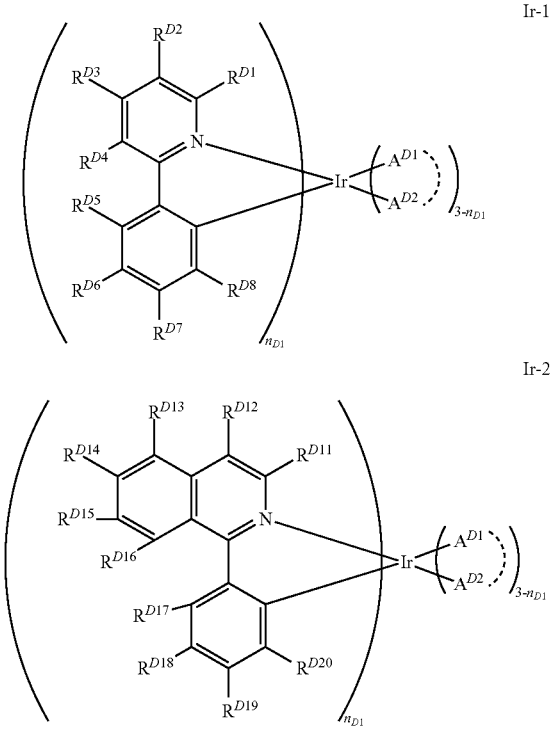

[Chemical Formula 76]

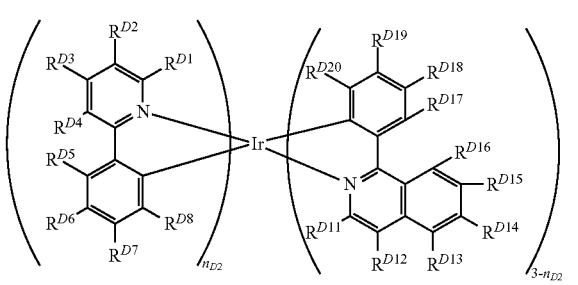

[Chemical Formula 77]

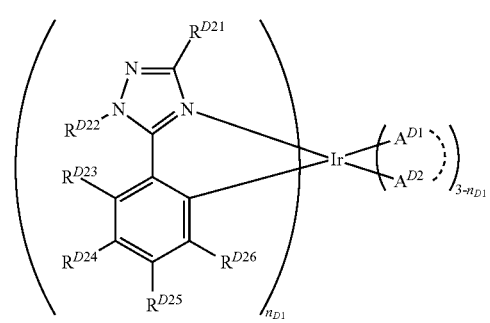

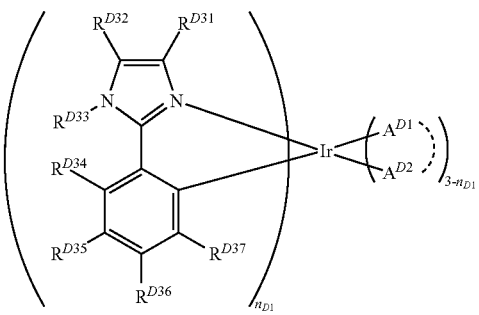

[Wherein, $R^{D1}$ to $R^{D8}$, $R^{D11}$ to $R^{D20}$, $R^{D21}$ to $R^{D26}$ and $R^{D31}$ to $R^{D37}$ each independently represent a hydrogen atom, an alkyl group, a cycloalkyl group, an alkoxy group, a cycloalkoxy group, an aryl group, an aryloxy group, a monovalent heterocyclic group or a halogen atom, the foregoing groups each optionally having a substituent. When there are a plurality of $R^{D1}$ to $R^{D8}$, $R^{D11}$ to $R^{D20}$, $R^{D21}$ to $R^{D26}$ and $R^{D31}$ to $R^{D37}$, they may be the same or different at each occurrence.

-$A^{D1}$ - - - $A^{D2}$- represents an anionic bidentate ligand, and $A^{D1}$ and $A^{D2}$ each independently represent a carbon atom, an oxygen atom or a nitrogen atom linking to an iridium atom, and these atoms each may be an atom consisting a ring. When there are a plurality of -$A^{D1}$ - - - $A^{D2}$-, they may be the same or different.

$n_{D1}$ represents 1, 2 or 3, and $n_{D2}$ represents 1 or 2.]

In the metal complex represented by the Ir-1, at least one of $R^{D1}$ to $R^{D8}$ is preferably a group represented by the formula (D-A).

In the metal complex represented by the Ir-2, at least one of $R^{D11}$ to $R^{D20}$ is preferably a group represented by the formula (D-A).

In the metal complex represented by the Ir-3, at least one of $R^{D1}$ to $R^{D8}$ and $R^{D11}$ to $R^{D20}$ is preferably a group represented by the formula (D-A).

In the metal complex represented by the Ir-4, at least one of $R^{D21}$ to $R^{D26}$ is preferably a group represented by the formula (D-A).

In the metal complex represented by the Ir-5, at least one of $R^{D31}$ to $R^{D37}$ is preferably a group represented by the formula (D-A).

[Chemical Formula 78]

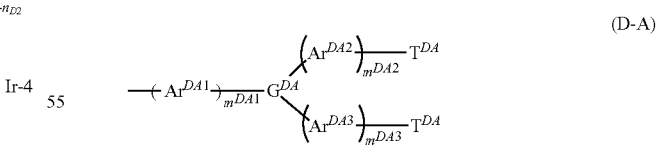

(D-A)

[wherein, $m^{DA1}$, $m^{DA2}$ and $m^{DA3}$ each independently represent an integer of 0 or more.

$G^{DA}$ represents a nitrogen atom, an aromatic hydrocarbon group or a heterocyclic group, the foregoing groups each optionally having a substituent.

$Ar^{DA1}$, $Ar^{DA2}$ and $Ar^{DA3}$ each independently represent an arylene group or a divalent heterocyclic group, the foregoing groups each optionally having a substituent. When there are a plurality of Ar$^{DA1}$, Ar$^{DA2}$ or Ar$^{DA3}$, they may be the same or different at each occurrence.

T$^{DA}$ represents an aryl group or a monovalent heterocyclic group, the foregoing groups each optionally having a substituent. The plurality of T$^{DA}$ may be the same or different.]

m$^{DA1}$, m$^{DA2}$ and m$^{DA3}$ are usually an integer of 10 or m less, preferably an integer of 5 or less, more preferably 0 or 1. It is preferable that m$^{DA1}$, m$^{DA2}$ and m$^{DA3}$ are the same integer.

G$^{DA1}$ is preferably a group represented by the formula (GDA-11) to (GDA-15), the foregoing groups each optionally having a substituent.

[Chemical Formula 79]

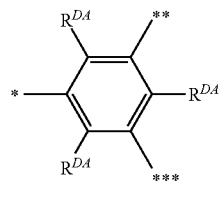
(GDA-11)

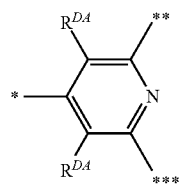
(GDA-12)

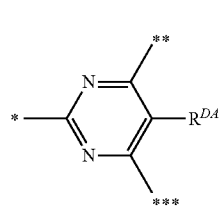
(GDA-13)

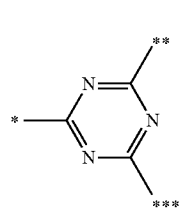
(GDA-14)

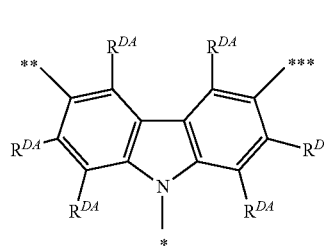
(GDA-15)

[wherein,

*,  and * each represent a linkage to Ar$^{DA1}$, AR$^{DA2}$ and Ar$^{DA3}$.

R$^{DA}$ represents a hydrogen atom, an alkyl group, a cycloalkyl group, an alkoxy group, a cycloalkoxy group, an aryl group or a monovalent heterocyclic group, the foregoing groups each optionally further having a substituent. When there are a plurality of R$^{DA}$, they may be the same or different.]

R$^{DA}$ is preferably a hydrogen atom, an alkyl group, a cycloalkyl group, an alkoxy group or a cycloalkoxy group, more preferably a hydrogen atom, an alkyl group or cycloalkyl group, the foregoing groups each optionally having a substituent.

Ar$^{DA1}$, Ar$^{DA2}$ and Ar$^{DA3}$ are preferably groups represented by the formulae (ArDA-1) to (ArDA-3).

[Chemical Formula 80]

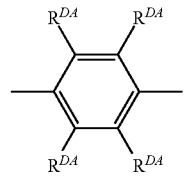
(ArDA-1)

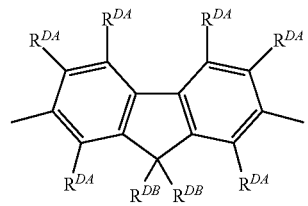
(ArDA-2)

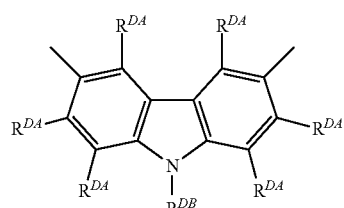
(ArDA-3)

[wherein,

R$^{DA}$ represents as defined above.

R$^{DB}$ represents a hydrogen atom, an alkyl group, a cycloalkyl group, an aryl group or a monovalent heterocyclic group, the foregoing groups each optionally having a substituent. When there are a plurality of R$^{DB}$, they may be the same or different.]

T$^{DA}$ is preferably groups represented by the formulae (TDA-1) to (TDA-3).

[Chemical Formula 81]

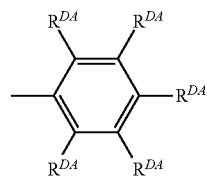
(TDA-1)

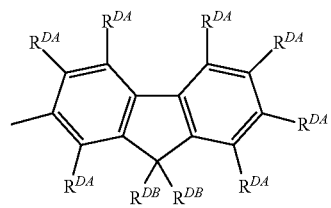
(TDA-2)

(TDA-3)

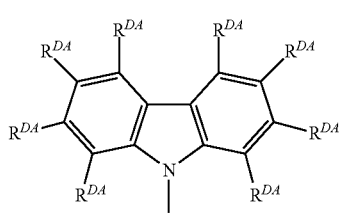

[wherein, $R^{DA}$ and $R^{DB}$ are as defined above.]

The group represented by the formula (D-A) is preferably a group represented by the formula (D-A1) to (D-A3).

[Chemical Formula 82]

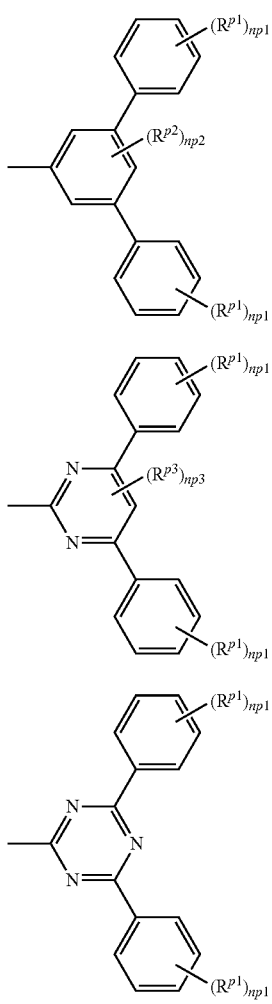

[wherein, $R^{p1}$, $R^{p2}$ and $R^{p3}$ each independently represent an alkyl group, a cycloalkyl group, an alkoxy group, a cycloalkoxy group or a halogen atom. When there are a plurality of $R^{p1}$ or $R^{p2}$, they may be the same or different at each occurrence.

np1 represents an integer of 0 to 5, np2 represents an integer of 0 to 3, and np3 represents 0 or 1. The plurality of np1 may be the same or different.]

np1 is preferably 0 or 1, more preferably 1. np2 is preferably 0 or 1, more preferably 0. np3 is preferably 0.

$R^{p1}$, $R^{p2}$ and $R^{p3}$ are preferably an alkyl group or a cycloalkyl group.

The anionic bidentate ligand represented by $-A^{D1}-A^{D2}-$ includes, for example, ligands represented by the following formulae.

[Chemical Formula 83]

[wherein, * represents a position linking to Ir.]

The metal complex represented by the formula Ir-1 is preferably a metal complex represented by the formula Ir-11 to Ir-13. The metal complex represented by the formula Ir-2 is preferably a metal complex represented by the formula Ir-21. The metal complex represented by the formula Ir-3 is preferably a metal complex represented by the formula Ir-31 to Ir-33. The metal complex represented by the formula Ir-4 is preferably a metal complex represented by the formula Ir-41 to Ir-43. The metal complex represented by the formula Ir-5 is preferably a metal complex represented by the formula Ir-51 to Ir-53.

[Chemical Formula 84]

Ir-11

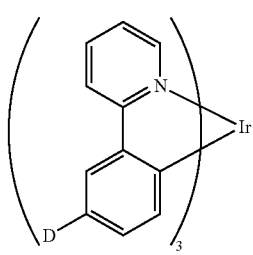

Ir-12
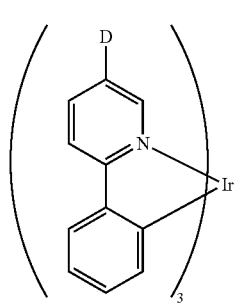
Ir-13
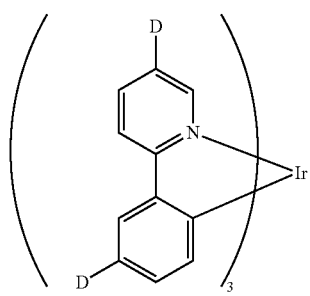
Ir-21
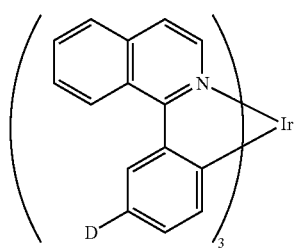
[Chemical Formula 85]
Ir-31
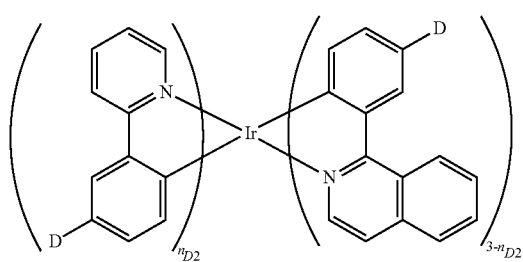
Ir-32
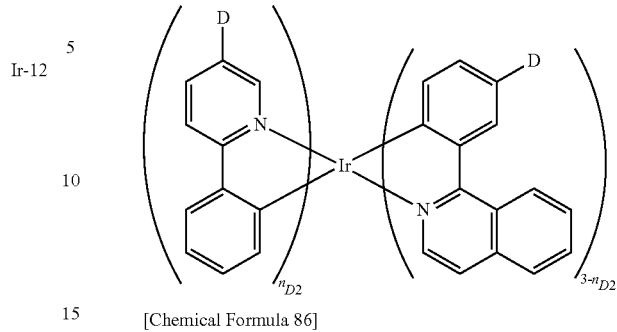
[Chemical Formula 86]
Ir-33
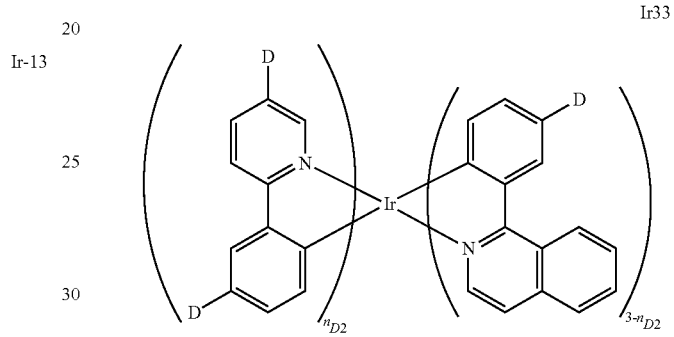
[Chemical Formula 87]
Ir-41
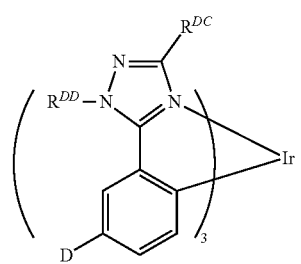
Ir-42
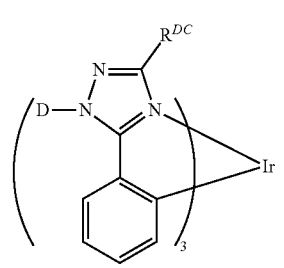

Ir-43

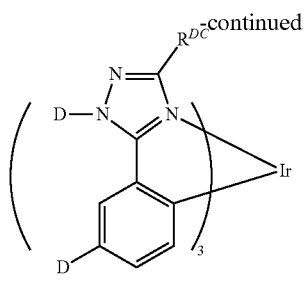

[Chemical Formula 88]

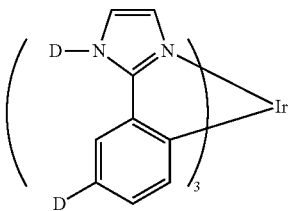
Ir-51

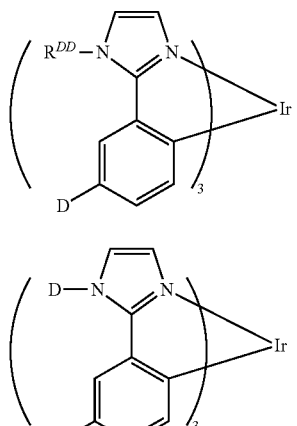
Ir-52

Ir-53

[wherein, D represents a group represented by the formula (D-A). The plurality of D are the same or different. $n_{D2}$ represents 1 or 2. $R^{DC}$ represents a hydrogen atom, an alkyl group, a cycloalkyl group, an aryl group or a monovalent heterocyclic group, the foregoing groups each optionally having a substituent. The plurality of $R^{DC}$ are the same or different. $R^{DD}$ represents an alkyl group, a cycloalkyl group, an aryl group or a monovalent heterocyclic group, the foregoing groups each optionally having a substituent. The plurality of $R^{DD}$ are the same or different.]

The triplet light emitting complex includes, for example, metal complexes listed below.

[Chemical Formula 89]

Ir(ppy)3

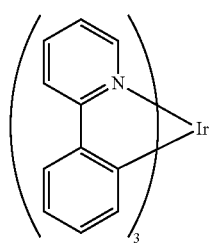

Btp2Ir(acac)

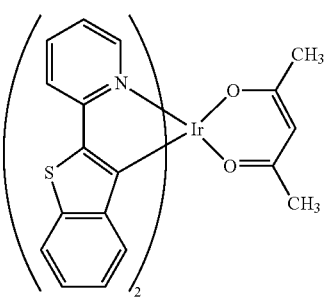

Flrpic
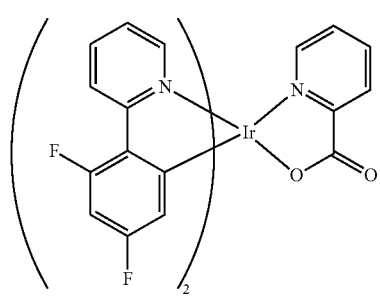
PtOEP
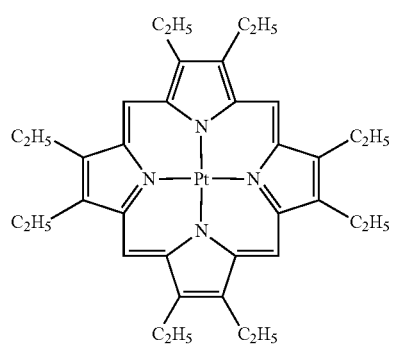
[Chemical Formula 90]
Eu(TTA)3phen
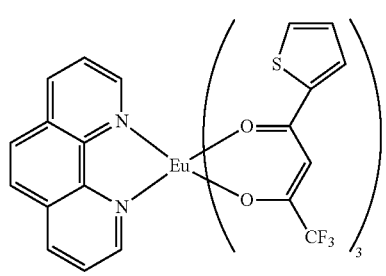
COM-1
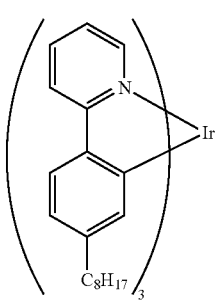
COM-2
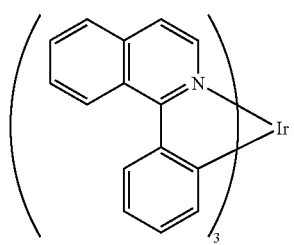
COM-3
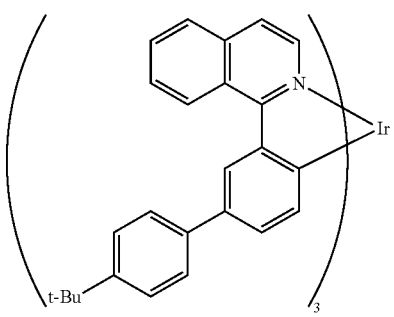
[Chemical Formula 91]
COM-4
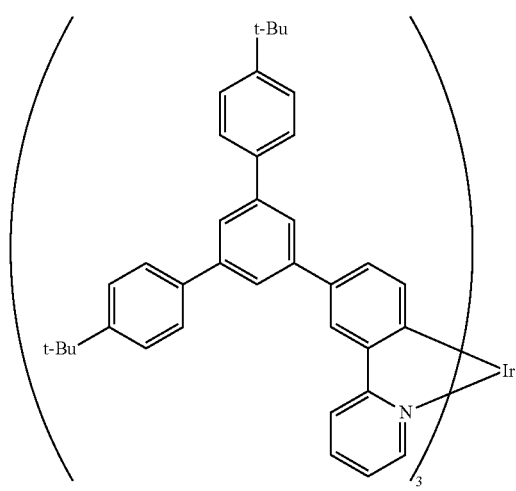
COM-5
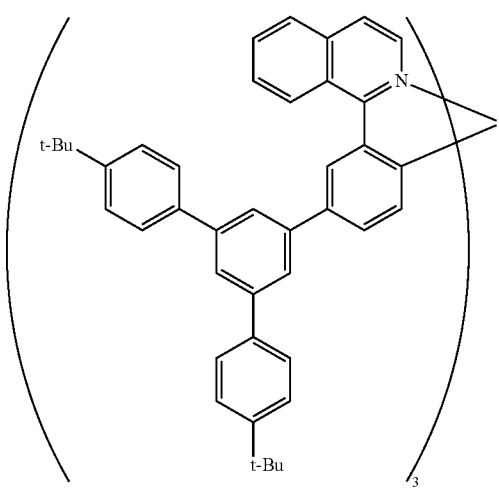

COM-6
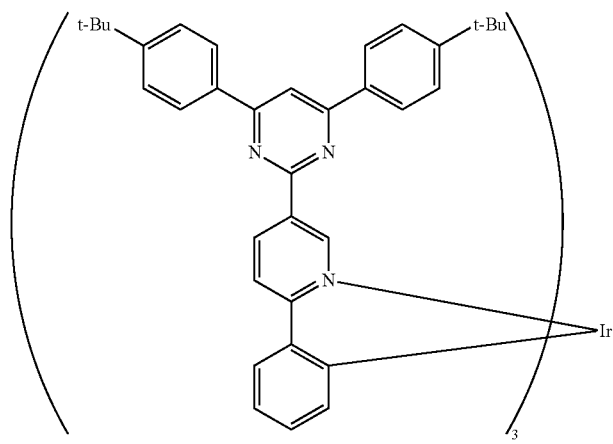
[Chemical Formula 92]
COM-7
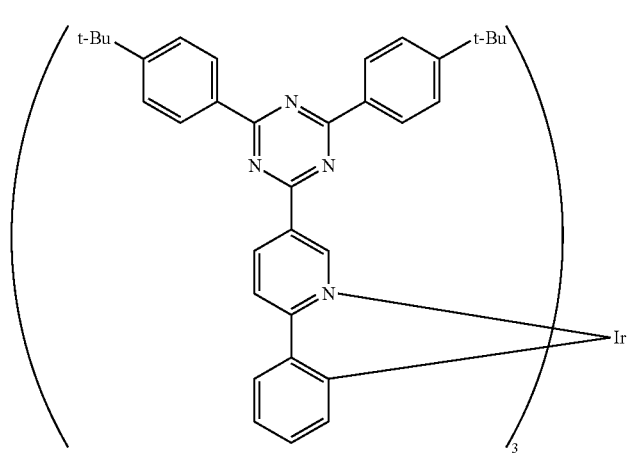
COM-8
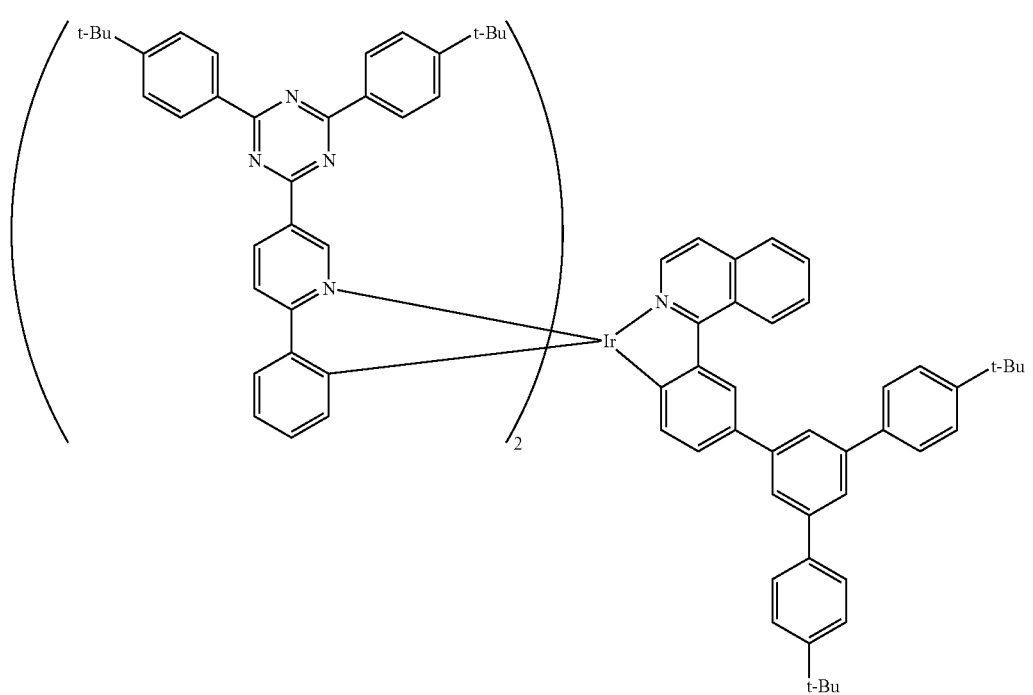

[Chemical Formula 93]
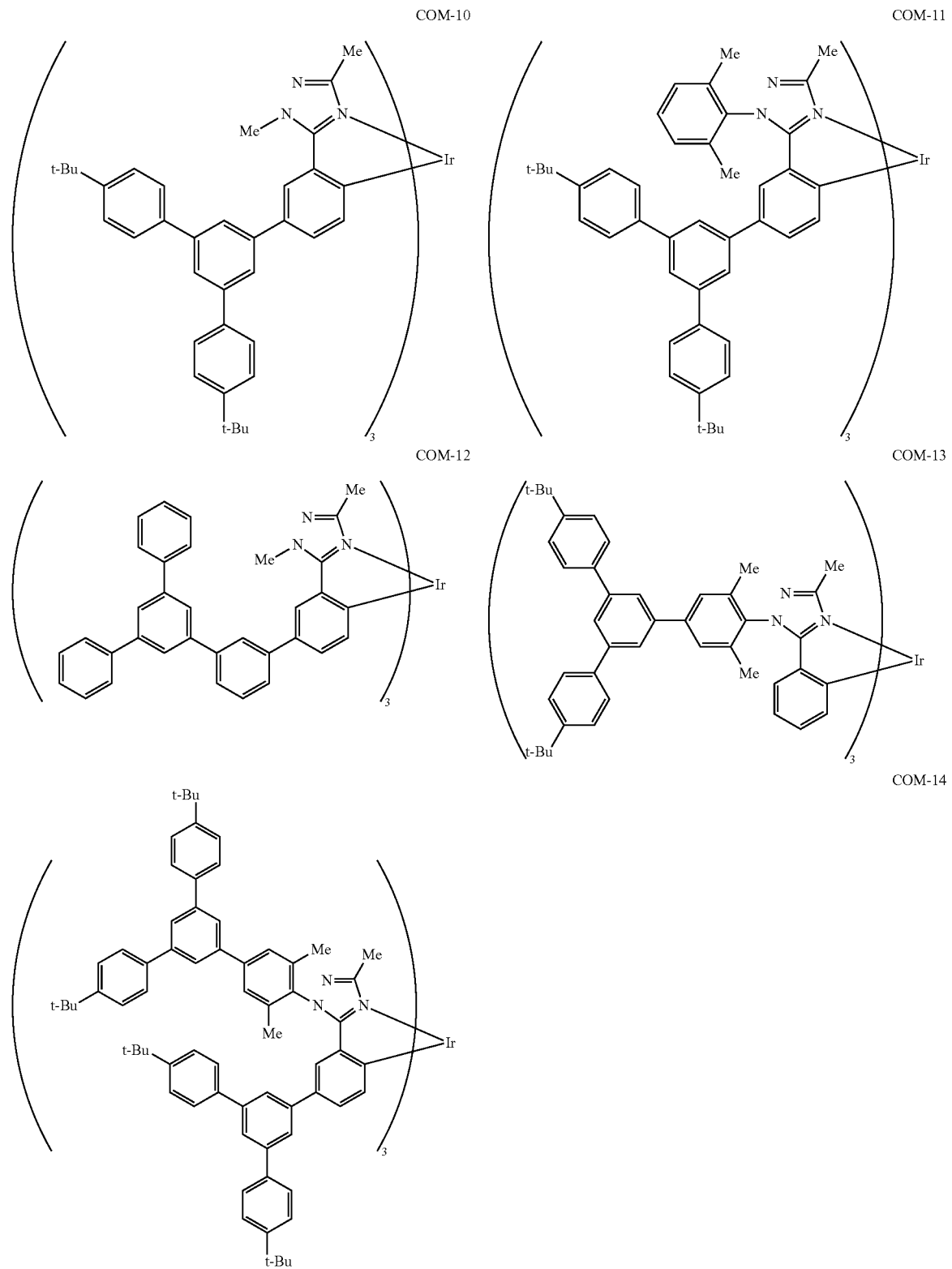

[Chemical Formula 94]

COM-15
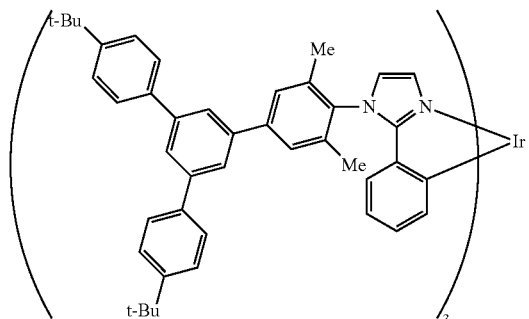

COM-16
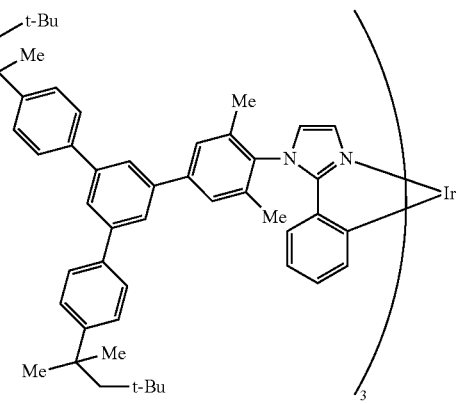

COM-17
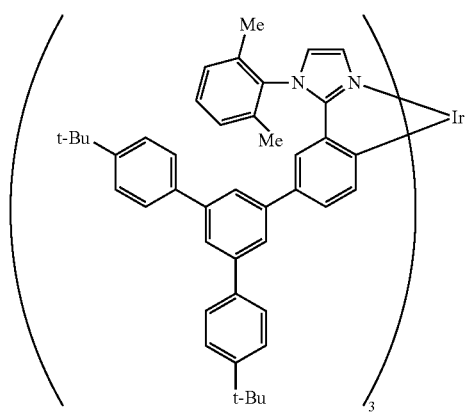

COM-18
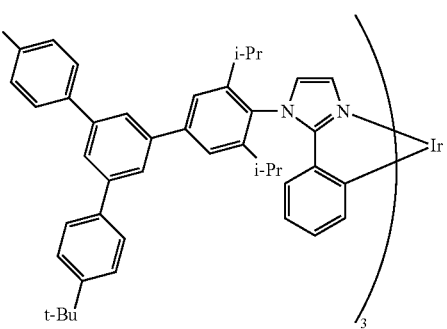

COM-19
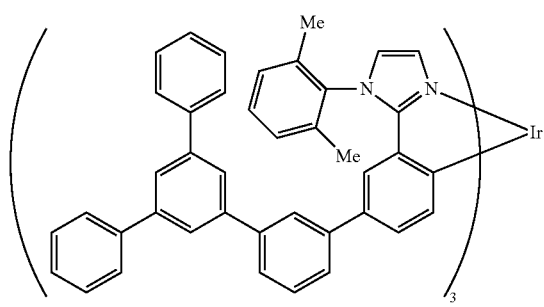

COM-20
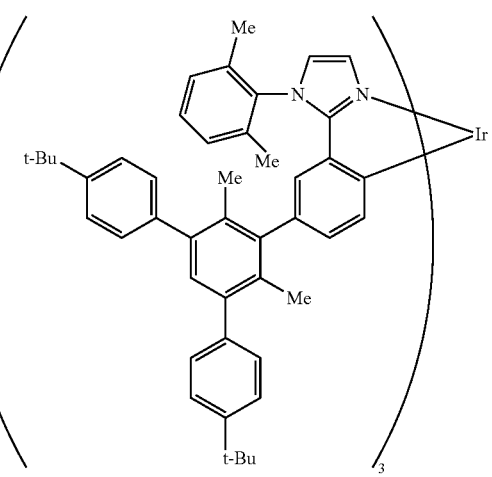

In the composition of the present invention, the compounding amount of the light emitting material is usually 0.1 to 400 parts by weight with respect to 100 parts by weight of the polymer compound of the present invention.

[Antioxidant]

The antioxidant may advantageously be one which is soluble in the same solvent as for the polymer compound of the present invention and does not disturb light emission and charge transportation, and the examples thereof include phenol antioxidants and phosphorus-based antioxidants.

In the composition of the present invention, the compounding amount of the antioxidant is usually 0.001 to 10 parts by weight with respect to 100 parts by weight of the polymer compound of the present invention.

The antioxidant may be used singly or two or more antioxidants may be used in combination.

<Film>

The film may contain the polymer compound of the present invention as it is, alternatively, may contain the polymer compound of the present invention in the form of an intramolecularly-crosslinked or intermolecularly-crosslinked or intramolecularly and intermolecularly-crosslinked body. The crosslinked body of the polymer compound of the present invention may also be a crosslinked body in which the polymer compound of the present invention and the other compound are crosslinked intermolecularly. The film containing the crosslinked body of the polymer compound of the present invention is a film obtained by crosslinking a film containing the polymer compound of the present invention by an external stimulus such as heating, light irradiation and the like. The film containing the crosslinked body of the polymer compound of the present invention can be suitably used for lamination of the following light emitting device, because the film is substantially insolubilized in a solvent.

The heating temperature for crosslinking the film is usually 25 to 300° C., and because the light emission efficiency is improved, preferably 50 to 250° C., more preferably 150 to 200° C.

The kind of light used in light irradiation for crosslinking the film includes, for example, ultraviolet light, near-ultraviolet light and visible light.

The film is suitable as a hole transporting layer or a hole injection layer in a light emitting device.

The film can be fabricated, for example, by a spin coating method, a casting method, a micro gravure coating method, a gravure coating method, a bar coating method, a roll coating method, a wire bar coating method, a dip coating method, a spray coating method, a screen printing method, a flexo printing method, an offset printing method, an inkjet printing method, a capillary coating method or a nozzle coating method, using the ink.

The thickness of the film is usually 1 nm to 10 μm.

<Light Emitting Device>

The light emitting device of the present invention is a light emitting device such as an organic electroluminescent device produced by using the polymer compound of the present invention, and the light emitting device includes, for example, a light emitting device containing the polymer compound of the present invention and a light emitting device containing the polymer compound of the present invention in the form of an intramolecularly-crosslinked or intermolecularly-crosslinked body or in the form of a body crosslinked in both modes.

The constitution of the light emitting device of the present invention comprises, for example, electrodes consisting of an anode and a cathode and a layer produced by using the polymer compound of the present invention disposed between the electrodes.

[Layer Constitution]

The layer produced by using the polymer compound of the present invention is usually at least one selected from a light emitting layer, a hole transporting layer, a hole injection layer, an electron transporting layer and an electron injection layer, preferably a hole transporting layer. These layers comprise a light emitting material, a hole transporting material, a hole injection material, an electron transporting material and an electron injection material, respectively. These layers can be formed by the same method as the above-described film fabrication using inks prepared by dissolving a light emitting material, a hole transporting material, a hole injection material, an electron transporting material and an electron injection material, respectively, in the solvent described above.

The light emitting device comprises a light emitting layer between an anode and a cathode. The light emitting device of the present invention preferably comprises at least one of a hole injection layer and a hole transporting layer between an anode and a light emitting layer from the standpoint of hole injectability and hole transportability, and preferably comprises at least one of an electron injection layer and an electron transporting layer between a cathode and a light emitting layer from the standpoint of electron injectability and electron transportability.

The material of a hole transporting layer, an electron transporting layer, a light emitting layer, a hole injection layer and an electron injection layer includes the above-described hole transporting materials, electron transporting materials, light emitting materials, hole injection materials and electron injection materials, respectively, in addition to the polymer compound of the present invention.

When the material of a hole transporting layer, the material of an electron transporting layer and the material of a light emitting layer are soluble in a solvent which is used in forming a layer adjacent to the hole transporting layer, the electron transporting layer and the light emitting layer, respectively, in fabrication of a light emitting device, it is preferable that the materials have a crosslinkable group to avoid dissolution of the materials in the solvent. After forming the layers using the materials having a crosslinkable group, the layers can be insolubilized by crosslinking the crosslinkable groups.

Methods of forming respective layers such as a light emitting layer, a hole transporting layer, an electron transporting layer, a hole injection layer and an electron injection layer in the light emitting device of the present invention include, for example, a method of vacuum vapor deposition from a powder and a method of film formation from solution or melted state when a low molecular weight compound is used, and, for example, a method of film formation from solution or melted state when a polymer compound is used.

The order and the number of layers to be laminated and the thickness of each layer may be controlled in view of light emission efficiency and device life.

[Substrate/Electrode]

The substrate in the light emitting device may advantageously be a substrate on which an electrode can be formed and which does not chemically change in forming an organic layer, and is a substrate made of a material such as, for example, glass, plastic and silicon. In the case of an opaque substrate, it is preferable that an electrode most remote from the substrate is transparent or semi-transparent.

The material of the anode includes, for example, electrically conductive metal oxides and semi-transparent metals, preferably, indium oxide, zinc oxide and tin oxide; electrically conductive compounds such as indium.tin.oxide (ITO) and indium.zinc.oxide; a composite of silver, palladium and copper (APC); NESA, gold, platinum, silver and copper.

The material of the cathode includes, for example, metals such as lithium, sodium, potassium, rubidium, cesium, beryllium, magnesium, calcium, strontium, barium, aluminum, zinc and indium; alloys composed of two or more of them; alloys composed of one or more of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

The anode and the cathode may each take a lamination structure composed of two or more layers.

[Use]

For producing planar light emission by using a light emitting device, a planar anode and a planar cathode are disposed so as to overlap with each other. Patterned light emission can be produced by a method of placing a mask with a patterned window on the surface of a planer Light emitting device, a method of forming extremely thick a layer intended to be a non-light emitting, thereby having the layer essentially no-light emitting or a method of forming an anode, a cathode or both electrodes in a patterned shape. By forming a pattern with any of these methods and disposing certain electrodes so as to switch ON/OFF independently, a segment type display capable of displaying numbers and letters and the like is provided. For producing a dot matrix display, both an anode and a cathode are formed in a stripe shape and disposed so as to cross with each other. Partial color display and multi-color display are made possible by a method of printing separately certain polymer compounds showing different emission or a method of using a color filter or a fluorescence conversion filter. The dot matrix display can be passively driven, or actively driven combined with TFT and the like. These displays can be used in computers, television sets, portable terminals and the like. The planar light emitting device can be suitably used as a planer light source for backlight of a liquid crystal display or as a planar light source for illumination. If a flexible substrate is used, it can be used also as a curved light source and a curved display.

EXAMPLES

The present invention will be illustrated further in detail by examples below, but the present invention is not limited to these examples.

In the present examples, the polystyrene-equivalent number average molecular weight (Mn) and the polystyrene-equivalent weight average molecular weight (Mw) of a polymer compound were measured by size exclusion chromatography (SEC) (manufactured by Shimadzu Corp., trade name: LC-10Avp). SEC measurement conditions are as described below.

[Measurement Condition]

The polymer compound to be measured was dissolved in tetrahydrofuran at a concentration of about 0.05 wt %, and 10 μL of the solution was injected into SEC. As the mobile phase of SEC, tetrahydrofuran was used and allowed to flow at a flow rate of 1.0 mL/min. As the column, PLgel MIXED-B (manufactured by Polymer Laboratories) was used. As the detector, UV-VIS detector (manufactured by Tosoh., trade name: UV-8320GPC) was used.

LC-MS was measured by the following method.

A measurement sample was dissolved in chloroform or tetrahydrofuran so as to give a concentration of about 2 mg/mL, and about 1 μL of the solution was injected into LC-MS (manufactured by Agilent Technologies, trade name: 1100LCMSD). As the mobile phase of LC-MS, acetonitrile and tetrahydrofuran were used while changing the ratio thereof and allowed to flow at a flow rate of 0.2 mL/min. As the column, L-column 2 ODS (3 μm) (manufactured by Chemicals Evaluation and Research Institute, internal diameter: 2.1 mm, length: 100 mm, particle size: 3 μm) was used.

TLC-MS was measured by the following method.

A measurement sample was dissolved at an arbitrary concentration in any solvent of toluene, tetrahydrofuran or chloroform, the solution was applied on a TLC plate for DART (manufactured by Techno Applications Inc., trade name: YSK5-100), and TLC-IS was measured using The AccuTOF TLC (trade name: JMS-T100TD, manufactured by JEOL Lt.). The temperature of a helium gas in measurement was controlled in the range of 200 to 400° C.

NMR was measured by the following method.

Five to ten milligrams (5 to 10 mg) of a measurement sample was dissolved in about 0.5 mL of deuterated chloroform ($CDCl_3$), deuterated tetrahydrofuran, deuterated dimethyl sulfoxide, deuterated acetone, deuterated N,N-dimethylformamide, deuterated toluene, deuterated methanol, deuterated ethanol, deuterated 2-propanol or deuterated methylene chloride, and NMR was measured using an NMR apparatus (manufactured by Agilent Technologies, Inc., trade name: INOVA300 or MERCURY 400VX).

As the index of the purity of a compound, a value of the high performance liquid chromatography (HPLC) area percentage was used. This value is a value in high performance liquid chromatography (HPLC, manufactured by Shimadzu Corp., trade name: LC-20A) at 254 nm, unless otherwise state. In this operation, the compound to be measured was dissolved in tetrahydrofuran or chloroform so as to give a concentration of 0.01 to 0.2% by weight, and depending on the concentration, 1 to 10 μL of the solution was injected into HPLC. As the mobile phase of HPLC, acetonitrile and tetrahydrofuran were used while varying the ratio of acetonitrile/tetrahydrofuran from 100/0 to 0/100 (voluminal ratio) and allowed to flow at a flow rate of 1.0 mL/min. As the column, Kaseisorb LC ODS 2000 (manufactured by Tokyo Chemical industry Co., Ltd.) or an CDS column having an equivalent performance was used. As the detector, a photo diode array detector (manufactured by Shimadzu Corp., trade name: SPD-M20A) was used.

<Synthesis Example 1> Synthesis of Compound MM1

[Chemical Formula 95]

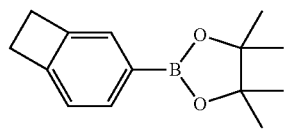

MM1

A nitrogen gas atmosphere was prepared in a reaction vessel, then, 4-bromobenzocyclobutene (1000 g), bis(pinacolato)diboron (1404 g), [1,1'-bis(diphenylphosphino)ferrocene]dichloropalladium complex (40 g), potassium acetate (1628 g), 1,1'-bis(diphenylphosphino)ferrocene (26.6 g) and 1,4-dioxane (10.9 L) were added, and the mixture was stirred for 5 hours while heating under reflux. Thereafter, the mixture was cooled down to room temperature, filtrated, and the resultant filtrate was concentrated under reduced pressure. The resultant residue was dissolved in hexane (5 L), activated carbon (1000 g) was added, then, the mixture was stirred. The resultant mixture was filtrated, and the resultant filtrate was concentrated under reduced pressure, to obtain a crude product. An operation of recrystallizing the resultant crude product using pentane was conducted repeatedly, to obtain a compound MM1 (754 g) as a white solid.

$^1$H-NMR ($CDCl_3$, 300 MHz) δ (ppm): 1.33 (12H, s), 3.18 (4H, s), 7.06 (1H, d), 7.49 (1H, s), 7.68 (1H, d).

<Synthesis Example 2> Synthesis of Compound MM2-St1

[Chemical Formula 96]

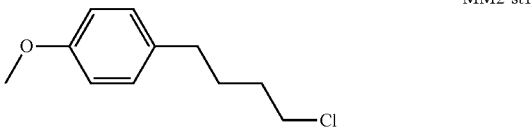

MM2-st1

A nitrogen gas atmosphere was prepared in a reaction vessel, then, 4-bromoanisole (200 g) and tetrahydrofuran (3.5 L) were added, and the mixture was cooled down to −78° C. Thereafter, to this was added a sec-butyllithium cyclohexane solution (1.4 mol/L, 1.67 L), and the mixture was stirred at −78° C. for 4 hours. Thereafter, to this was added a tetrahydrofuran solution prepared by dissolving 4-bromo-1-chlorobutane (208 g) in tetrahydrofuran (2.0 L), and the mixture was heated up to room temperature, then, stirred at room temperature for 16 hours. Thereafter, to this were added ammonium chloride water and ethyl acetate, and an aqueous layer and an organic layer were separated. To the resultant organic layer was added sodium sulfate, and the mixture was filtrated. The resultant filtrate was concentrated under reduced pressure, to obtain a crude product. The resultant crude product was purified by a silica gel column using a mixed solvent of ethyl acetate and hexane as a developing solvent, to obtain 166 g of a compound MM2-st1 as yellow oil.

$^1$H-NMR (CDCl$_3$, 300 MHz) δ (ppm): 1.69-1.86 (m, 4H), 2.59 (t, 2H), 3.55 (t, 2H), 3.80 (s, 3H), 6.84 (d, 2H), 7.11 (d, 2H).

<Synthesis Example 3> Synthesis of Compound MM2-St2

[Chemical Formula 97]

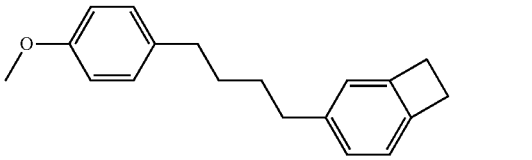

MM2-st2

A nitrogen gas atmosphere was prepared in a reaction vessel, then, 1,2-dibromoethane (2 mL) and tetrahydrofuran (1.5 L) were added, the, magnesium (40.6 g) was added, and the mixture was heated up to 75° C. Thereafter, to this was added the compound MM2-st1 (166 g), and the mixture was heated under reflux for 4 hours. The resultant reaction mixture was added to a tetrahydrofuran solution prepared by dissolving 4-bromobenzocyclobutane (102 g) and [1,1'-bis(diphenylphosphino)ferrocene]dichloropalladium complex (22.7 g) in tetrahydrofuran (1.0 L), and the mixture was stirred at 75° C. for 16 hours. Thereafter, to this were added dilute hydrochloric acid water and ethyl acetate, and an aqueous layer and an organic layer were separated. To the resultant organic layer was added sodium sulfate, and the mixture was filtrated. The resultant filtrate was concentrated under reduced pressure, to obtain a crude product. The resultant crude product was purified by a silica gel column using a mixed solvent of ethyl acetate and hexane as a developing solvent, to obtain 85 g of a compound MM2-st2 as yellow oil. This operation was repeated, to obtain a necessary amount of the compound MM2-st2.

$^1$H-NMR (CDCl$_3$, 300 MHz) δ (ppm): 1.62-1.66 (m, 4H), 2.57-2.62 (m, 4H), 3.15 (s, 4H), 3.80 (s, 3H), 6.83 (d, 2H), 6.89 (s, 1H), 6.96 (d, 1H), 7.0 (d, 1H), 7.10 (d, 2H).

<Synthesis Example 4> Synthesis of Compound MM2-St3

[Chemical Formula 98]

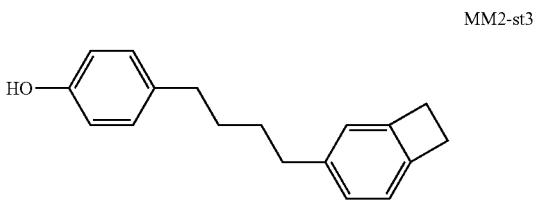

MM2-st3

A nitrogen gas atmosphere was prepared in a reaction vessel, then, the compound MM2-st2 (90 g) and dichloromethane (1.0 L) were added, and the mixture was cooled down to −78° C. Thereafter, to this was added a tribromoborane dichloromethane solution (1 mol/L, 304 mL), and the mixture was stirred at −78° C. for 2 hours. The resultant reaction mixture was heated up to room temperature, then, stirred at room temperature for 18 hours. The resultant reaction mixture was washed with water, then, dichloromethane was added, and an aqueous layer and an organic layer were separated. To the resultant organic layer was added sodium sulfate, and the mixture was filtrated. The resultant filtrate was concentrated, to obtain a crude product. The resultant crude product was purified by a silica gel column using a mixed solvent of tert-butyl methyl ether and hexane as a developing solvent, to obtain 45 g of a compound MM2-st3 as a white solid.

$^1$H-NMR (CDCl$_3$, 300 MHz) δ (ppm): 1.60-1.65 (m, 4H), 2.55-2.62 (m, 4H), 3.15 (s, 4H), 4.68 (brs, 1H), 6.75 (d, 2H), 6.89 (s, 1H), 6.96 (d, 1H), 7.01 (d, 1H), 7.04 (d, 2H).

<Synthesis Example 5> Synthesis of Compound MM2-st4

[Chemical Formula 99]

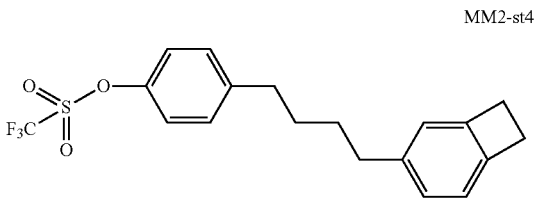

MM2-st4

A nitrogen gas atmosphere was prepared in a reaction vessel, then, the compound MM2-st3 (45 g), pyridine (31.7 mL) and dichloromethane (450 mL) were added, and the mixture was cooled down to 0° C. Thereafter, to this was added trifluoromethanesulfonic anhydride (43.8 mL), and the mixture was stirred at 0° C. for 1 hour. The resultant reaction mixture was heated up to room temperature, then, stirred at room temperature for 1 hour. Thereafter, to this were added water and dichloromethane, and an aqueous layer and an organic layer were separated. To the resultant organic layer was added sodium sulfate, and the mixture was filtrated. The resultant filtrate was concentrated, to obtain a crude product. The resultant crude product was purified by a silica gel column using hexane as a developing solvent, to obtain 50 g of a compound MM2-st4 as pale yellow oil.

$^1$H-NMR (CDCl$_3$, 300 MHz) δ (ppm): 1.64-1.67 (m, 4H), 2.59-2.68 (m, 4H), 3.15 (s, 4H), 6.89 (s, 1H), 6.97 (d, 1H), 7.0 (d, 1H), 7.17 (d, 2H), 7.23 (d, 2H).

<Synthesis Example 6> Synthesis of Compound MM2

[Chemical Formula 100]

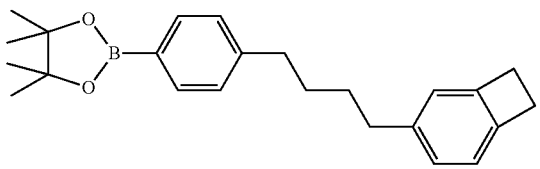

MM2

A nitrogen gas atmosphere was prepared in a reaction vessel, then, the compound MM2-st4 (50 g), bis(pinacolato)diboron (99.0 g), [1,1'-bis(diphenylphosphino)ferrocene]dichloropalladium complex (2.65 g), potassium acetate (38.3 g) and 1,4-dioxane (600 mL) were added, and the mixture was heated up to 110° C., and stirred at 110° C. for 16 hours. The resultant reaction mixture was cooled down to room temperature, then, filtrated, and the resultant filtrate was concentrated under reduced pressure. To the resultant residue were added ethyl acetate and water, and an aqueous layer and an organic layer were separated. To the resultant organic layer was added sodium sulfate, and the mixture was filtrated. The resultant filtrate was concentrated under reduced pressure, to obtain a crude product. The resultant crude product was purified by a silica gel column repeatedly, to obtain 33 g of a compound MM2 as a white solid.

$^1$H-NMR (CDCl$_3$, 300 MHz) δ (ppm): 1.36 (s, 12H), 1.63-1.67 (m, 4H), 2.59-2.68 (m, 4H), 3.15 (s, 4H), 6.89 (s, 1H), 6.97 (d, 1H), 7.0 (d, 1H), 7.20 (d, 2H), 7.23 (d, 2H).

<Synthesis Example 7> Synthesis of Compound MM3-st1

[Chemical Formula 101]

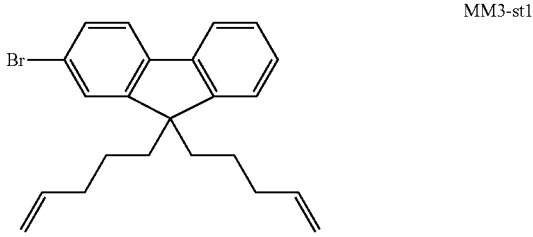

MM3-st1

A nitrogen gas atmosphere was prepared in a reaction vessel, then, 2-bromofluorene (4.92 g), 5-bromo-1-pentene (8.94 g), tetrabutylammonium bromide (324 mg) and a potassium hydroxide aqueous solution (50% by weight, 17 mL) were added, and the mixture was heated up to 80° C., and stirred at 80° C. for 4 hours. The resultant reaction mixture was cooled down to room temperature, water and heptane were added to this, and an aqueous layer and an organic layer were separated. To the resultant organic layer was added magnesium sulfate, and the mixture was filtrated. The resultant filtrate was concentrated under reduced pressure, then, to the resultant residue were added heptane and activated carbon (2.20 g), and the mixture was stirred for 30 minutes. The resultant mixture was filtrated, and the resultant filtrate was concentrated under reduced pressure, to obtain 6.78 g of a compound MM3-st1 as pale yellow oil.

LC-MS (APPI, positive): M$^+$ 380

<Synthesis Example 8> Synthesis of Compound MM3

[Chemical Formula 102]

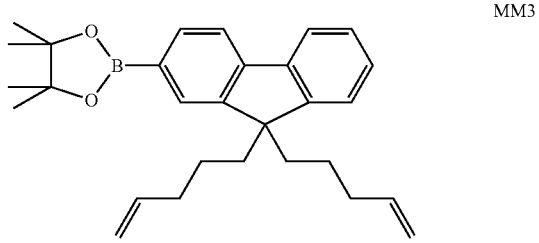

MM3

An argon gas atmosphere was prepared in a reaction vessel, then, the compound MM3-st1 (6.00 g) and tetrahydrofuran (90 mL) were added, and the mixture was cooled down to −78° C. Thereafter, to this was added a solution (1.07 mol/L, 29.4 mL) prepared by dissolving sec-butyllithium in cyclohexane, and the mixture was stirred at −78° C. for 1 hour. Thereafter, to this was added 2-isopropoxy-4,4,5,5-tetramethyl-1,3,2-dioxaborane (6.59 g), and the mixture was heated up to room temperature, then, water and heptane were added, and an aqueous layer and an organic layer were separated. The resultant organic layer was washed with water, then, magnesium sulfate was added, and the mixture was filtrated, and the resultant filtrate was concentrated under reduced pressure, to obtain a crude product. The resultant crude product was purified by a silica gel column using a mixed solvent of hexane and toluene as a developing solvent, then, concentrated under reduced pressure. To the resultant residue were added heptane and activated carbon (1.40 g), and the mixture was stirred for 30 minutes. The resultant mixture was filtrated, and the resultant filtrate was concentrated under reduced pressure, to obtain 3.36 g of a compound MM3 as colorless oil.

LC-MS (APPI, positive): M$^+$ 428

$^1$H-NMR (CDCl$_3$, 300 Hz) δ (ppm): 0.68 (s, 4H), 0.97 (s, 12H), 1.79 (m, 4H), 2.00 (m, 4H), 4.75-4.87 (m, 4H), 5.55 (m, 2H), 7.28-7.38 (m, 3H), 7.67-7.76 (m, 3H), 7.80 (dd, 1H).

<Synthesis Example 9> Synthesis of Compound MM4-st1

[Chemical Formula 103]

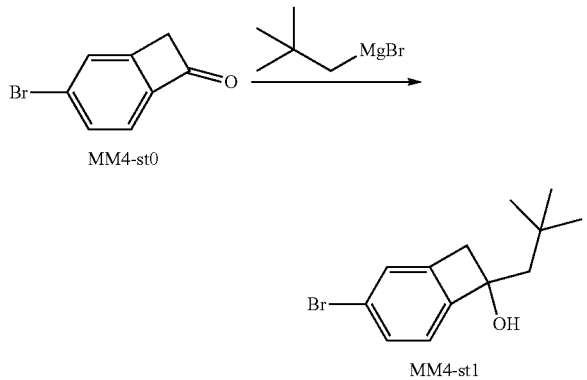

A nitrogen gas atmosphere was prepared in a reaction vessel, then, magnesium (44.1 g), diethyl ether (18 mL) and several fragments of iodine were added, then, a solution prepared by dissolving neopentyl bromide (206 mL) in diethyl ether (518 mL) was added, and the mixture was stirred under reflux for 1 hour. The resultant reaction mixture was added to a solution prepared by dissolving a compound MM4-st0 (179 g) synthesized according to a synthesis method described in JP-A No. 2014-133740 in diethyl ether (1800 mL), then, the mixture was stirred overnight at room temperature. Thereafter, to this was added dilute hydrochloric acid water (540 mL), then, the mixture was washed with water. To the resultant organic layer was added magnesium sulfate, and the mixture was filtrated, and the resultant filtrate was concentrated under reduced pressure. The resultant solid was dissolved in toluene, then, the solution was filtrated through silica gel, and the resultant filtrate was concentrated under reduced pressure, to obtain 225 g of a crude product. The crude product (250 g) obtained by repeating this operation was recrystallized from hexane, to obtain 151 g of a compound MM4-st1 as a white solid.

$^1$H-NMR (CDCl$_3$, 300 MHz) δ (ppm): 1.10 (9H, s), 1.81 (1H, d), 1.94 (1H, d), 2.09 (1H, s), 3.16 (1H, d), 3.49 (1H, d), 7.07 (1H, d), 7.30 (1H, s), 7.37 (1H, d).

<Synthesis Example 10> Synthesis of Compound MM4-st2

[Chemical Formula 104]

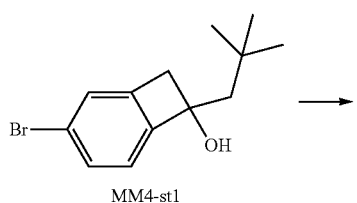

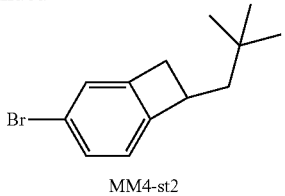

A nitrogen gas atmosphere was prepared in a reaction vessel, then, the compound MM4-st1 (150 g), hexane (300 mL) and triethylsilane (96.5 mL) were added, and the mixture was cooled down to 0° C. Thereafter, into this was dropped trifluoroacetic acid (220 mL) over a period of 0.5 hours. The resultant reaction mixture was heated up to 30° C., and stirred at 30° C. for 1 hour, then, stirred overnight at room temperature. To the resultant reaction mixture were added hexane and water, and an aqueous layer and an organic layer were separated. The resultant organic layer was washed with 10% by weight sodium acetate water and water. To the resultant organic layer was added magnesium sulfate, and the mixture was filtrated, and the resultant filtrate was concentrated under reduced pressure. The resultant yellow oil was dissolved in hexane, then, the solution was filtrated through silica gel, and the resultant filtrate was concentrated under reduced pressure, to obtain 166 g of a crude product of a compound MM4-st2 as colorless oil.

A nitrogen gas atmosphere was prepared in a reaction vessel, then, the colorless oil (166 g) obtained above and tetrahydrofuran (1500 mL) were added, then, a borane.THF complex (0.28 mol/L tetrahydrofuran solution, 237 mL) was dropped, then, the mixture was stirred at 50° C. for 0.5 hours. The resultant reaction mixture was cooled down to room temperature, then, hexane and water were added, and an aqueous layer and an organic layer were separated. The resultant organic layer was washed with water, then, magnesium sulfate was added, and the mixture was filtrated, and the resultant filtrate was concentrated under reduced pressure. The resultant crude product was purified by a silica gel column (a developing solvent: hexane), to obtain 136 g of a compound MM4-st2 as colorless oil.

$^1$H-NMR (CDCl$_3$, 300 MHz) δ (ppm): 0.99 (9H, s), 1.54 (1H, dd), 1.74 (1H, dd), 2.78 (1H, dd), 3.36 (1H, dd), 3.47 (1H, m), 6.92 (1H, d), 7.18 (1H, s), 7.31 (1H, d).

<Synthesis Example 11> Synthesis of Compound MM4

[Chemical Formula 105]

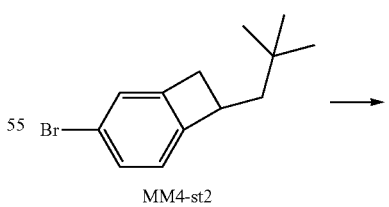

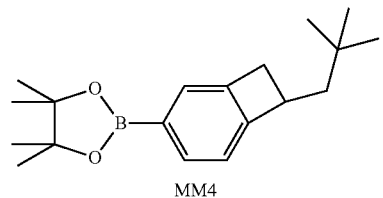

An argon gas atmosphere was prepared in a reaction vessel, then, the compound MM4-st2 (1.06 g), bis(pinacolato)diboron (1.26 g), [1,1'-bis(diphenylphosphino)ferrocene]dichloropalladium complex (158 mg), potassium acetate (2.39 g) and 1,2-dimethoxyethane (10 mL) were added, and the mixture was heated up to 80° C., and stirred at 80° C. for 5 hours. The resultant reaction mixture was cooled down to room temperature, then, heptane and water were added, and an aqueous layer and an organic layer were separated. The resultant organic layer was washed with water, then, magnesium sulfate was added, and the mixture was filtrated, and the resultant filtrate was concentrated under reduced pressure. The resultant residue was dissolved in toluene, then, the solution was filtrated through silica gel, and the resultant filtrate was concentrated under reduced pressure. The residue (1.37 g) obtained by repeating this operation was dissolved in heptane (14 mL), then, activated carbon (359 mg) was added, and the mixture was stirred. The resultant mixture was filtrated, and the resultant filtrate was concentrated under reduced pressure, to obtain a crude product. The resultant crude product was recrystallized from acetonitrile, to obtain a compound MM4 (730 mg) as a white solid.

LC-MS (ESI, positive): $[M+K]^+$ 339

$^1$H-NMR (CDCl$_3$, 300 MHz) δ (ppm): 0.99 (9H, s), 1.33 (12H, s), 1.55 (1H, dd), 1.78 (1H, dd), 2.78 (1H, dd), 3.37 (1H, dd), 3.54 (1H, m), 7.07 (1H, d), 7.49 (1H, s), 7.67 (1H, d).

<Synthesis Example 12> Synthesis of Compounds MM10 to MM20

A compound MM10 was synthesized according to a synthesis method described in international Publication WO2002/092723.

A compound MM11 was synthesized according to a synthesis method described in JP-A No. 2011-174062.

A compound MM12 was synthesized according to a synthesis method described in international Publication WO2005/049546.

A compound MM13 was synthesized according to a synthesis method described in JP-A No. 2010-215886.

A compound MM14 was synthesized according to a synthesis method described in international Publication WO2002/045184.

A compound MM15 was synthesized according to a synthesis method described in JP-A No. 2008-106241.

A compound MM16 was synthesized according to the following synthesis method.

A compound MM17 was synthesized according to a synthesis method described in international Publication WO2013/146806.

A compound MM18 was synthesized according to the following synthesis method.

A compound MM19 was synthesized according to a synthesis method described in International Publication WO2012/086671.

A compound MM20 was synthesized according to a synthesis method described in JP-A No. 2004-143419.

[Chemical Formula 106]

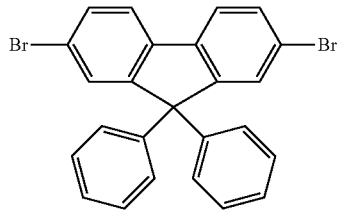

MM10

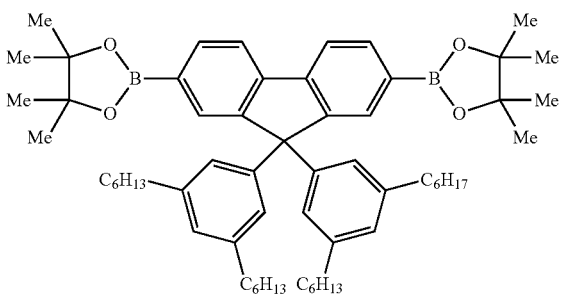

MM11

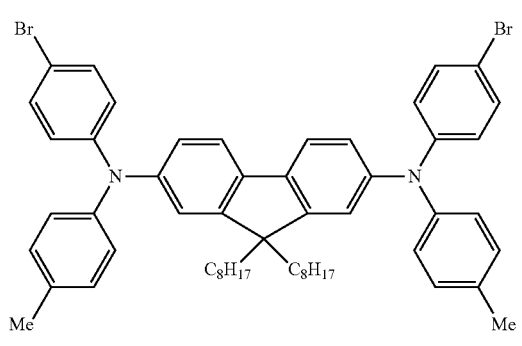

MM12

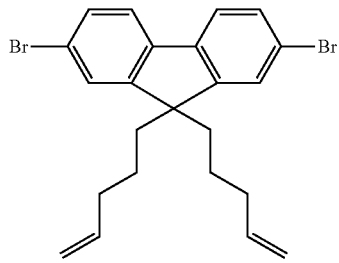

MM13

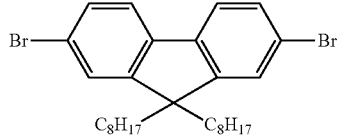

MM14

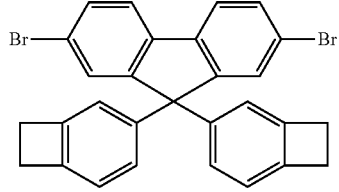

MM15

[Chemical Formula 107]

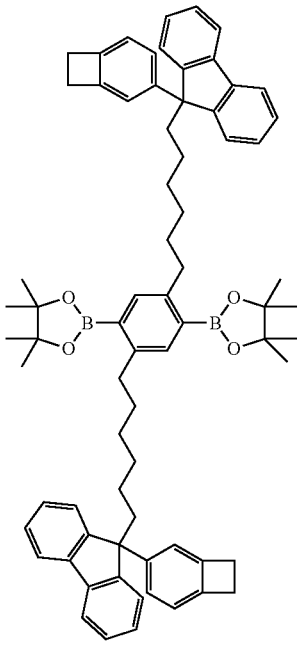
MM16

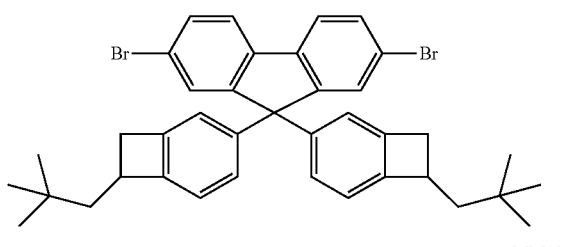
MM17

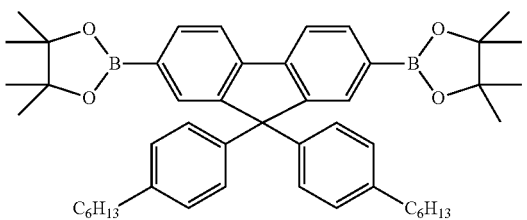
MM18

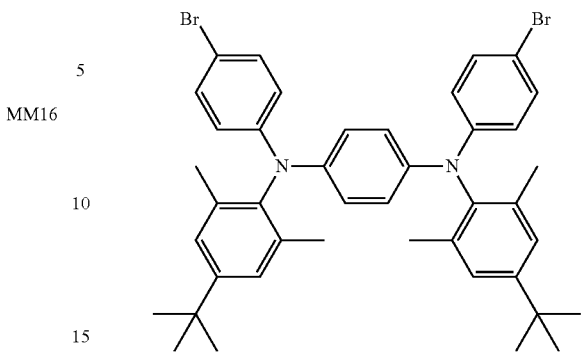
MM20

<Synthesis Example 13> Synthesis of Compound Ma3

[Chemical Formula 108]

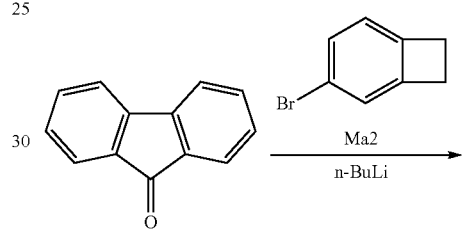

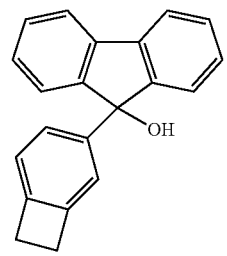
Ma3

A gas in a flask equipped with a stirrer was purged with a nitrogen gas, then, a compound Ma2 (64.6 g) and tetrahydrofuran (615 mL) were added, and the mixture was cooled down to −70° C. Into this, a n-butyllithium hexane solution (1.6 M, 218 mL) was dropped over a period of 1 hour, then, the mixture was stirred at −70° C. for 2 hours. To this, a compound Ma1 (42.1 g) was added in several batches, then, the mixture was stirred at −70° C. for 2 hours. Into this, methanol (40 mL) was dropped over a period of 1 hour, then, the mixture was heated up to room temperature. Thereafter, the solvent was distilled off by concentrating under reduced pressure, and toluene and water were added. Thereafter, an aqueous layer was separated and the resultant organic layer was washed with water. The resultant organic layer was concentrated under reduced pressure, and the resultant residue was purified by using a silica gel column (developing solvent: a mixed solvent of hexane and ethyl acetate), thereby obtaining 71 g of a compound Ma3 as colorless oil. The compound Ma3 had an HPLC area percentage value (UV: 254 nm) of 97.5%. This operation was repeated, to obtain a necessary amount of the compound Ma3.

$^1$H-NMR (CDCl$_3$, 300 MHz): δ (ppm): 2.43 (1H, s), 3.07-3.13 (4H, m), 6.95 (1H, d), 7.07 (1H. s), 7.18-7.28 (3H, m), 7.28-7.40 (4H, m), 7.66 (2H, s).

<Synthesis Example 14> Synthesis of Compound Ma4

[Chemical Formula 109]

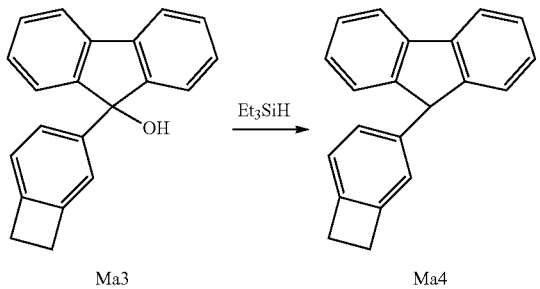

A gas in a flask equipped with a stirrer was purged with a nitrogen gas, then, the compound Ma3 (72.3 g), toluene (723 mL) and triethylsilane (118.0 g) were added, and the mixture was heated up to 70° C. Into this, methanesulfonic acid (97.7 g) was dropped over a period of 1.5 hours, then, the mixture was stirred at 70° C. for 0.5 hours. Thereafter, the mixture was cooled down to room temperature, and toluene (1 L) and water (1 L) were added, then, an aqueous layer was separated. The resultant organic layer was washed with water, 5% by weight sodium hydrogen carbonate water and water in this order. The resultant organic layer was concentrated under reduced pressure, and the resultant crude product was recrystallized from a mixed solvent of toluene and ethanol, thereby obtaining 51.8 g of a compound Ma4 as a white solid. This operation was repeated, thereby obtaining a necessary amount of the compound Ma4.

$^1$H-NMR (CDCl$_3$, 300 MHz): δ (ppm): 3.03-3.14 (4H, m), 4.99 (1H, s), 6.68 (1H, s), 6.92-7.01 (2H, m), 7.20-7.28 (2H, m), 7.29-7.38 (4H, m), 7.78 (2H, d).

<Synthesis Example 15> Synthesis of Compound Mb3

[Chemical Formula 110]

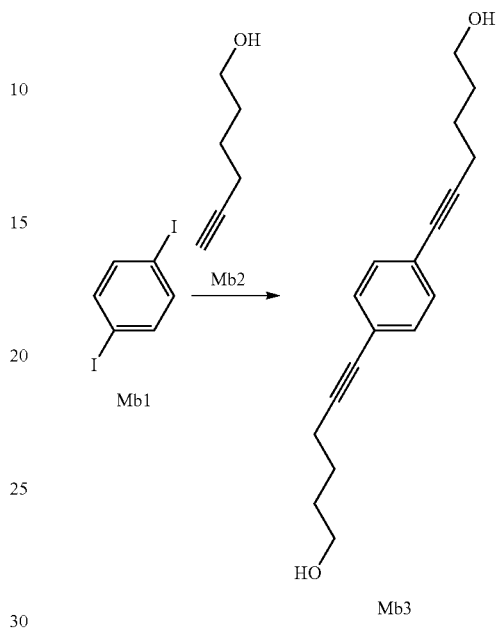

A gas in a flask equipped with a stirrer was purged with a nitrogen gas, then, a compound Mb1 (185.0 g), a compound Mb2 (121.1 g), copper(i) iodide (3.2 g), dichloromethane (185 mL) and triethylamine (2.59 L) were added, and the mixture was heated up to the reflux temperature. Thereafter, the mixture was stirred at the reflux temperature for 0.5 hours, and cooled down to room temperature. To this was added dichloromethane (1.85 L), then, the mixture was filtrated through a filter paved with celite. To the resultant filtrate was added a 10% by weight sodium hydrogen carbonate aqueous solution, then, an aqueous layer was separated. The resultant organic layer was washed with water twice, washed with saturated NaCl water, then, magnesium sulfate was added. The resultant mixture was filtrated, and the resultant filtrate was concentrated under reduced pressure. The resultant residue was purified by using a silica gel column (developing solvent: a mixed solvent of chloroform and ethyl acetate), thereby obtaining a crude product. The resultant crude product was dissolved in ethanol (1.4 L), then, activated carbon (5 g) was added, and the mixture was filtrated. The resultant filtrate was concentrated under reduced pressure, and the resultant residue was recrystallized from hexane, thereby obtaining 99.0 g of a compound Mb3 as a white solid. This operation was repeated, thereby obtaining a necessary amount of the compound Mb3.

$^1$H-NMR (DMSO-d6, 300 MHz): δ (ppm): 1.52-1.55 (8H, m), 2.42 (4H, t), 3.38-3.44 (4H, m), 4.39-4.43 (2H, m), 7.31 (4H, s).

<Synthesis Example 16> Synthesis of Compound Mb4

[Chemical Formula 111]

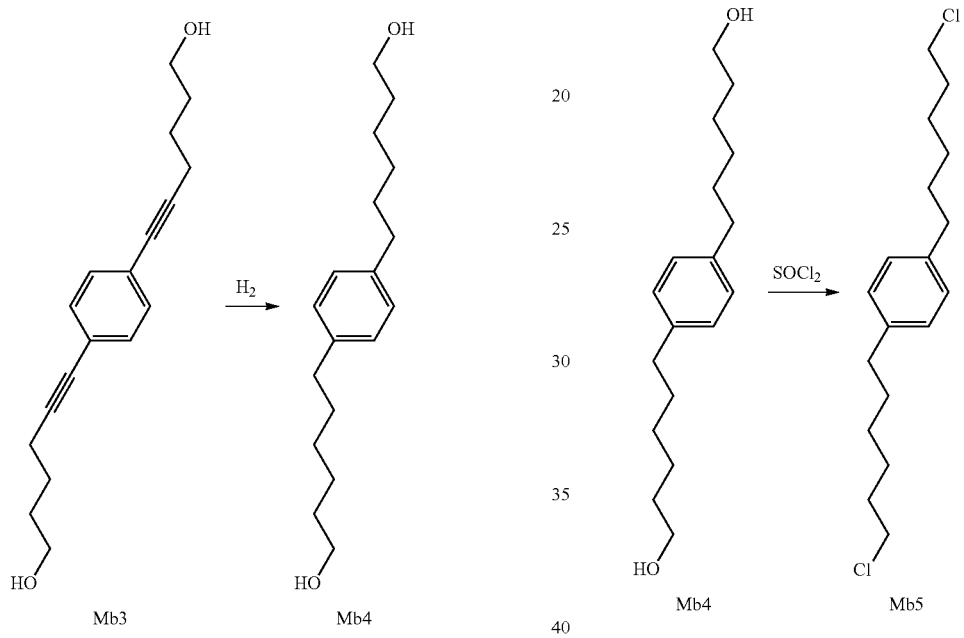

A gas in a flask equipped with a stirrer was purged with a nitrogen gas, then, the compound Mb3 (110.0 g), ethanol (1.65 L) and palladium/carbon (Pd weight: 10%) (11.0 g) were added, and the mixture was heated up to 30° C. Thereafter, a gas in the flask was purged with a hydrogen gas. Thereafter, the mixture was stirred at 30° C. for 3 hours while feeding a hydrogen gas into the flask. Thereafter, a gas in the flask was purged with a nitrogen gas. The resultant mixture was filtrated, and the resultant filtrate was concentrated under reduced pressure. The resultant residue was purified by using a silica gel column (developing solvent: a mixed solvent of chloroform and ethyl acetate), thereby obtaining a crude product. The resultant crude product was recrystallized from hexane, thereby obtaining 93.4 g of a compound Mb4 as a white solid.

$^1$H-NMR (CDCl$_3$, 300 MHz): δ (ppm): 1.30-1.40 (8H, m), 1.55-1.65 (8H, m), 2.58 (4H, t), 3.64 (4H, t), 7.09 (4H, s).

$^{13}$C-NMR (CDCl$_3$, 75 MHz): δ (ppm): 25.53, 28.99, 31.39, 32.62, 35.37, 62.90, 128.18, 139.85.

<Synthesis Example 17> Synthesis of Compound Mb5

[Chemical Formula 112]

A gas in a flask equipped with a stirrer was purged with a nitrogen gas, then, the compound Mb4 (61.0 g), pyridine (0.9 g) and toluene (732 mL) were added, and the mixture was heated up to 60° C. Into this, thionyl chloride (91.4 g) was dropped over a period of 1.5 hours, then, the mixture was stirred at 60° C. for 5 hours. The resultant mixture was cooled down to room temperature, then, concentrated under reduced pressure. The resultant residue was purified by using a silica gel column (developing solvent: a mixed solvent of hexane and ethyl acetate), thereby obtaining 64.3 g of a compound Mb5 as colorless oil.

$^1$H-NMR (CDCl$_3$, 300 MHz): δ (ppm): 1.35-1.40 (4H, m), 1.41-1.50 (4H, m), 1.60-1.68 (4H, m), 1.75-1.82 (4H, m), 2.60 (4H, t), 3.55 (4H, t), 7.11 (4H, s).

<Synthesis Example 18> Synthesis of Compound Mb6

[Chemical Formula 113]

<Synthesis Example 19> Synthesis of Compound Mb7

[Chemical Formula 114]

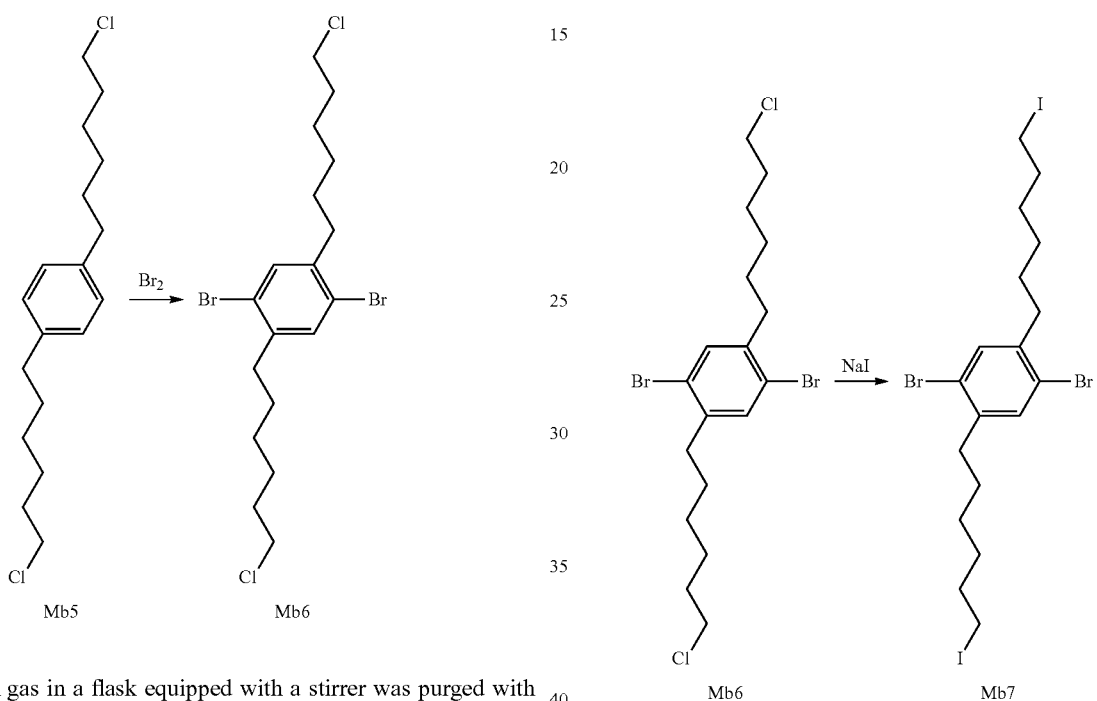

A gas in a flask equipped with a stirrer was purged with a nitrogen gas, then, the compound Mb5 (42.0 g), an iron powder (1.7 g), iodine (0.3 g) and dichloromethane (800 mL) were added. Thereafter, the whole flask was light-shielded, and cooled at 0 to 5° C. Into this, a mixed liquid of bromine (44.7 g) and dichloromethane (200 mL) was dropped over a period of 1 hour, then, the mixture was stirred at 0 to 5° C. overnight. The resultant mixed liquid was added to water (1.2 L) cooled at 0 to 5° C., then, an organic layer was separated. The resultant organic layer was washed with a 10% by weight sodium thiosulfate aqueous solution, and further, washed with saturated sodium chloride water and water in this order. To the resultant organic layer was added sodium sulfate, then, the mixture was filtrated, and the resultant filtrate was concentrated under reduced pressure. The resultant residue was purified by using a silica gel column (developing solvent; hexane), thereby obtaining a crude product. The resultant crude product was recrystallized from hexane, thereby obtaining 47.0 g of a compound Mb6 as a white solid.

$^1$H-NMR (CDCl$_3$, 300 MHz): δ (ppm): 1.38-1.45 (4H, m), 1.47-1.55 (4H, m), 1.57-1.67 (4H, m), 1.77-1.84 (4H, m), 2.66 (4H, t), 3.55 (4H, t), 7.36 (2H, s).

A gas in a flask equipped with a stirrer was purged with a nitrogen gas, then, sodium iodide (152.1 g) and acetone (600 mL) were added, and the mixture was stirred at room temperature for 0.5 hours. To this was added Mb6 (40.0 g), then, the mixture was heated up to the reflux temperature, and stirred at the reflux temperature for 24 hours. Thereafter, the mixture was cooled down to room temperature, and the resultant mixed liquid was added to water (1.2 L). The deposited solid was separated by filtration, then, washed with water, thereby obtaining a crude product. The resultant crude product was recrystallized from a mixed liquid of toluene and methanol, thereby obtaining 46.0 g of a compound Mb7 as a white solid. This operation was repeated, thereby obtaining a necessary amount of the compound Mb7.

$^1$H-NMR (CDCl$_3$, 300 MHz): δ (ppm): 1.35-1.50 (8H, m), 1.57-1.65 (4H, m), 1.80-1.89 (4H, m), 2.65 (4H, t), 3.20 (4H, t), 7.36 (2H, s).

<Synthesis Example 20> Synthesis of Compound Mb8

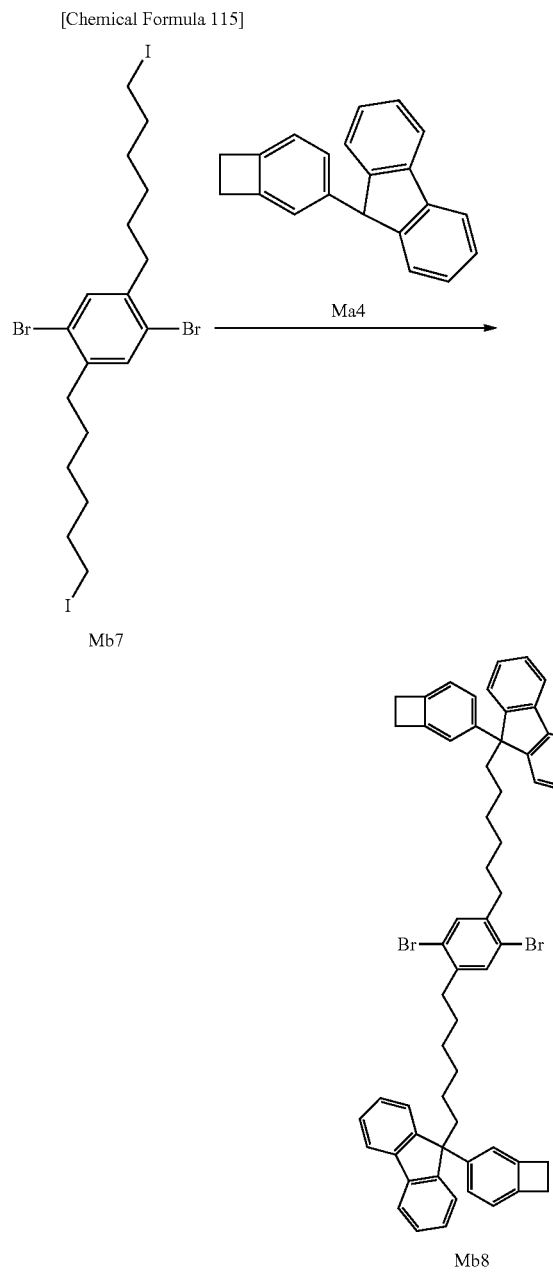

A gas in a flask equipped with a stirrer was purged with a nitrogen gas, then, sodium hydride (60% by weight, dispersed in liquid paraffin) (9.4 g), tetrahydrofuran (110 mL) and the compound Mb7 (63.2 g) were added. To this, a compound Ma4 (55.0 g) was added in several batches, then, the mixture was stirred for 12 hours. To this were added toluene (440 mL) and water (220 mL), then, an aqueous layer was separated. The resultant organic layer was washed with water, then, magnesium sulfate was added. The resultant mixed liquid was filtrated, and the resultant filtrate was concentrated under reduced pressure, thereby obtaining a crude product. The resultant crude product was purified by using a silica gel column (developing solvent: a mixed solvent of hexane and toluene). Thereafter, the product was recrystallized from hexane, thereby obtaining 84.1 g of a compound Mb8 as a white solid.

$^1$H-NMR (CDCl$_3$, 300 MHz): δ (ppm): 0.70-0.76 (4H, m), 1.10-1.21 (8H, m), 1.32-1.44 (4H, m), 2.39-2.58 (8H, m), 3.00-3.12 (8H, m), 6.82-6.94 (4H, m), 7.00-7.05 (2H, m), 7.17-7.28 (10H, m), 7.30-7.38 (4H, m), 7.71-7.77 (4H, m).

<Synthesis Example 21> Synthesis of Compound MM16

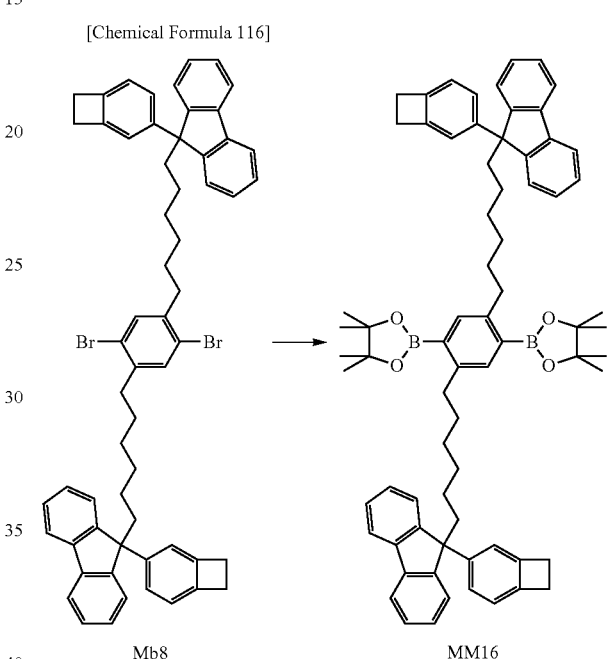

A gas in a flask equipped with a stirrer was purged with a nitrogen gas, then, the compound Mb8 (84.0 g), [1,1'-bis(diphenylphosphino)ferrocene]palladium(II) dichloride dichloromethane adduct (PdCl$_2$(dppf).CH$_2$Cl$_2$, 2.2 g), bispinacolatodiboron (68.3 g), potassium acetate (52.8 g) and cyclopentyl methyl ether (840 mL) were added, and the mixture was heated up to the reflux temperature, then, stirred at the reflux temperature for 5 hours. Thereafter, the mixture was cooled down to room temperature, and toluene (500 mL) and water (300 mL) were added, then, an aqueous layer was separated. The resultant organic layer was washed with water, then, activated carbon (18.5 g) was added. The resultant mixed liquid was filtrated, and the resultant filtrate was concentrated under reduced pressure, thereby obtaining a crude product. The resultant crude product was purified by using a silica gel column (developing solvent: a mixed solvent of hexane and toluene). Thereafter, an operation of recrystallizing from a mixed solvent of toluene and acetonitrile was repeated, thereby obtaining 45.8 g of a compound MM1 as a white solid.

$^1$H-NMR (CDCl$_3$, 300 MHz): δ (ppm): 0.70-0.76 (4H, m), 1.24-1.40 (36H, m), 2.39-2.48 (4H, m), 2.66-2.75 (4H, m), 3.00-3.10 (8H, m), 6.76-6.90 (4H, m), 7.00-7.05 (2H, m), 7.19-7.30 (8H, m), 7.30-7.36 (4H, m), 7.43 (2H, s), 7.72 (4H, d).

125

<Synthesis Example 22> Synthesis of Compound MM18-st1

[Chemical Formula 117]

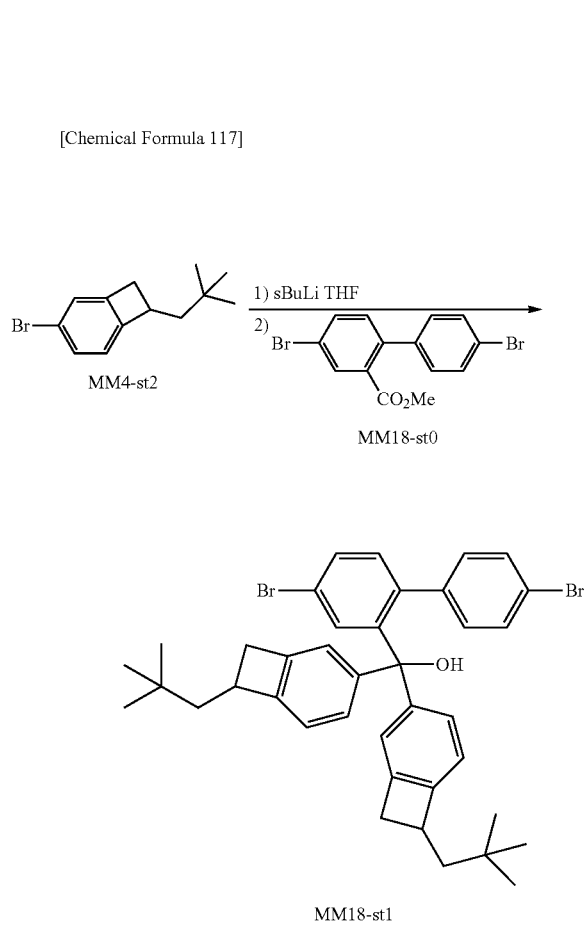

An argon gas atmosphere was prepared in a reaction vessel, then, the compound MM4-st2 (54.0 g) and tetrahydrofuran (470 mL) were added, and the mixture was cooled down to −70° C. Thereafter, into this was dropped a solution (1.02 mol/L, 200 mL) prepared by dissolving sec-butyllithium in hexane over a period of 1 hour. Thereafter, into this was dropped a solution prepared by dissolving the compound MM18-st0 (32.0 g) in tetrahydrofuran (64 mL). Thereafter, into this was dropped methanol (30 mL), then, the mixture was heated up to room temperature. The resultant reaction mixture was concentrated under reduced pressure, then, toluene and dilute hydrochloric acid water were added, and an aqueous layer and an organic layer were separated. The resultant organic layer was further washed with water. The resultant organic layer was concentrated under reduced pressure, and the resultant residue was dissolved in heptane (450 mL), then, activated carbon (22.3 g) was added, and the mixture was stirred. The resultant mixture was filtrated, and the resultant filtrate was concentrated under reduced pressure, to obtain a crude product. The resultant crude product was washed in ethanol while grinding, to obtain 37.1 g of a compound MM18-st1 as a white solid. This operation was repeated, to obtain a necessary amount of the compound MM18-st1.

LC-MS (ESI, positive): [M+K]$^+$ 725

126

<Synthesis Example 23> Synthesis of Compound MM18

[Chemical Formula 118]

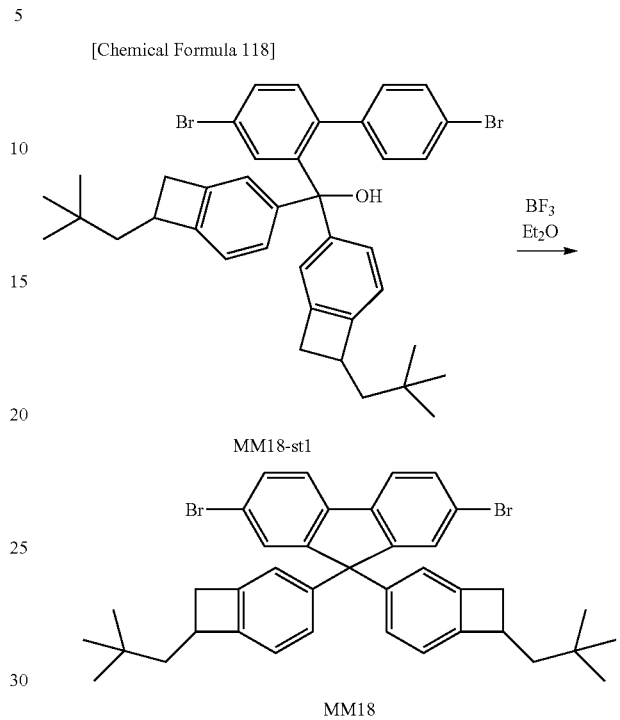

An argon gas atmosphere was prepared in a reaction vessel, then, the compound MM18-st1 (37.0 g) and methylene chloride (185 mL) were added, and the mixture was cooled down to 0° C. Thereafter, into this was dropped a BF$_3$.diethyl ether complex (95 g) over a period of 0.5 hours, then, the mixture was heated up to room temperature. To the resultant reaction mixture was added water, and an aqueous layer and an organic layer were separated. The resultant organic layer was washed with 10% by weight potassium phosphate water, and the resultant organic layer was further washed with water. To the resultant organic layer was added magnesium sulfate, and the mixture was filtrated, and the resultant filtrate was concentrated under reduced pressure. The resultant residue was dissolved in a mixed solvent of toluene and heptane, then, activated carbon (14.7 g) was added. The resultant mixture was filtrated, and the resultant filtrate was concentrated under reduced pressure, to obtain 42.3 g of a crude product. The crude product (57.2 g) obtained by repeating this operation was washed in a mixed solvent of ethanol and toluene while grinding, to obtain a white solid. The resultant white solid was recrystallized from a mixed solvent of butyl acetate and methanol, to obtain a white solid. The resultant white solid was recrystallized from a mixed solvent of toluene and methanol, to obtain a white solid. The resultant white solid was washed in acetonitrile while grinding, to obtain 25.5 g of a compound MM18 as a white solid.

LC-MS (ESI, positive): [M+K]$^+$ 707

$^1$H-NMR (CDCl$_3$, 300 MHz) δ (ppm): 0.97 (s, 18H), 1.56 (dd, 2H), 1.75 (dd, 2H), 2.71 (dd, 2H), 3.28 (dd, 2H), 3.47 (m, 2H), 6.79 (s, 2H), 6.91 (d, 2H), 6.98 (dd, 2H), 7.41-7.52 (m, 4H), 7.55 (d, 2H).

<Example 1> Synthesis of Polymer Compound 1

(Step 1) An inert gas atmosphere was prepared in a reaction vessel, then, the compound MM11 (1.3 g), the compound MM12 (1.1 g), the compound MM13 (70 mg), the compound MM15 (80 mg), dichlorobis(tris-o-methoxyphenylphosphine)palladium (1.3 mg) and toluene (42 mL) were added, and the mixture was heated at 105° C.

(Step 2) Into the reaction liquid was dropped a 20% by weight tetraethylammonium hydroxide aqueous solution (27 mL), and the mixture was refluxed for 8 hours.

(Step 3) After the reaction, to this were added the compound MM1 (138 mg) and dichlorobis(tris-o-methoxyphenylphosphine)palladium (1.3 mg), and the mixture was refluxed for 14 hours.

(Step 4) The reaction liquid was cooled, then, washed with water once, with 10% by weight dilute hydrochloric acid water twice, with a 3% by weight ammonia aqueous solution twice and with water twice, and the resultant solution was dropped into methanol, to observe precipitation. The precipitate was dissolved in toluene and the solution was purified by passing through an alumina column and a silica gel column in this order. The resultant solution was dropped into methanol, the mixture was stirred, then, the resultant precipitate was isolated by filtration and dried, to obtain 1.5 g of a polymer compound 1. The polymer compound 1 had a Mn of $4.7 \times 10^4$ and a Mw of $1.5 \times 10^5$.

The polymer compound 1 is a copolymer constituted of a constitutional unit derived from the compound MM11, a constitutional unit derived from the compound MM12, a constitutional unit derived from the compound MM13 and a constitutional unit derived from the compound MM15 at a molar ratio of 50:40:5:5 according to the theoretical values calculated from the amounts of the charged raw materials, the copolymer containing at the terminal a constitutional unit represented by the following formula derived from the compound MM1.

[Chemical Formula 119]

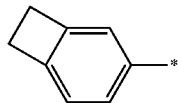

[wherein, * represents a position binding to an adjacent constitutional unit.].

<Example 2> Synthesis of Polymer Compound 2

(Step 1) An inert gas atmosphere was prepared in a reaction vessel, then, the compound MM11 (1.1 g), the compound MM12 (0.92 g), the compound MM13 (58 mg), the compound MM15 (66 mg), dichlorobis(tris-o-methoxyphenylphosphine)palladium (1.1 mg) and toluene (35 mL) were added, and the mixture was heated at 105° C.

(Step 2) Into the reaction liquid was dropped a 20% by weight tetraethylammonium hydroxide aqueous solution (22 mL), and the mixture was refluxed for 5 hours.

(Step 3) After the reaction, to this were added the compound MM2 (182 mg) and dichlorobis(tris-o-methoxyphenylphosphine)palladium (1.1 mg), and the mixture was refluxed overnight.

(Step 4) The reaction liquid was cooled, then, washed with water once, with 10% by weight dilute hydrochloric acid water twice, with a 3% by weight ammonia aqueous solution twice and with water twice, and the resultant solution was dropped into methanol, to observe precipitation. The precipitate was dissolved in toluene and the solution was purified by passing through an alumina column and a silica gel column in this order. The resultant solution was dropped into methanol, the mixture was stirred, then, the resultant precipitate was isolated by filtration and dried, to obtain 1.2 g of a polymer compound 2. The polymer compound 2 had a Mn of $4.7 \times 10^4$ and a Mw of $1.5 \times 10^5$.

The polymer compound 2 is a copolymer constituted of a constitutional unit derived from the compound MM11, a constitutional unit derived from the compound MM12, a constitutional unit derived from the compound MM13 and a constitutional unit derived from the compound MM15 at a molar ratio of 50:40:5:5 according to the theoretical values calculated from the amounts of the charged raw materials, the copolymer containing at the terminal a constitutional unit represented by the following formula derived from the compound MM2.

[Chemical Formula 120]

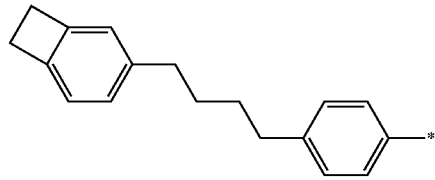

[wherein, * represents a position binding to an adjacent constitutional unit.]

<Example 3> Synthesis of Polymer Compound 3

(Step 1) An inert gas atmosphere was prepared in a reaction vessel, then, the compound MM11 (1.1 g), the compound MM12 (0.92 g), the compound MM15 (133 mg), dichlorobis(tris-o-methoxyphenylphosphine)palladium (1.1 mg) and toluene (36 mL) were added, and the mixture was heated at 105° C.

(Step 2) Into the reaction liquid was dropped a 20% by weight tetraethylammonium hydroxide aqueous solution (22 mL), and the mixture was refluxed for 5 hours.

(Step 3) After the reaction, to this were added the compound MM3 (218 mg) and dichlorobis(tris-o-methoxyphenylphosphine)palladium (1.1 mg), and the mixture was refluxed overnight.

(Step 4) The reaction liquid was cooled, then, washed with water once, with 10% by weight dilute hydrochloric acid water twice, with a 3% by weight ammonia aqueous solution twice and with water twice, and the resultant solution was dropped into methanol, to observe precipitation. The precipitate was dissolved in toluene and the solution was purified by passing through an alumina column and a silica gel column in this order. The resultant solution was dropped into methanol, the mixture was stirred, then, the resultant precipitate was isolated by filtration and dried, to obtain 1.3 g of a polymer compound 3. The polymer compound 3 had a Mn of $5.0 \times 10^4$ and a Mw of $1.5 \times 10^5$.

The polymer compound 3 is a copolymer constituted of a constitutional unit derived from the compound MM11, a constitutional unit derived from the compound MM12 and a constitutional unit derived from the compound MM15 at a molar ratio of 50:40:10 according to the theoretical values calculated from the amounts of the charged raw materials, the copolymer containing at the terminal a constitutional unit represented by the following formula derived from the compound MM3.

[Chemical Formula 121]

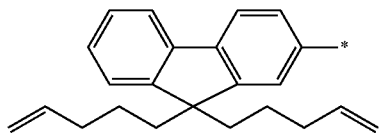

[wherein, * represents a position binding to an adjacent constitutional unit].

<Example 4> Synthesis of Polymer Compound 4

(Step 1) An inert gas atmosphere was prepared in a reaction vessel, then, the compound MM11 (1.1 g), the compound MM12 (0.92 g), the compound MM15 (133 mg), dichlorobis(tris-o-methoxyphenylphosphine)palladium (1.1 mg) and toluene (36 mL) were added, and the mixture was heated at 105° C.

(Step 2) Into the reaction liquid was dropped a 20% by weight tetraethylammonium hydroxide aqueous solution (22 mL), and the mixture was refluxed for 5 hours.

(Step 3) After the reaction, to this were added the compound MM2 (181 mg) and dichlorobis(tris-o-methoxyphenylphosphine)palladium (1.1 mg), and the mixture was refluxed overnight.

(Step 4) The reaction liquid was cooled, then, washed with water once, with 10% by weight dilute hydrochloric acid water twice, with a 3% by weight ammonia aqueous solution twice and with water twice, and the resultant solution was dropped into methanol, to observe precipitation. The precipitate was dissolved in toluene and the solution was purified by passing through an alumina column and a silica gel column in this order. The resultant solution was dropped into methanol, the mixture was stirred, then, the resultant precipitate was isolated by filtration and dried, to obtain 1.3 g of a polymer compound 4. The polymer compound 4 had a Mn of $5.1 \times 10^4$ and a Mw of $1.6 \times 10^5$.

The polymer compound 4 is a copolymer constituted of a constitutional unit derived from the compound MM11, a constitutional unit derived from the compound MM12 and a constitutional unit derived from the compound MM15 at a molar ratio of 50:40:10 according to the theoretical values calculated from the amounts of the charged raw materials, the copolymer containing at the terminal a constitutional unit represented by the following formula derived from the compound MM2.

[Chemical Formula 122]

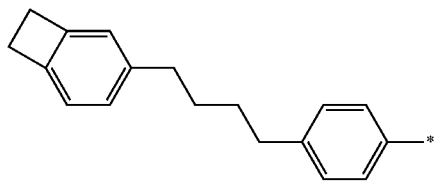

[wherein, * represents a position binding to an adjacent constitutional unit.].

<Example 5> Synthesis of Polymer Compound 5

(Step 1) An inert gas atmosphere was prepared in a reaction vessel, then, the compound MM11 (0.88 g), the compound MM16 (129 mg), the compound MM17 (62 mg), the compound MM12 (1.1 g), dichlorobis(tris-o-methoxyphenylphosphine)palladium (1.1 mg) and toluene (35 mL) were added, and the mixture was heated at 105° C.

(Step 2) Into the reaction liquid was dropped a 20% by weight tetraethylammonium hydroxide aqueous solution (23 mL), and the mixture was refluxed for 7.5 hours.

(Step 3) After the reaction, to this were added the compound MM1 (115 mg) and dichlorobis(tris-o-methoxyphenylphosphine)palladium (1.1 mg), and the mixture was refluxed overnight.

(Step 4) The reaction liquid was cooled, then, washed with water once, with 10% by weight dilute hydrochloric acid water twice, with a 3% by weight ammonia aqueous solution twice and with water twice, and the resultant solution was dropped into methanol, to observe precipitation. The precipitate was dissolved in toluene and the solution was purified by passing through an alumina column and a silica gel column in this order. The resultant solution was dropped into methanol, the mixture was stirred, then, the resultant precipitate was isolated by filtration and dried, to obtain 1.3 g of a polymer compound 5. The polymer compound 5 had a Mn of $3.9 \times 10^4$ and a Mw of $1.5 \times 10^5$.

The polymer compound 5 is a copolymer constituted of a constitutional unit derived from the compound MM11, a constitutional unit derived from the compound MM16, a constitutional unit derived from the compound MM17 and a constitutional unit derived from the compound MM12 at a molar ratio of 40:5:5:50 according to the theoretical values calculated from the amounts of the charged raw materials, the copolymer containing at the terminal a constitutional unit represented by the following formula derived from the compound MM1.

[Chemical Formula 123]

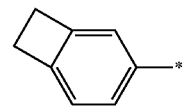

[wherein, * represents a position binding to an adjacent constitutional unit.].

<Example 6> Synthesis of Polymer Compound 6

(Step 1) An inert gas atmosphere was prepared in a reaction vessel, then, the compound MM11 (1.1 g), the compound MM12 (0.92 g), the compound MM13 (58 mg), the compound MM18 (84 mg), dichlorobis(tris-o-methoxyphenylphosphine)palladium (1.1 mg) and toluene (36 mL) were added, and the mixture was heated at 105° C.

(Step 2) Into the reaction liquid was dropped a 20% by weight tetraethylammonium hydroxide aqueous solution (23 mL), and the mixture was refluxed for 7 hours.

(Step 3) After the reaction, to this were added the compound MM4 (150 mg) and dichlorobis(tris-o-methoxyphenylphosphine)palladium (1.1 mg), and the mixture was refluxed for 16 hours.

(Step 4) The reaction liquid was cooled, then, washed with water once, with 10% by weight dilute hydrochloric acid water twice, with a 3% by weight ammonia aqueous solution twice and with water twice, and the resultant solution was dropped into methanol, to observe precipitation. The precipitate was dissolved in toluene and the solution was purified by passing through an alumina column and a silica gel column in this order. The resultant solution was dropped into methanol, the mixture was stirred, then, the resultant precipitate was isolated by filtration and dried, to obtain 1.2 g of a polymer compound 6. The polymer compound 6 had a Mn of $4.9 \times 10^4$ and a Mw of $1.5 \times 10^5$.

The polymer compound 6 is a copolymer constituted of a constitutional unit derived from the compound MM11, a constitutional unit derived from the compound MM12, a constitutional unit derived from the compound MM13 and a constitutional unit derived from the compound MM18 at a molar ratio of 50:40:5:5 according to the theoretical values calculated from the amounts of the charged raw materials, the copolymer containing at the terminal a constitutional unit represented by the following formula derived from the compound MM4.

[Chemical Formula 124]

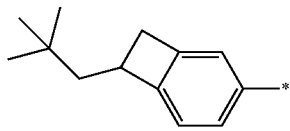

[wherein, * represents a position binding to an adjacent constitutional unit.].

<Comparative Example 1> Synthesis of Polymer Compound C1

(Step 1) An inert gas atmosphere was prepared in a reaction vessel, then, the compound MM11 (1.1 g), the compound MM12 (920 mg), the compound MM13 (58 mg), the compound MM15 (67 mg), dichlorobis(tris-o-methoxyphenylphosphine)palladium (1.1 mg) and toluene (35 mL) were added, and the mixture was heated at 105° C.

(Step 2) Into the reaction liquid was dropped a 20% by weight tetraethylammonium hydroxide aqueous solution (22 mL), and the mixture was refluxed for 6 hours.

(Step 3) After the reaction, to this were added phenylboronic acid (61 mg) and dichlorobis(tris-o-methoxyphenylphosphine)palladium (1.1 mg), and the mixture was refluxed for 18 hours.

(Step 4) The reaction liquid was cooled, then, washed with water once, with 10% by weight dilute hydrochloric acid water twice, with a 3% by weight ammonia aqueous solution twice and with water twice, and the resultant solution was dropped into methanol, to observe precipitation. The precipitate was dissolved in toluene and the solution was purified by passing through an alumina column and a silica gel column in this order. The resultant solution was dropped into methanol, the mixture was stirred, then, the resultant precipitate was isolated by filtration and dried, to obtain 1.3 g of a polymer compound C1. The polymer compound C1 had a Mn of $4 \times 10^4$ and a Mw of $1.4 \times 10^5$.

The polymer compound C1 is a copolymer constituted of a constitutional unit derived from the compound MM11, a constitutional unit derived from the compound MM12, a constitutional unit derived from the compound MM13 and a constitutional unit derived from the compound MM15 at a molar ratio of 50:40:5:5 according to the theoretical values calculated from the amounts of the charged raw materials, the copolymer containing at the terminal a constitutional unit represented by the following formula derived from phenylboronic acid.

[Chemical Formula 125]

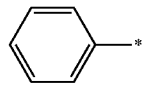

[wherein, * represents a position binding to an adjacent constitutional unit.].

<Comparative Example 2> Synthesis of Polymer Compound C2

(Step 1) An inert gas atmosphere was prepared in a reaction vessel, then, the compound MM11 (1.3 g), the compound MM12 (1.1 g), the compound MM10 (72 mg), the compound MM14 (85 mg), dichlorobis(tris-o-methoxyphenylphosphine)palladium (1.3 mg) and toluene (42 mL) were added, and the mixture was heated at 105° C.

(Step 2) Into the reaction liquid was dropped a 20% by weight tetraethylammonium hydroxide aqueous solution (27 mL), and the mixture was refluxed for 6 hours.

(Step 3) After the reaction, to this were added the compound MM1 (140 mg) and dichlorobis(tris-o-methoxyphenylphosphine)palladium (1.3 mg), and the mixture was refluxed for 17 hours.

(Step 4) The reaction liquid was cooled, then, washed with water once, with 10% by weight dilute hydrochloric acid water twice, with a 3% by weight ammonia aqueous solution twice and with water twice, and the resultant solution was dropped into methanol, to observe precipitation. The precipitate was dissolved in toluene and the solution was purified by passing through an alumina column and a silica gel column in this order. The resultant solution was dropped into methanol, the mixture was stirred, then, the resultant precipitate was isolated by filtration and dried, to obtain 1.3 g of a polymer compound C2. The polymer compound C2 had a Mn of $4.6 \times 10^4$ and a Mw of $1.4 \times 10^5$.

The polymer compound C2 is a copolymer constituted a constitutional unit derived from the compound MM11, a constitutional unit derived from the compound MM12, a constitutional unit derived from the compound MM10 and a constitutional unit derived from the compound MM14 at a molar ratio of 50:40:5:5 according to the theoretical values calculated from the amounts of the charged raw materials, the copolymer containing at the terminal a constitutional unit represented by the following formula derived from the compound MM1.

[Chemical Formula 126]

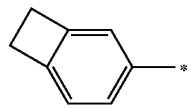

[wherein, * represents a position binding to an adjacent constitutional unit].

<Synthesis Example 24> Synthesis of Polymer Compound E1

(Synthesis of Polymer Compound E1)

An inert gas atmosphere was prepared in a reaction vessel, then, the compound MM14 (9.0 g), the compound MM20 (1.3 g), the compound MM19 (13.4 g), tetraethylammonium hydroxide (43.0 g), palladium acetate (8 mg), tri(2-methoxyphenyl)phosphine (0.05 g) and toluene (200 mL) were added, and the mixture was stirred for 8 hours with heating at 90° C. Thereafter, to this was added phenylboronic acid (0.22 g), and the mixture was stirred for 14 hours with heating at 90° C. The resultant mixture was cooled, then, an aqueous layer was removed. To the resultant organic layer was added a sodium diethyldithiocarbamate aqueous solution, and the mixture was stirred, then, an aqueous layer was removed. The resultant organic layer was washed with water and 3% by weight acetic acid water. The resultant organic layer was poured into methanol to cause precipitation of a solid, then, the solid was isolated by filtration and again dissolved in toluene, and the solution was allowed to pass through a silica gel column and an alumina column. The eluted toluene solution containing the solid was collected, and the collected toluene solution was poured into methanol to cause precipitation of a solid. The solid isolated by filtration was dried in vacuum at 50° C., to obtain 12.5 g of a polymer compound E1. The polymer compound E1 had a Mw of $3.1 \times 10^5$.

The polymer compound E1 is a copolymer constituted of a constitutional unit derived from the compound MM19, a constitutional unit derived from the compound MM14 and a constitutional unit derived from the compound MM20 at a molar ratio of 50:45:5 according to the theoretical values calculated from the amounts of the charged raw materials, the copolymer containing at the terminal a constitutional unit represented by the following formula derived from phenylboronic acid.

[Chemical Formula 127]

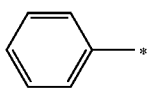

[wherein, * represents a position binding to an adjacent constitutional unit.].

Evaluation Example 1 of Film Residual Ratio

The polymer compound 1 was dissolved in xylene, to prepare a 0.7% by weight xylene solution. On a glass substrate, this xylene solution was spin-coated to form a film with a thickness of 20 nm, then, the film was heated on a hot plate at 180° C. for 60 minutes in a nitrogen gas atmosphere. Thereafter, it was cooled down to room temperature, to fabricate a measurement sample 1-1.

Next, the light transmission of the measurement sample 1-1 was measured, and the minimum transmission ($T_1$) of the measurement sample 1-1 was determined. $T_1$ of the measurement sample 1-1 was 0.701. For the measurement, a light transmission measurement apparatus (manufactured by Varian, Inc., trade name: Cary 5E ultraviolet.visible spectral photometer) was used and the wavelength sweeping in measuring light transmission was from 300 to 600 nm.

Next, the measurement sample 1-1 was immersed in xylene, the mixture was stirred for 60 minutes, then, the product was taken out from xylene. Thereafter, the product was placed on a spin coater and dried by rotating at 1000 rpm for 10 seconds, to fabricate a measurement sample 1-2.

Next, the light transmission of the measurement sample 1-2 was measured and the minimum transmission ($T_2$) of the measurement sample 1-2 was calculated in the same manner as for the measurement sample 1-1. $T_2$ of the measurement sample 1-2 was 0.701.

The film residual ratio of a film using the polymer compound 1 was calculated using the following formula, to find a value of 100%. The results are shown in Table 6.

Film residual ratio (%)=$(\log_e T_2/\log_e T_1) \times 100$

Evaluation Example 2 of Film Residual Ratio

A measurement sample 2-1 before immersion into xylene was fabricated and the minimum transmission ($T_1$) of the measurement sample 2-1 was determined in the same manner as in Evaluation Example 1 of film residual ratio excepting that a polymer compound 2 was used instead of the polymer compound 1 in Evaluation Example 1 of film residual ratio. $T_1$ of the measurement sample 2-1 was 0.730. Next, a measurement sample 2-2 after immersion into xylene was fabricated, and the minimum transmission ($T_2$) of the measurement sample 2-2 was determined. $T_2$ of the measurement sample 2-2 was 0.740. The film residual ratio of a film using the polymer compound 2 was calculated using the above-described formula, to find a value of 95.7%. The results are shown in Table 6.

Evaluation Example 3 of Film Residual Ratio

A measurement sample 3-1 before immersion into xylene was fabricated and the minimum transmission ($T_1$) of the measurement sample 3-1 was determined in the same manner as in Evaluation Example 1 of film residual ratio excepting that a polymer compound 3 was used instead of the polymer compound 1 in Evaluation Example 1 of film residual ratio. $T_1$ of the measurement sample 3-1 was 0.726. Next, a measurement sample 3-2 after immersion into xylene was fabricated, and the minimum transmission ($T_2$) of the measurement sample 3-2 was determined. $T_2$ of the measurement sample 3-2 was 0.751. The film residual ratio of a film using the polymer compound 3 was calculated using the above-described formula, to find a value of 89.4%. The results are shown in Table 6.

Evaluation Example 4 of Film Residual Ratio

A measurement sample 4-1 before immersion into xylene was fabricated and the minimum transmission ($T_1$) of the measurement sample 4-1 was determined in the same manner as in Evaluation Example 1 of film residual ratio excepting that a polymer compound 4 was used instead of the polymer compound 1 in Evaluation Example 1 of film residual ratio. $T_1$ of the measurement sample 4-1 was 0.727. Next, a measurement sample 4-2 after immersion into xylene was fabricated, and the minimum transmission ($T_2$) of the measurement sample 4-2 was determined. $T_2$ of the measurement sample 4-2 was 0.727. The film residual ratio of a film using the polymer compound 4 was calculated using the above-described formula, to find a value of 100%. The results are shown in Table 6.

Evaluation Example 5 of Film Residual Ratio

A measurement sample 5-1 before immersion into xylene was fabricated and the minimum transmission ($T_1$) of the measurement sample 5-1 was determined in the same manner as in Evaluation Example 1 of film residual ratio excepting that a polymer compound 5 was used instead of the polymer compound 1 in Evaluation Example 1 of film residual ratio. $T_1$ of the measurement sample 5-1 was 0.753. Next, a measurement sample 5-2 after immersion into xylene was fabricated, and the minimum transmission ($T_2$) of the measurement sample 5-2 was determined. $T_2$ of the measurement sample 5-2 was 0.761. The film residual ratio of a film using the polymer compound 5 was calculated using the above-described formula, to find a value of 96.3. The results are shown in Table 6.

Evaluation Example 6 of Film Residual Ratio

A measurement sample 6-1 before immersion into xylene was fabricated and the minimum transmission ($T_1$) of the measurement sample 6-1 was determined in the same manner as in Evaluation Example 1 of film residual ratio excepting that a polymer compound 6 was used instead of the polymer compound 1 in Evaluation Example 1 of film residual ratio. $T_1$ of the measurement sample 6-1 was 0.723. Next, a measurement sample 6-2 after immersion into xylene was fabricated, and the minimum transmission ($T_2$) of the measurement sample 6-2 was determined. $T_2$ of the measurement sample 6-2 was 0.724. The film residual ratio of a film using the polymer compound 6 was calculated using the above-described formula, to find a value of 99.6%. The results are shown in Table 6.

Evaluation Comparative Example 1 of Film Residual Ratio

A measurement sample C1-1 before immersion into xylene was fabricated and the minimum transmission ($T_1$) of the measurement sample C1-1 was determined in the same manner as in Evaluation Example 1 of film residual ratio excepting that a polymer compound C1 was used instead of the polymer compound 1 in Evaluation Example 1 of film residual ratio. $T_1$ of the measurement sample C1-1 was 0.702. Next, a measurement sample C1-2 after immersion into xylene was fabricated, and the minimum transmission ($T_2$) of the measurement sample C1-2 was determined. $T_2$ of the measurement sample C1-2 was 0.755. The film residual ratio of a film using the polymer compound C1 was calculated using the above-described formula, to find a value of 79.4%. The results are shown in Table 6.

Evaluation Comparative Example 2 of Film Residual Ratio

A measurement sample C2-1 before immersion into xylene was fabricated and the minimum transmission ($T_1$) of the measurement sample C2-1 was determined in the same manner as in Evaluation Example 1 of film residual ratio excepting that a polymer compound C2 was used instead of the polymer compound 1 in Evaluation Example 1 of film residual ratio. $T_1$ of the measurement sample C2-1 was 0.702. Next, a measurement sample C2-2 after immersion into xylene was fabricated, and the minimum transmission ($T_2$) of the measurement sample C2-2 was determined. $T_2$ of the measurement sample C2-2 was 0.785. The film residual ratio of a film using the polymer compound C2 was calculated using the above-described formula, to find a value of 68.4%. The results are shown in Table 6.

TABLE 6

| | polymer compound | film residual ratio |
|---|---|---|
| Evaluation Example 1 | polymer compound 1 | 100% |
| Evaluation Example 2 | polymer compound 2 | 95.7% |
| Evaluation Example 3 | polymer compound 3 | 89.4% |
| Evaluation Example 4 | polymer compound 4 | 100% |
| Evaluation Example 5 | polymer compound 5 | 96.3% |
| Evaluation Example 6 | polymer compound 6 | 99.6% |
| Evaluation Comparative Example 1 | polymer compound C1 | 79.4% |
| Evaluation Comparative Example 2 | polymer compound C2 | 68.4% |

These results show that the crosslinkability of the polymer compound 1 to the polymer compound 6 is more excellent than the crosslinkability of the polymer compound C1 and the polymer compound C2 because the film residual ratio of a film using the polymer compound 1 to the polymer compound 6 is more excellent than the film residual ratio of a film using the polymer compound C1 and the polymer compound C2.

<Example D1> Fabrication and Evaluation of Light Emitting Device D1

(Formation of Anode and Hole Injection Layer)

A glass substrate was attached with an ITO film with a thickness of 45 nm by a sputtering method, to form an anode. On the anode, a polythiophene.sulfonic acid type hole injection agent AQ-1200 (manufactured by Plextronics) was spin-coated to form a film with a thickness of 35 nm, and the film was heated on a hot plate at 170° C. for 15 minutes under an air atmosphere, to form a hole injection layer.

(Formation of Hole Transporting Layer)

The polymer compound 1 was dissolved at a concentration of 0.7% by weight in xylene. The resultant xylene solution was spin-coated on the hole injection layer to form a film with a thickness of 20 nm, and the film was heated on a hot plate at 180° C. for 30 minutes under a nitrogen gas atmosphere, to form a hole transporting layer.

(Formation of Light Emitting Layer)

The polymer compound E1 was dissolved at a concentration of 1.1% by weight in xylene. The resultant xylene solution was spin-coated on the hole transporting layer to form a film with a thickness of 60 nm, and the film was heated on a hot plate at 150° C. for 10 minutes under a nitrogen gas atmosphere, to form a light emitting layer.

(Formation of Cathode)

The substrate carrying the light emitting layer formed thereon was placed in a vapor deposition machine and the internal pressure thereof was reduced to $1\times10^{-4}$ Pa or less, then, as a cathode, sodium fluoride was vapor-deposited with a thickness of about 7 nm on the light emitting layer, then, aluminum was vapor-deposited with a thickness of about 120 nm on this. After vapor deposition, sealing with a glass substrate was performed, to fabricate a light emitting device D1.

(Evaluation of Light Emitting Device)

When voltage was applied to the light emitting device D1, EL light emission having a peak at 450 nm was observed. The external quantum efficiency (EQE) of the light emitting device D1 at 1000 cd/m² was 5.8%. The current value was set so that the initial luminance was 5000 cd/m², then, the device was driven at constant current and the temporal change of luminance was measured. As a result, the time (LT50) until the luminance became 50% of the initial luminance was 10.7 hours.

Example CD1: Fabrication and Evaluation of Light Emitting Device CD1

A light emitting device CD1 was fabricated in the same manner as in Example D1 excepting that a polymer compound C1 was used instead of the polymer compound 1 in Example D1.

When voltage was applied to the light emitting device CD1, EL light emission having a peak at 450 nm was observed. The external quantum efficiency (EQE) of the light emitting device CD1 at 1000 cd/m² was 5.2%. The current value was set so that the initial luminance was 5000 cd/m², then, the device was driven at constant current and the temporal change of luminance was measured. As a result, the time (LT50) until the luminance became 50% of the initial luminance was 7.9 hours.

Example CD2: Fabrication and Evaluation of Light Emitting Device CD2

A light emitting device CD2 was fabricated in the same manner as in Example D1 excepting that a polymer compound C2 was used instead of the polymer compound 1 in Example D1.

When voltage was applied to the light emitting device CD2, EL light emission having a peak at 450 nm was observed. The external quantum efficiency (EQE) of the light emitting device CD2 at 1000 cd/m² was 4.0%. The current value was set so that the initial luminance was 5000 cd/m², then, the device was driven at constant current and the temporal change of luminance was measured. As a result, the time (LT50) until the luminance became 50% of the initial luminance was 8.4 hours.

These results show that the external quantum efficiency and the luminance life of a light emitting device using the polymer compound 1 are more excellent than the external quantum efficiency and the luminance life of light emitting devices using the polymer compound C1 and the polymer compound C2 respectively.

INDUSTRIAL APPLICABILITY

According to the present invention, a polymer compound excellent in crosslinkability can be provided. Also, according to the present invention, a method for producing the polymer compound can be provided. Further, according to the present invention, a composition comprising the polymer compound and a light emitting device produced by using the polymer compound can be provided.

The invention claimed is:

1. A polymer compound comprising:

at least one terminal constitutional unit represented by the following formula (1) and a constitutional unit represented by the following formula (2):

(1)

wherein mT represents an integer of 0 to 5, nT represents an integer of 1 to 4, and cT represents 1, and when there are a plurality of mT, they can be the same or different, $Q^T$ represents a crosslinkable group represented by the following formula (XL-1), (XL-7), (XL-16) or (XL-17), and when there are a plurality of $Q^T$, they can be the same or different, $K^T$ represents an alkylene group, a cycloalkylene group, an arylene group, a divalent heterocyclic group, a group represented by —NR'—, an oxygen atom or a sulfur atom, the foregoing groups each optionally having a substituent, wherein R' represents a hydrogen atom, an alkyl group, a cycloalkyl group, an aryl group or a monovalent heterocyclic group, the foregoing groups each optionally having a substituent, and when there are a plurality of $K^T$, they can be the same or different, and $Ar^T$ represents a group obtained by removing from a benzene ring optionally having a substituent, a fluorene ring optionally having a substituent, a naphthalene ring optionally having a substituent, a phenanthrene ring optionally having a substituent or a dihydrophenanthrene ring optionally having a substituent (nT+1) hydrogen atoms attached directly to carbon atoms constituting the ring;

(2)

wherein mA represents an integer of 0 to 5, and n represents 1 or 2, and when there are a plurality of mA, they can be the same or different, $Ar^1$ represents an aromatic hydrocarbon group optionally having a substituent, $K^A$ represents an alkylene group, a cycloalkylene group, an arylene group, an oxygen atom or a sulfur atom, the foregoing groups each optionally having a substituent, and when there are a plurality of $K^A$, they can be the same or different, and $Q^1$ represents a crosslinkable group selected from Group A of crosslinkable groups, and when there are a plurality of $Q^1$, they can be the same or different;

wherein Group A is a crosslinkable group selected from the group consisting of:

(XL-1)
(XL-2)
(XL-3)
(XL-4)
(XL-5)
(XL-6)
(XL-7)

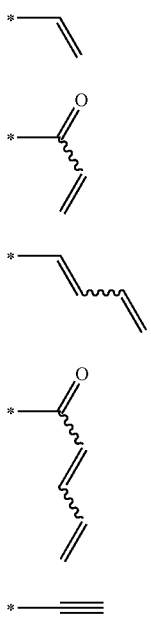

(XL-8)
(XL-9)
(XL-10)
(XL-11)
(XL-12)

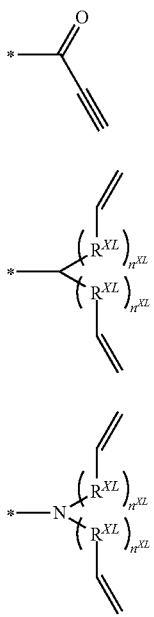
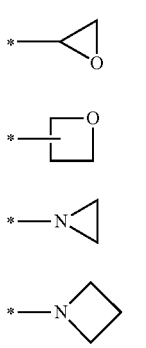

(XL-13)
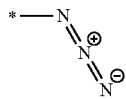

(XL-14)
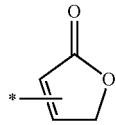

(XL-15)
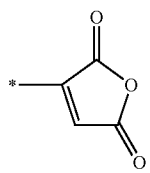

(XL-16) and (XL-17)

wherein $R^{XL}$ represents a methylene group, an oxygen atom or a sulfur atom, and $n^{XL}$ represents an integer of 0 to 5, and when there are a plurality of $R^{XL}$, they can be the same or different, and when there are a plurality of $n^{XL}$, they can be the same or different, and * represents a binding site, the foregoing crosslinkable groups each optionally having a substituent.

2. The polymer compound according to claim 1, wherein $Q^1$ is a crosslinkable group represented by the formula (XL-1), (XL-7), (XL-16) or (XL-17).

3. The polymer compound according to claim 1, further comprising a constitutional unit represented by the following formula (X):

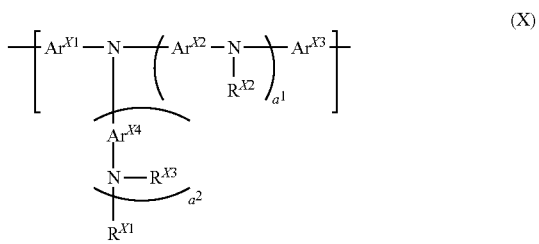

(X)

wherein
$a^1$ and $a^2$ each independently represent an integer of 0 or more,
$Ar^{X1}$ and $Ar^{X3}$ each independently represent an arylene group or a divalent heterocyclic group, the foregoing groups each optionally having a substituent,
$Ar^{X2}$ and $Ar^{X4}$ each independently represent an arylene group, a divalent heterocyclic group or a divalent group in which at least one type of arylene group and at least one type of divalent heterocyclic group are bonded directly to each other, the foregoing groups each optionally having a substituent, and when there are a plurality of $Ar^{X2}$ or $Ar^{X4}$, they can be the same or different at each occurrence, and $R^{X\,1}$, $R^{X\,2}$ and $R^{X\,3}$ each independently represent a hydrogen atom, an alkyl group, a cycloalkyl group, an aryl group or a monovalent heterocyclic group, the foregoing groups each optionally having a substituent, and when there are a plurality of $R^{X\,2}$ or $R^{X\,3}$, they can be the same or different at each occurrence.

4. The polymer compound according to claim 1, further comprising a constitutional unit represented by the following formula (Y):

  (Y)

wherein $Ar^{Y\,1}$ represents an arylene group, a divalent heterocyclic group or a divalent group in which at least one type of arylene group and at least one type of divalent heterocyclic group are bonded directly to each other, the foregoing groups each optionally having a substituent.

5. The polymer compound according to claim 4, wherein the constitutional unit represented by the formula (Y) is a constitutional unit represented by the following formula (Y-1) or a constitutional unit represented by the following formula (Y-2):

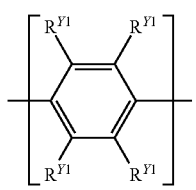  (Y-1)

wherein $R^{Y1}$ represents a hydrogen atom, an alkyl group, a cycloalkyl group, an alkoxy group, a cycloalkoxy group, an aryl group or a monovalent heterocyclic group, the foregoing groups each optionally having a substituent, and the plurality of $R^{Y\,1}$ can be the same or different, and adjacent groups $R^{Y\,1}$ can be combined together to form a ring together with the carbon atoms to which they are attached:

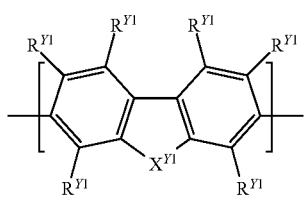  (Y-2)

wherein
$R^{Y\,1}$ is as defined above, and
$X^{Y\,1}$ represents a group represented by —C($R^{Y\,2}$)$_2$—, —C($R^{Y\,2}$)=C($R^{Y\,2}$)— or —C($R^{Y\,2}$)$_2$—C($R^{Y\,2}$)$_2$—, wherein $R^{Y\,2}$ represents a hydrogen atom, an alkyl group, a cycloalkyl group, an alkoxy group, a cycloalkoxy group, an aryl group or a monovalent heterocyclic group, the foregoing groups each optionally having a substituent, and the plurality of $R^{Y\,2}$ can be the same or different, and groups $R^{Y\,2}$ can be combined together to form a ring together with the carbon atoms to which they are attached.

6. The polymer compound according to claim 1, wherein the terminal constitutional unit represented by the formula (1) is contained in an amount of 0.1 mol % to 20 mol % with respect to the total amount of constitutional units contained in the polymer compound.

7. A method for producing a polymer compound comprising:
at least one terminal constitutional unit represented by the following formula (1) and
at least one type of constitutional unit selected from the group consisting of constitutional units represented by the following formula (2) and constitutional units represented by the following formula (2'),
wherein the terminal constitutional unit represented by the formula (1) is contained in an amount of 0.1 mol % to 20 mol % with respect to the total amount of constitutional units contained in the polymer compound,
the method comprising:
a step of condensation-polymerizing at least one type of compound selected from the group consisting of a compound represented by the following formula (2M) and a compound represented by the following formula (2'M), and
a step of end capping with a compound represented by the following formula (1M):

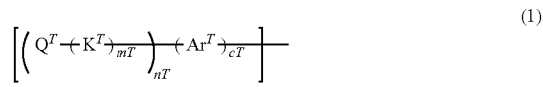  (1)

wherein
mT represents an integer of 0 to 5, nT represents an integer of 1 to 4, and cT represents 0 or 1, and when there are a plurality of mT, they can be the same or different, and nT is 1 when cT is 0,
$Q^T$ represents a crosslinkable group represented by the following formula (XL-1), (XL-7), (XL-16) or (XL-17), and when there are a plurality of $Q^T$, they can be the same or different,
$K^T$ represents an alkylene group, a cycloalkylene group, an arylene group, a divalent heterocyclic group, a group represented by —NR'—, an oxygen atom or a sulfur atom, the foregoing groups each optionally having a substituent, wherein R' represents a hydrogen atom, an alkyl group, a cycloalkyl group, an aryl group or a monovalent heterocyclic group, the foregoing groups each optionally having a substituent, and when there are a plurality of $K^T$, they can be the same or different, and
$Ar^T$ represents an aromatic hydrocarbon group or a heterocyclic group, the foregoing groups each optionally having a substituent,

  (2)

wherein
mA represents an integer of 0 to 5, and n represents 1 or 2, and when there are a plurality of mA, they can be the same or different, Ar¹ represents an aromatic hydrocarbon group or a heterocyclic group, the foregoing groups each optionally having a substituent, K$^A$ represents an alkylene group, a cycloalkylene group, an arylene group, a divalent heterocyclic group, a group represented by —NR″—, an oxygen atom or a sulfur atom, the foregoing groups each optionally having a substituent, wherein R″ represents a hydrogen atom, an alkyl group, a cycloalkyl group, an aryl group or a monovalent heterocyclic group, the foregoing groups each optionally having a substituent, and when there are a plurality of K$^A$, they can be the same or different, and Q¹ represents a crosslinkable group selected from Group A of crosslinkable groups, and when there are a plurality of Q¹, they can be the same or different;

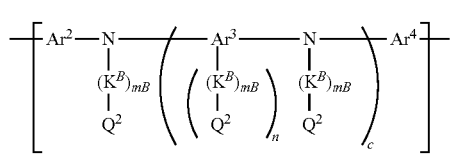

(2′)

wherein
mB represents an integer of 0 to 5, m represents an integer of 1 to 4, and c represents 0 or 1, and when there are a plurality of mB, they can be the same or different, Ar³ represents an aromatic hydrocarbon group, a heterocyclic group or a group in which at least one type of aromatic hydrocarbon ring and at least one type of heterocyclic ring are bonded directly to each other, the foregoing groups each optionally having a substituent, Ar² and Ar⁴ each independently represent an arylene group or a divalent heterocyclic group, the foregoing groups each optionally having a substituent, each of groups Ar2, Ar3 and Ar4 is optionally bonded directly or via an oxygen atom or a sulfur atom to a group that is attached to the nitrogen atom to which that group is attached but that is different from that group itself, thereby forming a ring, K$^B$ represents an alkylene group, a cycloalkylene group, an arylene group, a divalent heterocyclic group, a group represented by —NR‴—, an oxygen atom or a sulfur atom, the foregoing groups each optionally having a substituent, wherein R‴ represents a hydrogen atom, an alkyl group, a cycloalkyl group, an aryl group or a monovalent heterocyclic group, the foregoing groups each optionally having a substituent, and when there are a plurality of K$^B$, they can be the same or different, and Q² represents a crosslinkable group selected from Group A of crosslinkable groups, a hydrogen atom, an alkyl group, a cycloalkyl group, an aryl group or a monovalent heterocyclic group, the foregoing groups each optionally having a substituent, and when there are a plurality of Q², they can be the same or different, provided that at least one Q² is a crosslinkable group selected from Group A of crosslinkable groups, wherein Group A is a crosslinkable group selected from the group consisting of:

(XL-1)

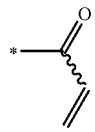

(XL-2)

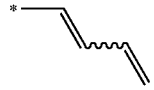

(XL-3)

(XL-4)

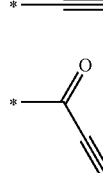

(XL-5)

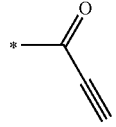

(XL-6)

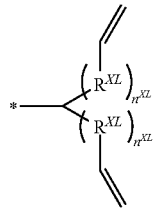

(XL-7)

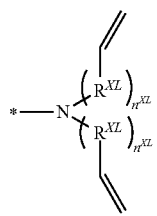

(XL-8)

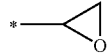

(XL-9)

(XL-10)

(XL-11)

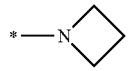

(XL-12)

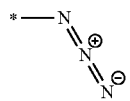

(XL-13)

-continued

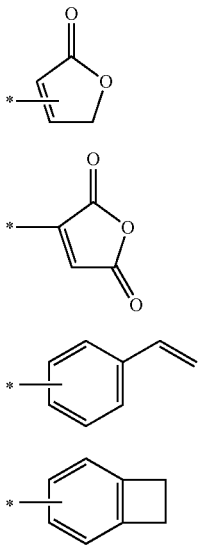

wherein $R^{XL}$ represents a methylene group, an oxygen atom or a sulfur atom, and $n^{XL}$ represents an integer of 0 to 5, and when there are a plurality of $R^{XL}$, they can be the same or different, and when there are a plurality of $n^{XL}$, they can be the same or different, and * represents a binding site, the foregoing crosslinkable groups each optionally having a substituent,

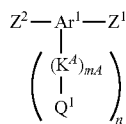
(2M)

wherein
mA, n, Ar¹, $K^A$ and Q¹ are as defined above, and
Z¹ and Z² each independently represent a group selected from Group A of substituents or a group selected from Group B of substituents,

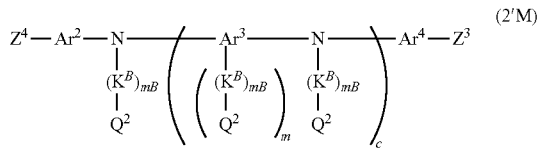
(2'M)

wherein
mB, m, c, Ar², Ar³, Ar⁴, $K^B$ and Q² are as defined above, and
Z³ and Z⁴ each independently represent a group selected from Group A of substituents or a group selected from Group B of substituents,

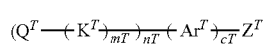
(1M)

wherein
mT, nT, cT, $Q^T$, $K^T$ and $Ar^T$ are as defined above, and
$Z^T$ represents a group selected from Group A of substituents or a group selected from Group B of substituents:

Group A is a substituent selected from the group consisting of a chlorine atom, a bromine atom, an iodine atom, and a group represented by $-O-S(=O)_2 R^{C1}$, wherein $R^{C1}$ represents an alkyl group, a cycloalkyl group or an aryl group, the foregoing groups each optionally having a substituent, Group B is a substituent selected from the group consisting of a group represented by $-B(OR^{C2})_2$, wherein $R^{C2}$ represents a hydrogen atom, an alkyl group, a cycloalkyl group or an aryl group, the foregoing groups each optionally having a substituent, and the plurality of $R^{C2}$ can be the same or different and can be combined together to form a cyclic structure together with the oxygen atoms to which they are attached;

a group represented by $-BF_3Q'$, wherein Q' represents Li, Na, K, Rb or Cs;

a group represented by $-MgY'$, wherein Y' represents a chlorine atom, a bromine atom or an iodine atom;

a group represented by $-ZnY''$, wherein Y'' represents a chlorine atom, a bromine atom or an iodine atom; and a group represented by $-Sn(R^{C3})_3$, wherein $R^{C3}$ represents a hydrogen atom, an alkyl group, a cycloalkyl group or an aryl group, the foregoing groups each optionally having a substituent, and the plurality of $R^{C3}$ can be the same or different and can be combined together to form a cyclic structure together with the tin atom to which they are attached.

8. A polymer compound comprising:
at least one terminal constitutional unit represented by the following formula (1) and
at least one type of constitutional unit selected from the group consisting of constitutional units represented by the following formula (2) and constitutional units represented by the following formula (2'),
wherein the terminal constitutional unit represented by the formula (1) is contained in an amount of 0.1 mol % to 20 mol % with respect to the total amount of constitutional units contained in the polymer compound,
wherein the polymer compound is produced by a production method comprising:
a step of condensation-polymerizing at least one type of compound selected from the group consisting of a compound represented by the following formula (2M) and a compound represented by the following formula (2'M), and
a step of end capping with a compound represented by the following formula (1M):

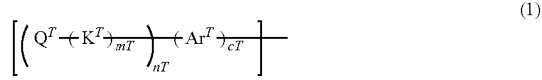
(1)

wherein
mT represents an integer of 0 to 5, nT represents an integer of 1 to 4, and cT represents 0 or 1, and when there are a plurality of mT, they can be the same or different, and nT is 1 when cT is 0,
$Q^T$ represents a crosslinkable group represented by the following formula (XL-1), (XL-7), (XL-16) or (XL-17), and when there are a plurality of $Q^T$, they can be the same or different, $K^T$ represents an alkylene group, a cycloalkylene group, an arylene group, a divalent heterocyclic group, a group represented by —NR'—, an oxygen atom or a sulfur atom, the foregoing groups each optionally having a substituent, wherein R' represents a hydrogen atom, an alkyl group, a cycloalkyl group, an aryl group or a monovalent heterocyclic group, the foregoing groups each optionally having a substituent, and when there are a plurality of $K^T$, they can be the same or different, and $Ar^T$ represents an aromatic hydrocarbon group or a heterocyclic group, the foregoing groups each optionally having a substituent,

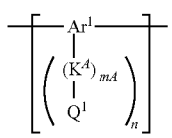
(2)

wherein
mA represents an integer of 0 to 5, and n represents 1 or 2, and when there are a plurality of mA, they can be the same or different, $Ar^1$ represents an aromatic hydrocarbon group or a heterocyclic group, the foregoing groups each optionally having a substituent, $K^A$ represents an alkylene group, a cycloalkylene group, an arylene group, a divalent heterocyclic group, a group represented by —NR"—, an oxygen atom or a sulfur atom, the foregoing groups each optionally having a substituent, wherein R" represents a hydrogen atom, an alkyl group, a cycloalkyl group, an aryl group or a monovalent heterocyclic group, the foregoing groups each optionally having a substituent, and when there are a plurality of $K^A$, they can be the same or different, and $Q^1$ represents a crosslinkable group selected from Group A of crosslinkable groups, and when there are a plurality of $Q^1$, they can be the same or different

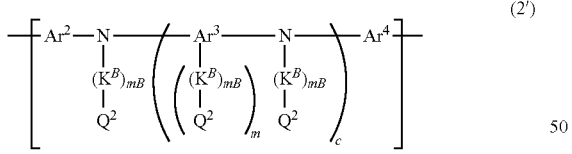
(2')

wherein
mB represents an integer of 0 to 5, m represents an integer of 1 to 4, and c represents 0 or 1, and when there are a plurality of mB, they can be the same or different, $Ar^3$ represents an aromatic hydrocarbon group, a heterocyclic group or a group in which at least one type of aromatic hydrocarbon ring and at least one type of heterocyclic ring are bonded directly to each other, the foregoing groups each optionally having a substituent, $Ar^2$ and $Ar^4$ each independently represent an arylene group or a divalent heterocyclic group, the foregoing groups each optionally having a substituent, each of groups Ar2, Ar3 and Ar4 is optionally bonded directly or via an oxygen atom or a sulfur atom to a group that is attached to the nitrogen atom to which that group is attached but that is different from that group itself, thereby forming a ring, $K^B$ represents an alkylene group, a cycloalkylene group, an arylene group, a divalent heterocyclic group, a group represented by —NR'''—, an oxygen atom or a sulfur atom, the foregoing groups each optionally having a substituent, wherein R''' represents a hydrogen atom, an alkyl group, a cycloalkyl group, an aryl group or a monovalent heterocyclic group, the foregoing groups each optionally having a substituent, and when there are a plurality of $K^B$, they can be the same or different, and $Q^2$ represents a crosslinkable group selected from Group A of crosslinkable groups, a hydrogen atom, an alkyl group, a cycloalkyl group, an aryl group or a monovalent heterocyclic group, the foregoing groups each optionally having a substituent, and when there are a plurality of $Q^2$, they can be the same or different, provided that at least one $Q^2$ is a crosslinkable group selected from Group A of crosslinkable groups, wherein Group A is a crosslinkable group selected from the group consisting of:

(XL-1)

(XL-2)

(XL-3)

(XL-4)

(XL-5)

(XL-6)

(XL-7)

(XL-8)

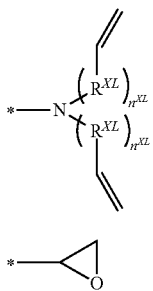

(XL-9)

(XL-10)

(XL-11)

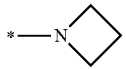

(XL-12)

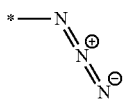

(XL-13)

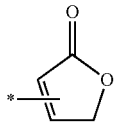

(XL-14)

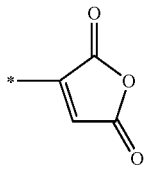

(XL-15)

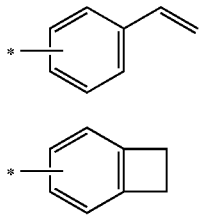

(XL-16)

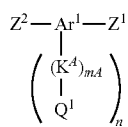

(XL-17)

wherein $R^{XL}$ represents a methylene group, an oxygen atom or a sulfur atom, and $n^{XL}$ represents an integer of 0 to 5, and when there are a plurality of $R^{XL}$, they can be the same or different, and when there are a plurality of $n^{XL}$, they can be the same or different, and * represents a binding site, the foregoing crosslinkable groups each optionally having a substituent, (2M)

$$Z^2-Ar^1-Z^1 \atop \left( \begin{matrix} (K^A)_{mA} \\ | \\ Q^1 \end{matrix} \right)_n$$

wherein mA, n, $Ar^1$, $K^A$ and $Q^1$ are as defined above, and
$Z^1$ and $Z^2$ each independently represent a group selected from Group A of substituents or a group selected from Group B of substituents, (2'M)

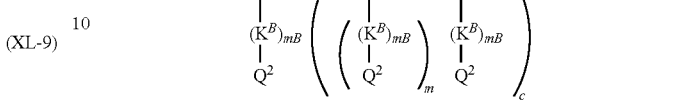

wherein mB, m, c, $Ar^2$, $Ar^3$, $Ar^4$, $K^B$ and $Q^2$ are as defined above, and
$Z^3$ and $Z^4$ each independently represent a group selected from Group A of substituents or a group selected from Group B of substituents, (1M)

$$(Q^T\!-\!\!(K^T)_{\overline{mT}})_{\overline{nT}}(Ar^T)_{\overline{cT}}Z^T$$

wherein mT, nT, cT, $Q^T$, $K^T$ and $Ar^T$ are as defined above, and
$Z^T$ represents a group selected from Group A of substituents or a group selected from Group B of substituents:
Group A is a substituent selected from the group consisting of a chlorine atom, a bromine atom, an iodine atom, and a group represented by $-O-S(=O)_2R^{C\ 1}$, wherein $R^{C\ 1}$ represents an alkyl group, a cycloalkyl group or an aryl group, the foregoing groups each optionally having a substituent,
Group B is a substituent selected from the group consisting of a group represented by $-B(OR^{C\ 2})_2$, wherein $R^{C\ 2}$ represents a hydrogen atom, an alkyl group, a cycloalkyl group or an aryl group, the foregoing groups each optionally having a substituent, and the plurality of $R^{C\ 2}$ may be the same or different and may be combined together to form a cyclic structure together with the oxygen atoms to which they are attached;
a group represented by $-BF_3Q'$, wherein $Q'$ represents Li, Na, K, Rb or Cs;
a group represented by $-MgY'$, wherein $Y'$ represents a chlorine atom, a bromine atom or an iodine atom;
a group represented by $-ZnY''$, wherein $Y''$ represents a chlorine atom, a bromine atom or an iodine atom; and
a group represented by $-Sn(R^{C\ 3})_3$, wherein $R^{C\ 3}$ represents a hydrogen atom, an alkyl group, a cycloalkyl group or an aryl group, the foregoing groups each optionally having a substituent, and the plurality of $R^{C\ 3}$ may be the same or different and may be combined together to form a cyclic structure together with the tin atom to which they are attached.

9. A composition comprising:
the polymer compound according to claim 1, and
at least one type of material selected from the group consisting of a hole transporting material, a hole injection material, an electron transporting material, an electron injection material, a light emitting material, an antioxidant and a solvent.

10. A light emitting device produced by using the polymer compound according to claim 1.

* * * * *